(12) United States Patent
Lazovsky et al.

(10) Patent No.: US 8,372,759 B2
(45) Date of Patent: Feb. 12, 2013

(54) MOLECULAR SELF-ASSEMBLY IN SUBSTRATE PROCESSING

(75) Inventors: David E. Lazovsky, Los Gatos, CA (US); Tony P. Chiang, Campbell, CA (US); Majid Keshavarz, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/045,298

(22) Filed: Mar. 10, 2011

(65) Prior Publication Data

US 2011/0163424 A1    Jul. 7, 2011

Related U.S. Application Data

(62) Division of application No. 11/932,033, filed on Oct. 31, 2007, now Pat. No. 7,972,972.

(51) Int. Cl.
*H01L 21/469* (2006.01)

(52) U.S. Cl. ......... 438/765; 438/4; 438/761; 428/304.4; 257/E21.242

(58) Field of Classification Search .................. 438/761, 438/763, 765, 304.4, 4; 428/304.4
See application file for complete search history.

(56) References Cited

U.S. PATENT DOCUMENTS 7,179,758 B2 *   2/2007   Chakrapani et al. .......... 438/782

\* cited by examiner

*Primary Examiner* — Alexander Ghyka

(57) ABSTRACT

Methods for sealing a porous dielectric are presented including: receiving a substrate, the substrate including the porous dielectric; exposing the substrate to an organosilane, where the organosilane includes a hydrolysable group for facilitating attachment with the porous dielectric, and where the organosilane does not include an alkyl group; and forming a layer as a result of the exposing to seal the porous dielectric. In some embodiments, methods are presented where the organosilane includes: alkynyl groups, aryl groups, fluoroalkyl groups, heteroaryl groups, alcohol groups, thiol groups, amine groups, thiocarbamate groups, ester groups, ether groups, sulfide groups, and nitrile groups. In some embodiments, method further include: removing contamination from the porous dielectric and a conductive region of the substrate prior to the exposing; and removing contamination from the conductive region after the forming.

11 Claims, 39 Drawing Sheets

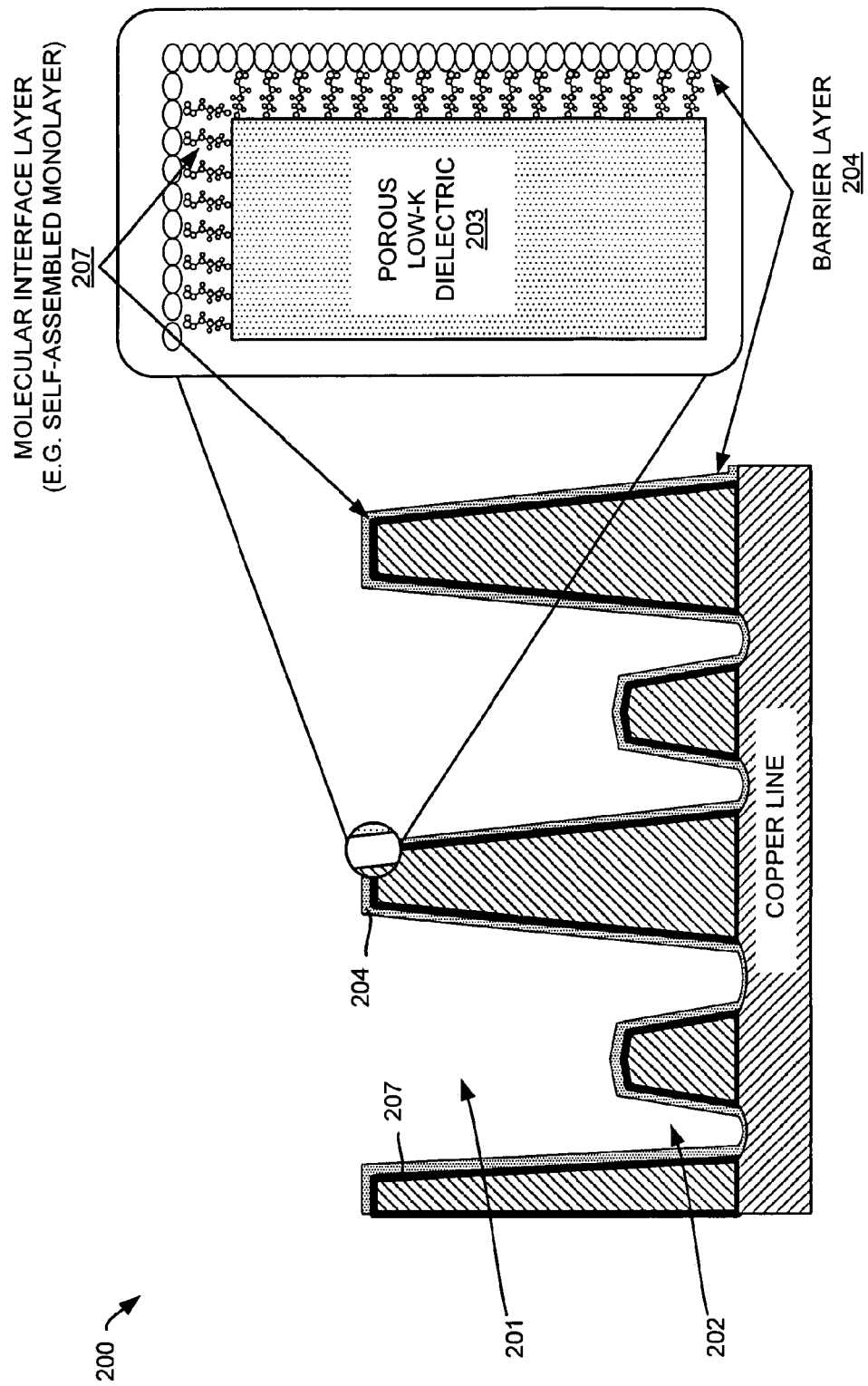

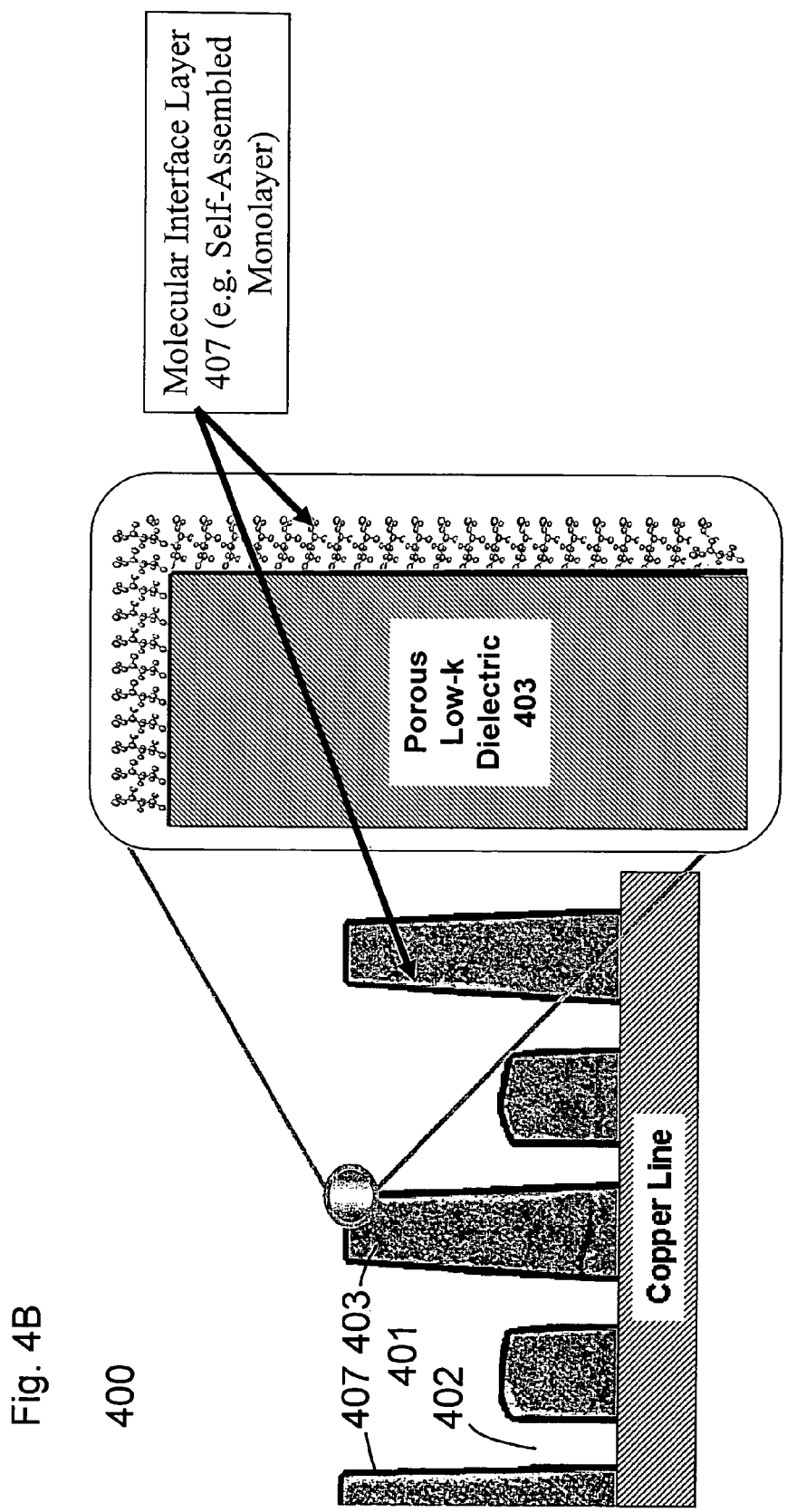

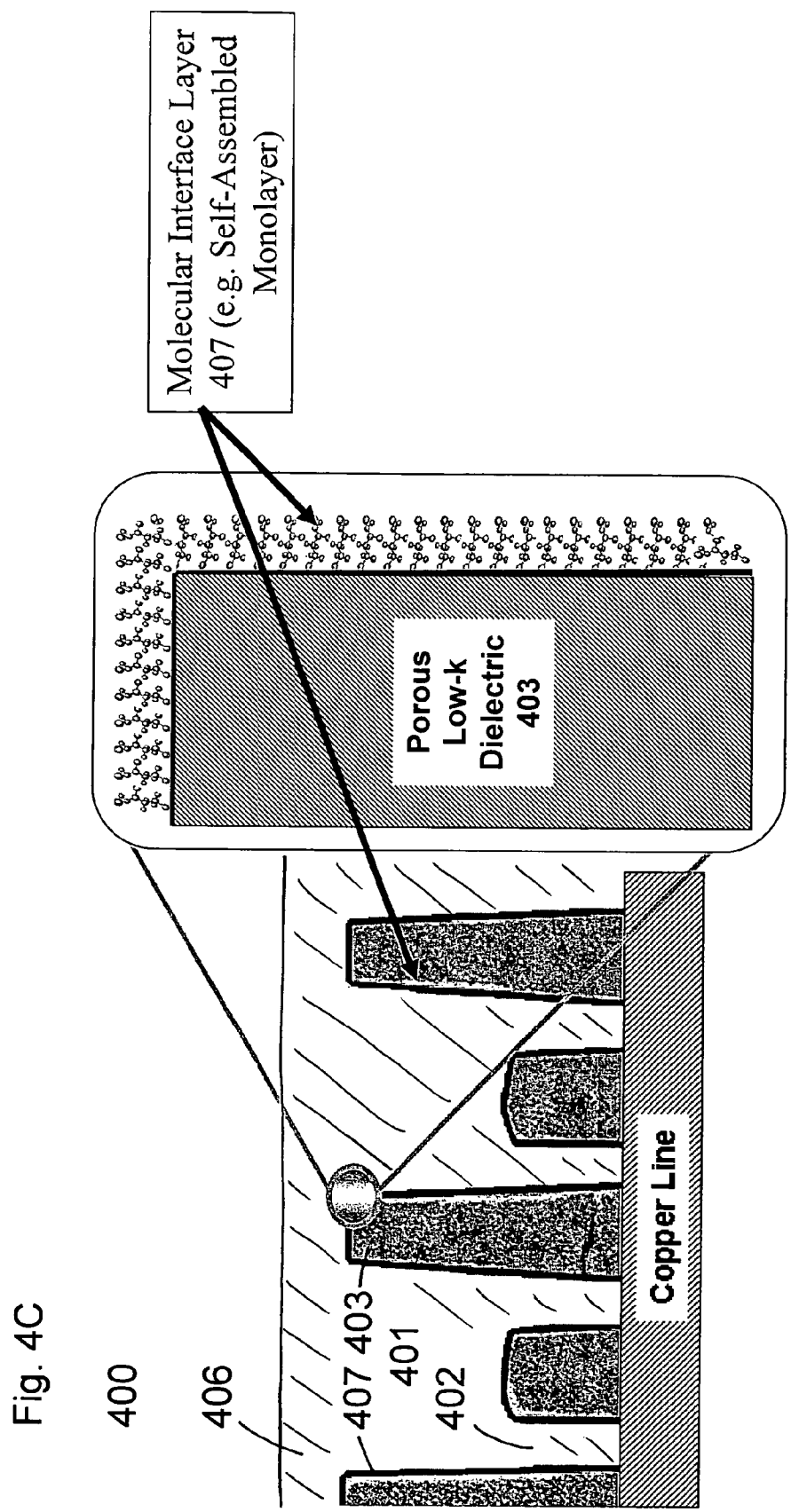

700

MOLECULAR SELF-ASSEMBLY IN SUBSTRATE PROCESSING

CROSS REFERENCE TO RELATED APPLICATIONS

The present invention is related to the following applications, all of which are incorporated herein by reference:

This application is a divisional application of U.S. patent application Ser. No. 11/932,033, which is a continuation of U.S. patent application Ser. No. 11/284,572, which application claims the benefit of U.S. Patent Application 60/630,485, filed Nov. 22, 2004, which is related to U.S. patent application Ser. Nos. 11/132,817 and 11/132,841, both filed May 18, 2005, and U.S. patent application Ser. No. 11/231,047, filed Sep. 19, 2005.

TECHNICAL FIELD

The disclosure herein relates generally to processing a substrate and, more particularly, to substrate processing using molecular self-assembly to form one or more layers between a dielectric and electrically conductive materials.

BACKGROUND

The manufacturing of various electronic devices (including but not limited to for example, microprocessors, storage devices, graphic processors, analog to digital converters, digital to analog converters, signal processors, image processors, etc.) now requires the cost-effective production of very small structures and features, e.g., structures and features having a characteristic dimension at the micrometer or nanometer size scale. This manufacturing includes the formation of electrically conductive material(s) (e.g., aluminum, copper, etc.) and electrically insulating dielectric material(s) (e.g., silicon dioxide, silicon nitride, etc.) on or as part of a substrate. Moreover, the electrically conductive material(s) are typically separated by regions of dielectric material(s) so as to define electrical elements (e.g., transistors, capacitors, etc.) and interconnections between such electrical elements.

Many electronic devices include multiple layers of electrical elements and/or interconnections (e.g., interconnect layer(s)). Each interconnect layer comprises conductive material(s) separated by dielectric material(s). As an example, a first layer of dielectric material is formed on an electrically conductive material (first conductive layer). A second layer of dielectric material is formed on the first layer of dielectric material. Trenches (e.g. lines) are formed in the second layer of dielectric material, and vias (e.g., holes) are then formed in the first layer of dielectric material. Electrically conductive material is subsequently formed in the trenches and vias so as to electrically connect the now electrically conductive trenches (second conductive layer) to the electrically conductive material (first conductive layer) through the now electrically conductive vias.

Copper is commonly used as the electrically conductive material in electronic devices. Copper can be used to fill trenches and/or vias (or other, similar features) of an electronic device. A description of a method for forming a copper interconnection between electrical elements formed in or on a substrate (e.g. semiconductor) follows. The formation of a copper interconnection etches a structure (e.g., trenches and/or vias) in a dielectric material (e.g., silicon dioxide). A barrier layer (e.g., tantalum and/or tantalum nitride) is formed on the dielectric material. The barrier layer prevents diffusion of copper into the dielectric material. The barrier layer should also adhere well to the dielectric material and to the copper subsequently formed on the barrier layer. A seed layer of copper is formed on the barrier layer. Copper is then formed to fill the trench or via using a bulk formation process (e.g., an electrochemical deposition process).

The formation of copper interconnects includes two copper formation steps and because copper formed using the bulk copper formation process does not nucleate and/or adhere well on the formed barrier layer. This necessitates the formation of a copper seed layer, using a process other than a bulk formation process, on which the bulk copper does nucleate and/or adhere, for example, by providing an electrochemically reactive layer for subsequent electrochemical deposition of copper. Additionally, the two copper formation steps and are used because the copper seed layer formation step by itself (e.g., physical vapor deposition, sputtering) does not adequately fill the vias and trenches because of non-conformal step coverage produced by the physical vapor deposition process (e.g., breadloafing or excessive overhang of deposited material at the top of a trench, via or other feature).

In an alternative process or method for forming a copper interconnection between electrical elements formed in or on a substrate (e.g. semiconductor), the seed layer can be a material (e.g. ruthenium, platinum, etc.) other than copper on which copper formed using the bulk copper formation process does nucleate and/or adhere well (e.g., electrochemical deposition). In another variant, the barrier layer formed can be a material like ruthenium on which copper can be satisfactorily formed (e.g. with good nucleation and/or adhesion) during the bulk formation so as to eliminate the need for the copper seed layer.

Physical vapor deposition (PVD) has been used to form a barrier layer in methods such as those described above with reference to FIGS. 1 and 2. However, as feature sizes shrink, the barrier layer (which has higher resistivity as compared to copper) consumes an increasing percentage of the total interconnect (e.g. via and line) volume for a fixed barrier layer thickness which limits the overall conductivity of the interconnect structure(s). It therefore has become necessary to form or deposit ultra-thin barrier materials (e.g., on the order of less than 50 angstroms thick) to maximize copper volume within the interconnect structure(s). Overhang or breadloafing has increasingly become a problem when using PVD to form an ultra-thin barrier layer. One approach to reduce this problem has been the use of ionized PVD (and can be in conjunction with resputtering) whereby sputtered atoms of the barrier layer material are ionized and made to move more directionally toward the bottom regions of features which reduces overhang. Resputtering enables some localized shaping and/or redistribution of deposited material.

One limitation of ionized PVD is that the achievable step coverage (or conformality of the deposited material with respect to the substrate topography) is lower than desired, e.g., can be less than 20% for 5:1 aspect ratio (height to width), 0.1 μm via structures, especially at the via mid to lower sidewall regions. Also, the trench and via bottom and sidewall surfaces can be roughened as a result of the ionized PVD process; this can produce an increase in electron scattering effects with an undesirable increase in line and via resistance. Additionally, PVD processes are line-of-sight which may not produce process results across an entire substrate that are as uniform as desired because the location of a feature on the substrate and characteristics of the feature (e.g., aspect ratio, orientation) can affect the step coverage achieved for that feature.

Recently, atomic layer deposition (ALD) has been used in barrier layer formation. The use of ALD to form a barrier layer can mitigate problems encountered in the use of PVD. For example, ALD enables uniform, conformal deposition of ultra-thin barrier layers that have become necessary to accommodate the increasingly small features and structures being formed on semiconductor substrates. Relative to PVD, ALD can also provide improved repeatability of process results, as well as more uniform process results across an entire substrate. However, the reactants (e.g., precursor, reactants, and carrier gases, etc.) used in an ALD process are undesirably susceptible to diffusion into the dielectric material (particularly the porous low-k dielectric materials that are increasingly being used). In addition, ALD barrier layers often suffer from poorer adhesion properties (e.g., copper adhesion to ALD TaN is worse than to PVD Ta).

A combination of PVD and ALD has also been used. However, while this can alleviate some of the problems described above, others persist. The most significant ongoing problem is the incompatibility of ALD barrier materials with porous dielectric materials due to the diffusion of the ALD reactants into the pores of porous dielectric materials.

Molecular self-assembly is a technique that can be used to produce very small structures and features, e.g., structures and features having a characteristic dimension at or below the nanometer size scales. Molecular self-assembly can be used to produce a variety of material formations, such as molecular monolayers (often referred to as self-assembled monolayers, or SAMs), molecular multilayers and nanostructures (e.g., nanotubes, Buckey balls, nanowires). For example, a SAM has been used as a barrier layer (replacing the deposited barrier layer, as described above) that inhibits diffusion of copper into a dielectric material. However, this SAM inhibits copper diffusion into $SiO_2$ or fluorinated $SiO_2$, both of which are non-porous dielectric materials.

Porous dielectric materials provide additional challenges to inhibiting diffusion because the pores of porous dielectric materials provide another diffusion pathway for foreign material (e.g., barrier layer material, copper) into the dielectric material. SAMs have been proposed for use as bulk diffusion barrier layers, especially for use with dense dielectric materials such as silicon dioxide. There is a need for the prevention of diffusion of foreign material through the exposed pores of porous dielectrics.

INCORPORATION BY REFERENCE

Each publication, patent, and/or patent application mentioned in this specification is herein incorporated by reference in its entirety to the same extent as if each individual publication and/or patent application was specifically and individually indicated to be incorporated by reference.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2C is a cross-sectional view of the substrate including a barrier layer formed on the MSAL, under an embodiment.

FIG. 4B is a cross-sectional view of the substrate with a molecularly self-assembled layer formed on the dielectric material, under an embodiment.

FIG. 4C is a cross-sectional view of the substrate including electrically conductive material formed in the trenches and vias over the molecularly self-assembled layer, under an embodiment.

Figure 1:
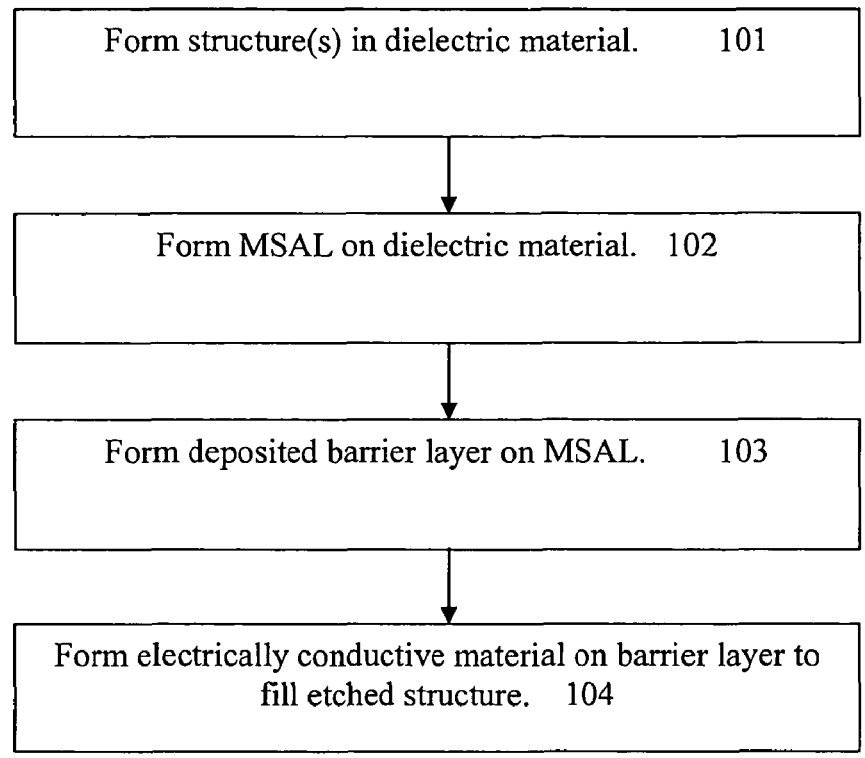
FIG. 1 is a flow diagram for use of a MSAL with a barrier layer in producing an interconnection between electrical elements formed in or on a semiconductor substrate, under an embodiment.

In the drawings, the same reference numbers identify identical or substantially similar elements or acts. To easily identify the discussion of any particular element or act, the most significant digit or digits in a reference number refer to the Figure number in which that element is first introduced (e.g., element 100 is first introduced and discussed with respect to FIG. 1).

DETAILED DESCRIPTION

Systems and methods for molecular self-assembly are described below for use in forming material(s) on a substrate. The use of the systems and methods for molecular self-assembly, collectively referred to herein as "molecular self-assembly," enables production of very small structures and features on substrates (e.g., at the nanometer size scale) at very low cost, which can be useful in the commercial manufacturing of a variety of products, such as electronic components and flat panel displays. A system for performing molecular self-assembly is referred to herein as a "molecular self-assembly system" or "MSAS" and examples of such systems are described in the Related Applications and elsewhere herein.

The molecular self-assembly described herein includes thin film deposition methods for use in the manufacture of integrated circuits, semiconductor devices, flat panel displays, optoelectronic devices, data storage devices, magnetoelectronic devices, magnetooptic devices, molecular electronic devices, solar cells, photonic devices, packaged devices, and the like. The molecular self-assembly of an embodiment provides for formation of a conformal thin film of a desired composition and thickness on a substrate by initially forming a layer comprised of nanometer scale particles and subsequently treating the formed layer so as to coalesce the nanometer scale particles and remove any undesired constituents to form a conformal thin film with the desired composition and thickness.

The molecular self-assembly of an embodiment provides a molecularly self-assembled layer (referred to herein as a MSAL) on a substrate. The MSAL is formed using one or more processes described herein between at least one dielectric material and at least one electrically conductive material and creates one or more of an interfacial layer, diffusion barrier and/or adhesion layer between the dielectric(s) and electrically conductive material(s). The MSAL is for use in forming metal interconnections between electrical elements (e.g., transistors, capacitors) formed in or on a semiconductor substrate but is not so limited.

The MSAL of an embodiment is produced by forming a layer of material (referred to as MSAL material) on one or more regions of a dielectric, where constituents of the MSAL material have a characteristic dimension relative to the size of the pores in the dielectric material that inhibits diffusion into the dielectric material. The MSAL formation continues with annealing of the formed MSAL to effect desired chemical, electrical, and/or mechanical changes. The MSAL of an embodiment formed in this manner can eliminate the need to provide a deposited barrier layer together with the molecularly self-assembled layer between the dielectric and electrically conductive materials.

The MSAL of an alternative embodiment is formed on a substrate, together with a deposited barrier layer, between dielectric material and electrically conductive material, as described below. The combination of the MSAL together with the deposited barrier layer can produce diffusion barrier and/or adhesion layer capabilities comparable to, or better than, those provided by a deposited barrier layer produced in a conventional manner (e.g., using PVD, ALD, or a combination of the two).

The MSAL of an embodiment is formed to seal pores at the surface of a porous dielectric material to prevent or inhibit diffusion of material into the dielectric material via the exposed pores. As an example, use of the MSAL to seal pores provides a barrier to reactants used in an ALD process or other chemical-based process that forms a deposited barrier layer. The MSAL that seals pores is formed using a molecule having an appropriate inorganic or organic backbone and/or appropriate head group, as described in detail below. This pore sealing MSAL seals pores formed in a porous dielectric material so that the barrier to reactant diffusion into the porous dielectric material is about the same as, or better than, that into a non-porous dielectric material (e.g. silicon dioxide, FSG, etc.) without the MSAL. The pore sealing MSAL therefore enables or facilitates use of porous dielectric materials with relatively low dielectric constants that are increasingly being used in semiconductor substrates.

The MSAL of an embodiment provides good adhesion properties with respect to one or more materials adjacent to the MSAL (e.g., dielectric material, deposited barrier layer, electrically conductive material, etc.). For example, the MSAL can provide adhesion properties between the electrically conductive material and the dielectric material that are better than those provided by a conventional deposited barrier layer. The MSAL adhesion properties thus can inhibit delamination of the electrically conductive material from the dielectric material. The MSAL also can provide good adhesion properties to a barrier layer that is formed on the MSAL. This can be accomplished, for example, by forming the molecularly self-assembled layer using a molecule having an appropriate head group (for covalent bonding to dielectric material) and an appropriate terminal group (for covalent bonding to the barrier layer), as described in detail below. The improved adhesion provided by the MSAL improves the reliability of the structure and, therefore, the host device as a result of the increased strength of the bonds at parts of the device where one or more interfaces connect an electrically conductive material to a dielectric material (e.g., as occurs for metal interconnections between electrical elements).

The MSAL of an embodiment can be selectively formed on a dielectric material and not on any exposed electrically conductive material (e.g., metal at the bottom of vias), as described below. The selective formation of the MSAL allows the MSAL to act as a passivation layer during a subsequent wet cleaning process. The wet cleaning process, for example a reactive wet etch process, is typically used to clean electrically conductive material exposed by an opening in the dielectric material. The selectively formed MSAL can prevent damage to the dielectric material and/or absorption of moisture or etch chemicals into the dielectric layer during this process.

The substrate can include any type of material or substrate, for example silicon substrates, silicon-on-insulator substrates, silicon carbide substrates, strained silicon substrates, silicon germanium substrates, and gallium arsenide substrates, etc. In particular, the molecular self-assembly of an embodiment can be used in the processing of semiconductor substrates as is commonly done in the manufacture of components for use in the electronics industry. The molecular self-assembly can also be used in the processing of a substrate for use in the production of a flat panel display.

The term "substrate" is used herein to refer to a material having a rigid, semi-rigid, or flexible surface. In one embodiment, the substrate can include supporting material(s) (such as a wafer) upon or within which a component or number of components is fabricated or to which a component is attached. In another embodiment, the substrate can include the supporting material(s) and the component(s). The substrate includes for example a plate, wafer, panel and/or disk of suitable material on and/or in which the components of a unit, such as an integrated or printed circuit, are deposited or formed. A flexible substrate can include plastic or polymeric material, for example flexible materials used in displays or other flexible integrated circuit (IC) applications. At least one surface of the substrate of embodiments will be substantially flat, although in some embodiments it may be desirable to physically separate synthesis regions for different materials with, for example, dimples, wells, raised regions, etched trenches, or the like. In some embodiments, the substrate itself contains wells, raised regions, etched trenches, etc.

The term "process" or "processing" is used herein to refer to a finite course of actions, operations, events, and/or changes defined by purpose or effect. "Process" or "processing" is used herein to include, but not be restricted to, providing a processing material to a region and/or modifying a region. Processing specifically includes physical modifications, chemical modifications, electrical modifications, thermal modifications, magnetic modifications, and photolytic modifications, more specifically cleaning, surface modification, surface preparation, deposition, dispensing, reaction, functionalization, etching, planarization, chemical mechanical planarization, electrochemical mechanical planarization, lithography, patterning, implantation, thermal treatment, irradiation, such as infrared (IR) treatment, ultraviolet (UV) treatment, electron beam treatment, and x-ray treatment, and more specifically electrochemical deposition, electroless deposition, physical vapor deposition, chemical vapor deposition, atomic layer deposition, and evaporation. Processing conditions are those conditions, such as temperature, time, pressure, material phase, amount, component ratio, etc., under which processing occurs. Processing as used herein can refer to a series of processes performed in a unique order and/or combination to effect a desired end result, for example, to form or modify structures, test structures, devices, integrated circuits, etc. Processing includes conditions that are those conditions such as temperature, time, pressure, material phase, amount, component ratio, etc., under which a sequence of processes occurs. Processing as used herein further includes combinatorial process sequence integration for i) evaluating different materials, ii) evaluating different processing conditions, iii) evaluating different sequencing and integration of processes (with respect to both modules within a tool and to a plurality of tools in a process flow), and combinations thereof, for such used as in the manufacture of devices such as ICs.

The term "structure" is used herein to refer to an arrangement, organization, and/or placement of one or more parts and/or elements. The structure can include topographical features, such as vias, holes, lines, trenches, and test structures, useful for extracting information about a process, identifying process problems, and improving a process as well as device performance.

In the following description, numerous specific details are introduced to provide a thorough understanding of, and enabling description for, embodiments of the molecular self-assembly. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments.

FIG. 1 is a flow diagram for use of a MSAL with a barrier layer in producing 100 an interconnection (e.g., a copper interconnection) between electrical elements formed in or on a semiconductor substrate, under an embodiment. Generating 100 the interconnections includes forming 101a structure (e.g., trenches, vias, etc.) in a dielectric material (e.g., silicon dioxide). The structure can be formed for example by etching but is not so limited. A MSAL is formed 102 on the dielectric material, as described in detail below. A deposited barrier layer is formed 103 on the MSAL. The deposited barrier layer of an embodiment is a tantalum, tantalum nitride, tantalum carbon nitride, tungsten nitride, tungsten carbon nitride, or ruthenium layer formed using ALD, but the embodiment is not so limited. Electrically conductive material is formed 104 on the deposited barrier layer to fill in vias and trenches. The electrically conductive material can include metals like copper, ruthenium, tungsten, and/or aluminum, etc.

The electrically conductive material of an embodiment can be formed 104 at one time using one process or, alternatively, the electrically conductive material can be formed in two or more steps using two or more processes. For example, the electrically conductive material of an embodiment can be formed 104 by forming a seed layer of copper (via e.g. PVD, ALD, CVD, etc.) on the deposited barrier layer and then filling the vias and trenches with copper using a bulk formation process (e.g. electroless deposition, electroplating, and combinations thereof, etc.). Alternatively, for example, if the barrier layer is formed using a material such as ruthenium, the electrically conductive material of an embodiment can be formed 104 by forming copper to fill the vias and trenches in a single process.

Figure 2A:
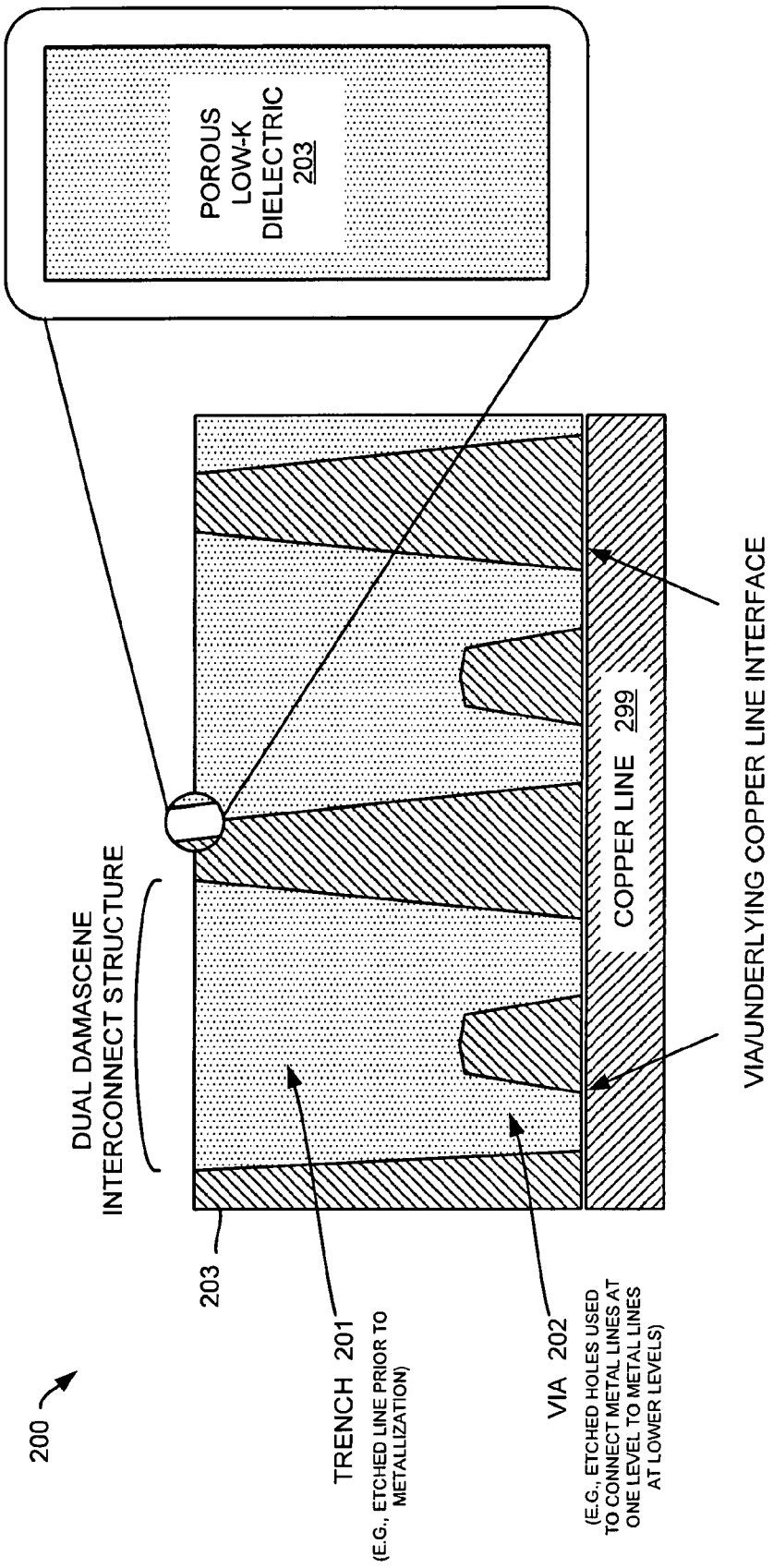
FIG. 2A is a cross-sectional view of the substrate that includes trenches and vias formed in a dielectric material of the substrate.
Figure 2B:
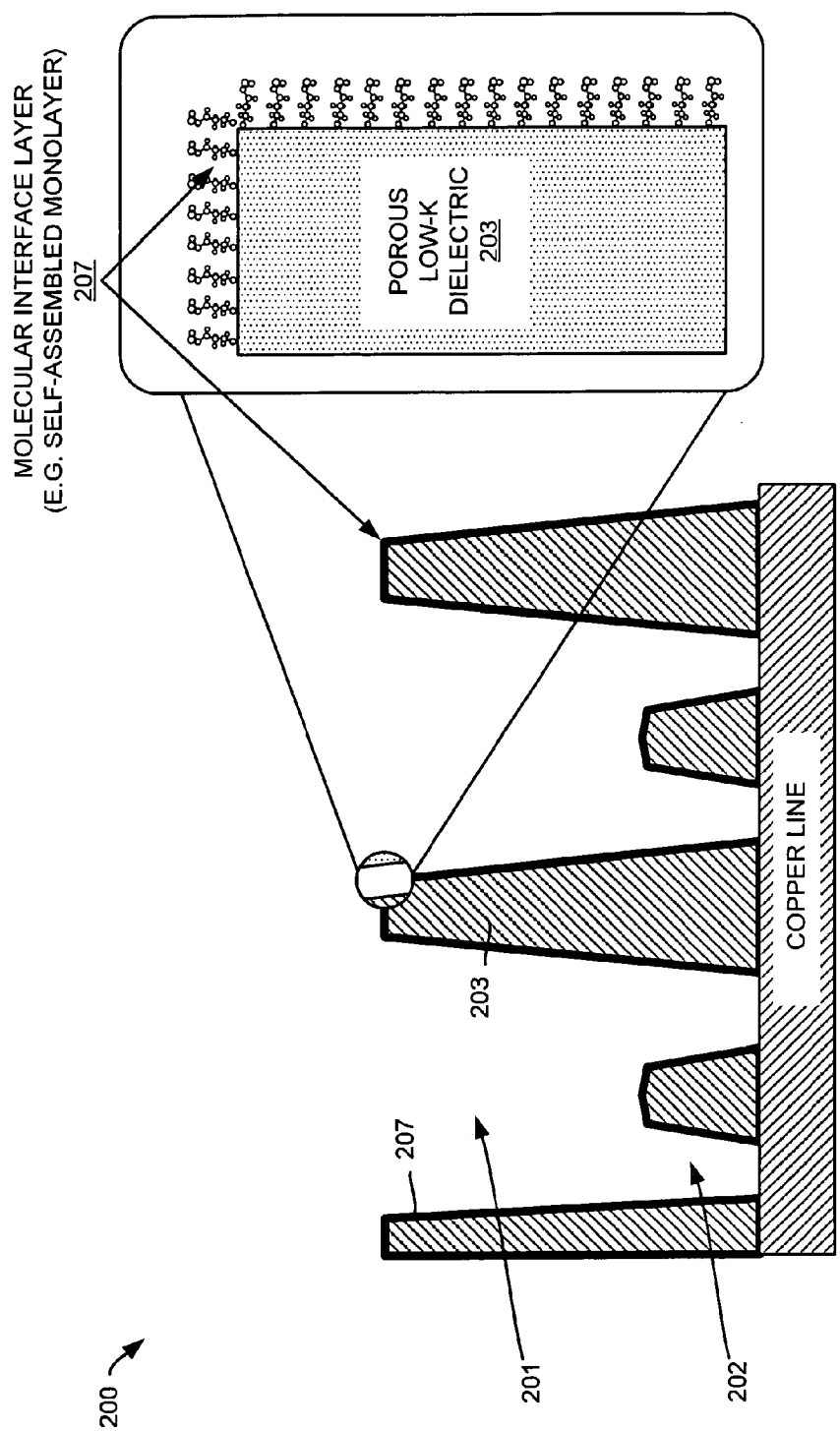
FIG. 2B is a cross-sectional view of the substrate including a MSAL formed on the dielectric material, under an embodiment.
Figure 2D:
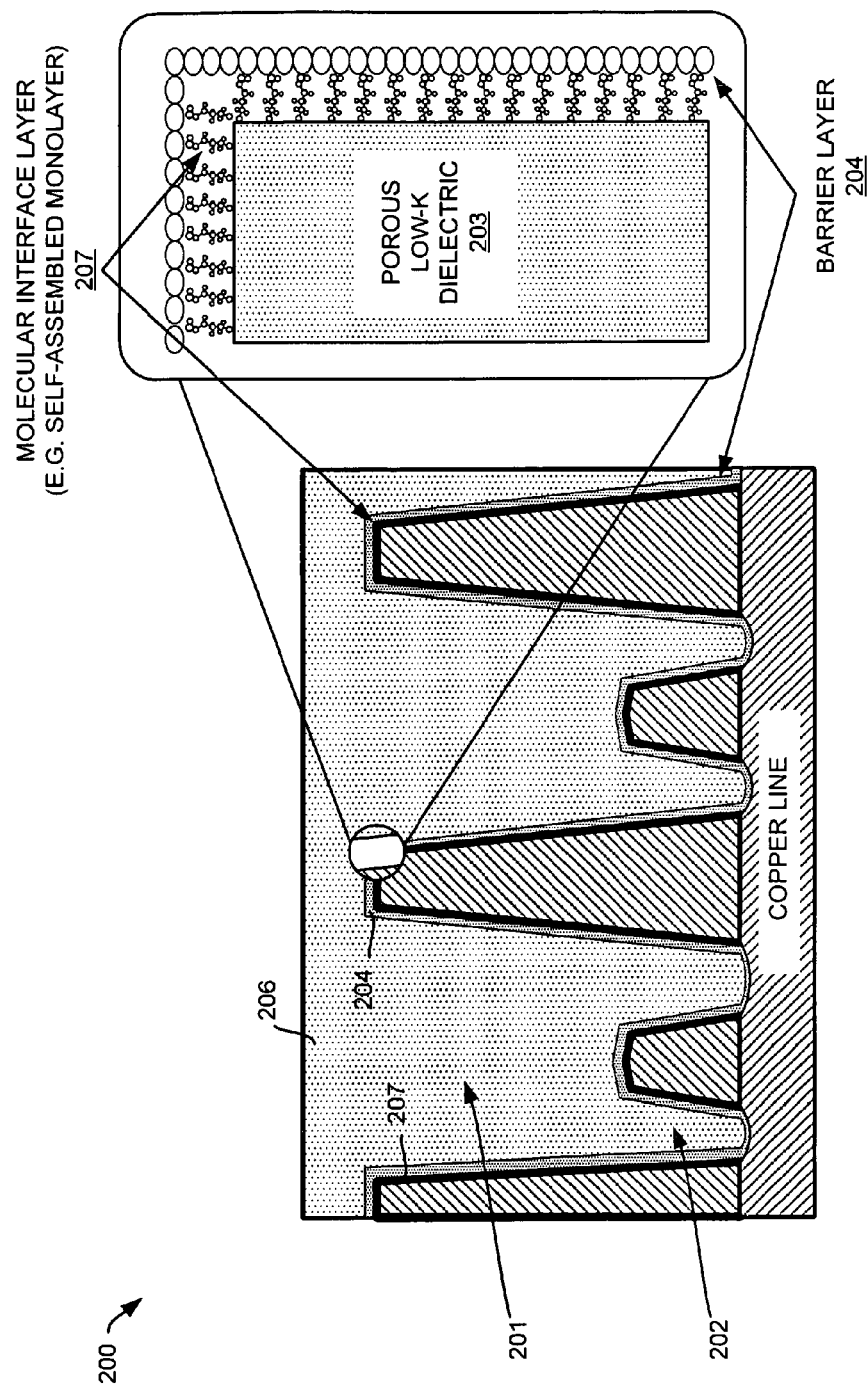
FIG. 2D is a cross-sectional view of the substrate including electrically conductive material formed in the trenches and vias over the barrier layer, under an embodiment.

FIGS. 2A through 2D are cross-sectional views of a substrate 200 showing use of a MSAL in the formation 100 of interconnects between elements in or on the substrate, under an embodiment. FIG. 2A is a cross-sectional view of the substrate 200 that includes trenches 201 and vias 202 formed in a dielectric material 203 of the substrate 200. An electrically conducting material layer 299 (e.g., copper line) underlies the dielectric material 203 in this example. Also, the structure shown is a dual damascene interconnect structure but the molecular self-assemble described herein is not limited to this interconnect structure. FIG. 2B is a cross-sectional view of the substrate 200 including a MSAL 207 formed on the dielectric material 203, under an embodiment. FIG. 2C is a cross-sectional view of the substrate 200 including a barrier layer 204 formed on the MSAL 207, under an embodiment. FIG. 2D is a cross-sectional view of the substrate 200 including electrically conductive material 206 formed in the trenches 201 and vias 202 over the barrier layer 204, under an embodiment.

Figure 3:
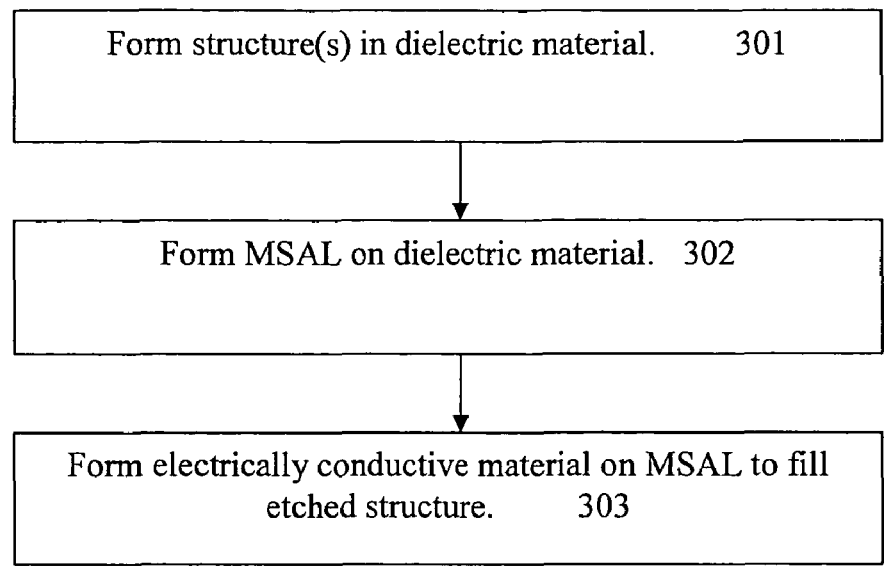
FIG. 3 is a flow diagram for use of a MSAL in producing an interconnection between electrical elements formed in or on a semiconductor substrate, under an embodiment.

The MSAL of an alternative embodiment is formed on a substrate between dielectric material and electrically conductive material, and does not include use of a deposited barrier layer. FIG. 3 is a flow diagram for use of a MSAL in producing 300 an interconnection (e.g., a copper interconnection) between electrical elements formed in or on a semiconductor substrate, under an embodiment. Generating 300 the interconnections of an embodiment includes forming 301 one or more structures (e.g., trenches, vias) in a dielectric material (e.g., silicon dioxide). A MSAL is formed 302 on the dielectric material. Electrically conductive material (e.g., a metal such as copper) is formed 303 on the MSAL to fill in the vias and trenches.

The electrically conductive material of an embodiment can be formed 303 at one time using one process or, alternatively, the electrically conductive material can be formed in two or more steps using two or more processes. For example, the electrically conductive material of an embodiment can be formed 303 by first forming a seed layer of copper on the deposited barrier layer and then filling the vias and trenches with copper using a bulk formation process. Alternatively, for example, if the barrier layer is formed using a material such as ruthenium, the electrically conductive material of an embodiment can be formed 303 by forming copper to fill the vias and trenches in a single process.

Figure 4A:
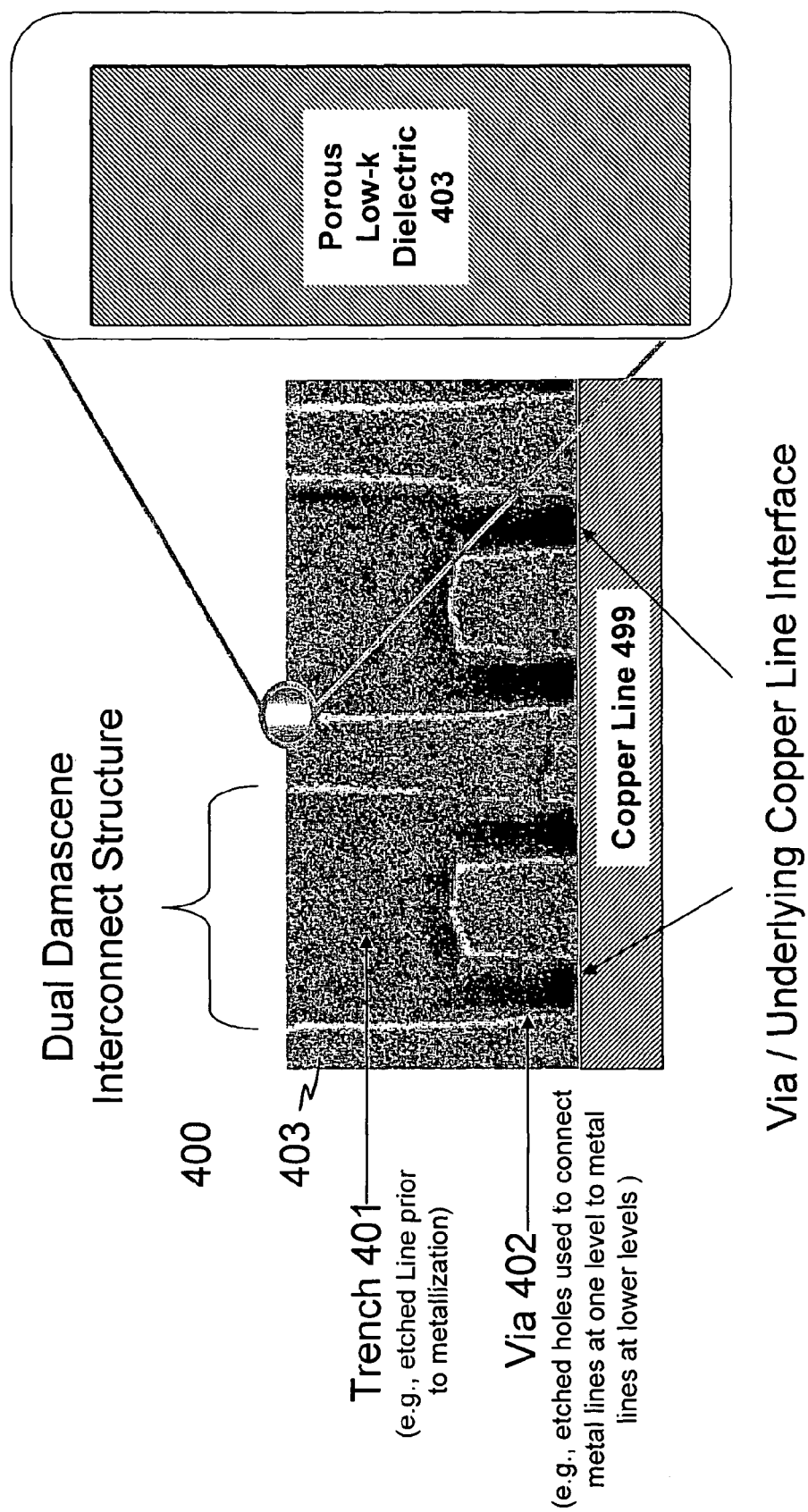
FIG. 4A is a cross-sectional view of a substrate in which a trenches and vias are formed in a dielectric material of the substrate.

FIGS. 4A through 4C are cross-sectional views of a substrate 400 showing use of a MSAL in the formation 300 of interconnects between elements in or on the substrate, under an embodiment. FIG. 4A is a cross-sectional view of a substrate 400 in which a trenches 401 and vias 402 are formed in a dielectric material 403 of the substrate 400. An electrically conducting material layer 499 (e.g., copper line) underlies the dielectric material 403 in this example. Also, the structure shown is a dual damascene interconnect structure but the molecular self-assemble described herein is not limited to this interconnect structure. FIG. 4B is a cross-sectional view of the substrate 400 with a molecularly self-assembled layer 407 formed on the dielectric material 403, under an embodiment. FIG. 4C is a cross-sectional view of the substrate 400 including electrically conductive material 406 formed in the trenches 401 and vias 402 over the molecularly self-assembled layer 407, under an embodiment.

Figure 5:
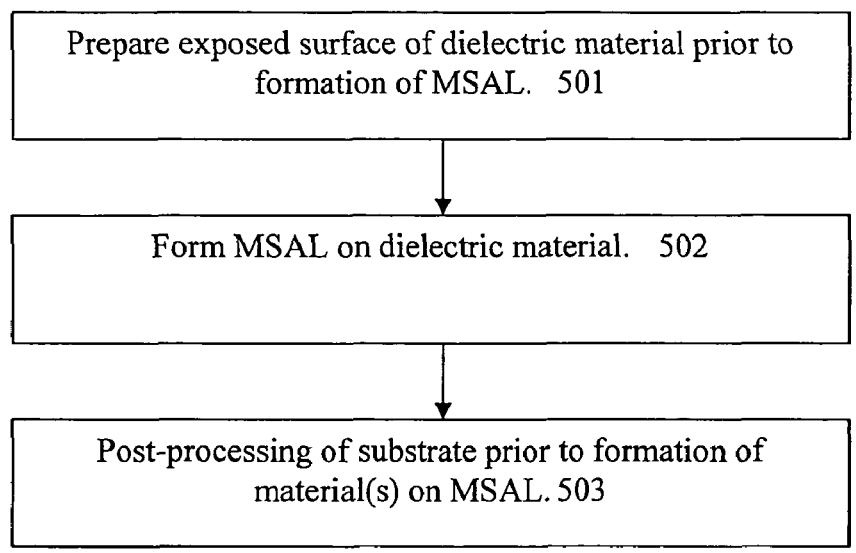
FIG. 5 is a flow diagram for forming a MSAL as a diffusion barrier and/or adhesion layer between electrically conductive and dielectric materials, under an embodiment.

FIG. 5 is a flow diagram for forming 500a MSAL as a diffusion barrier and/or adhesion layer between electrically conductive and dielectric materials, under an embodiment. A structure(s) (e.g., trenches, vias, etc.) is formed in a dielectric material of a substrate (as described above), and generation of the MSAL includes preparing 501 the exposed surface of the dielectric material prior to formation of the MSAL. Preparation 501 of the exposed surface can include preparation of the surface of electrically conductive material exposed at the bottom of the structure formed in the dielectric material, as described below. A layer of material is formed 502 on the dielectric material using molecular self-assembly as described herein. The MSAL can be formed as a monolayer (e.g., a self-assembled monolayer (SAM)) or a multilayer. The material of the MSAL can be organic or inorganic material, but is not so limited. Formation 502 of the material of the MSAL can include functionalizing a terminal group of the molecularly self-assembled layer but is not so limited. Functionalization of a material as used herein refers to modifying the characteristics of an exposed part of the material to achieve a desired interaction with another material subsequently formed on the exposed part of the material. Post-processing 503 is performed on the material of the MSAL prior to formation of additional material (e.g., barrier layer, electrically conductive interconnect material) on the MSAL.

Generation 500 of the MSAL can be implemented using any of a variety of processes and techniques, such as are described in the Related Applications referenced above. For example, the MSAL can be generated 500 using wet processing (e.g., immersion of a substrate in a chemical bath, spraying or spinning of chemical fluid on to a substrate), dry processing (e.g., vapor deposition), and/or various combinations of wet and dry processing.

The preparation 501 of an exposed surface of a dielectric material for formation 500 of a MSAL can include one or more of a variety of processes. For example, the surface of the dielectric material can be cleaned using any of a variety of processes (e.g. acidic chemistries, basic chemistries, and/or combinations thereof) to remove any contaminants (e.g. organic, inorganic, metallic, etc.) produced during formation of the structure in which the electrically conductive material is to be formed. These contaminants can include, for example, residual material left after etching of the dielectric material or ashing used to remove photoresist.

Preparation 501 can also include functionalization of the surface of the dielectric material to inhibit the diffusion of chemicals used in subsequent processing of the substrate into the dielectric material. Functionalization can be necessary or desirable, for example, if subsequent processing of the substrate makes use of aggressive chemistries that may otherwise diffuse into and/or damage the dielectric material. Such functionalization can itself inhibit diffusion into the dielectric material of other materials. Additionally, functionalization of the surface of the dielectric material can facilitate selective formation of the MSAL on the dielectric material and/or improve the adhesion of the dielectric material to the MSAL.

The particular manner in which the dielectric material is functionalized can depend on the nature of the dielectric material, the nature of the MSAL to be formed, and the desired characteristics(s) (e.g., adhesion properties) to be produced. For example, the surface of a silicon dioxide-based dielectric material can be functionalized to produce a large number of hydroxyl (i.e. OH) groups at the surface of the dielectric material to which the MSAL has an affinity for attachment, thus promoting formation of the MSAL on the dielectric material.

Surface preparation 501 can also include performing an etch process (e.g., wet process) to remove unwanted material formed on exposed electrically conductive material (e.g., metal at the bottom of vias). The unwanted material may be present from prior processing of the substrate. The etch process can include, for example, a reactive etch process (e.g., wet) but is not so limited. Such etching can also be performed to etch down into exposed electrically conductive material to enhance mechanical attachment of electrically conductive material subsequently formed thereon and improve electromigration reliability. If the surface preparation includes such etching, then cleaning can also be performed again after the etching.

Regarding formation 502 of the MSAL as described above with reference to FIG. 5, the type and characteristics of the molecule(s) used to form the MSAL can be chosen to produce desired properties of the molecularly self-assembled layer. The characteristics of the molecule can include such characteristics as the head group, terminal group and/or length (e.g., the number of carbon atoms in the organic backbone portion of the molecule) of the molecule. The characteristics of the MSAL of an embodiment can thus be established to produce desired adhesion properties, pore sealing capabilities, diffusion barrier capabilities, and/or passivation capabilities of the MSAL. To produce desired properties of the MSAL, the manner in which the MSAL is tailored (i.e., the characteristics that are established) can depend on the nature of the dielectric material on which the MSAL is to be formed and the nature of the material (e.g., deposited barrier layer) to be subsequently formed on the MSAL.

For example, a MSAL can be formed that seals the pores of a porous dielectric material. The porous dielectric material can have pores that are open or closed, oriented in any direction and with any shape, and possess various levels of interconnectivity. In addition, the volumetric pore fraction in the dielectric material can vary, typically less than or equal to approximately 50 percent (50%) in order to maintain structural integrity. The chain length (e.g., the number of carbon atoms formed in a chain) and/or the head group of the molecule used to form the MSAL can be established so that the presence of the MSAL will seal some or all of the pores at the surface of the dielectric material. For example, the length of the carbon chain in an organic molecule can be specified to be long enough relative to the size (typically ranging from greater than or equal to approximately 10 Å to less than or equal to approximately 25 Å in diameter) of the exposed pores at the surface of a porous dielectric material to ensure that those pores (at least an adequate number) are sealed. Additionally, the MSAL can be formed so that the molecules are cross-linked This can be done during formation, functionalization, or post-processing of the MSAL.

The MSAL can also be tailored to produce desired adhesion properties with respect to the dielectric material. In particular, the head group of the molecule used to form the MSAL can be established to provide good adhesion to the dielectric material. For example, a head group can be established that covalently bonds with an exposed hydroxyl group of a dielectric material.

The MSAL can also be tailored to produce desired adhesion properties with respect to a material to be formed on the MSAL (e.g., a deposited barrier layer, electrically conductive interconnect material, etc.). In particular, the terminal group of the molecule used to form the MSAL can be established (e.g., the molecule specified to include a particular terminal group and/or the terminal group of a molecule functionalized) to provide good adhesion to the material to be formed on the MSAL (e.g., deposited barrier layer). The particular terminal group used, or manner of functionalization of a terminal group, can depend on the type of material(s) formed on the MSAL and/or the precursors, reactants, etc. used to form such material(s). As an example, a $NR_x$, (e.g. NH, $NH_2$, NRH, etc.) terminal group, where R=H, an organic group, and/or combinations thereof, provides good adhesion to titanium-based materials, tantalum based materials, ruthenium based materials, tungsten-based materials, and/or precursors (e.g. TDMAT, TDEAT, PDMAT, TBTDET, TBTEMT, $WF_6$, ruthenocenes and their derivatives, metalorganic precursors, etc.) used to form such barrier layer materials. Additionally, a thiol terminal group provides good adhesion (facilitates covalent bonding) to a copper seed layer, for example, when the MSAL is implemented without the formation of a deposited barrier layer between the dielectric and electrically conductive materials.

Molecular self-assembly of an embodiment also forms a MSAL having good selectivity to a particular type of dielectric material (which may be without regard to structure or geometry) and/or to a dielectric material having a particular structure or geometry. The selective MSAL will have relatively poor affinity to other materials to which it is not selective, for example, exposed electrically conductive material (e.g., metal at the bottom of a via). Formation of the selective MSAL of an embodiment includes, for example, forming and/or functionalizing the dielectric material on which the material of the MSAL is to be formed and performing the molecular self-assembly in a manner tailored to such formation and/or functionalization. As an example, the dielectric material can be functionalized to promote adhesion to the material of the MSAL, as discussed above. Forming the MSAL with good selectivity for dielectric material enables the MSAL to be formed so that it can act as a passivation layer during a subsequent wet cleaning process, preventing for example, etching of the dielectric material, diffusion of etching chemistries into the dielectric material, and/or damage to the dielectric material.

A MSAL is generally a layer that results from the coordinated action of independent molecules under distributed control. Molecular self-assembly can refer to the joining of complementary surfaces in nano-molecular action. The characteristics of the MSAL can be affected by the type of molecule used to form the MSAL. In general, a molecule can be chosen for use in forming the MSAL depending on the particular application in which the MSAL is used, i.e., the nature of the dielectric material on which the MSAL is to be formed, the nature of the material (e.g., barrier layer) to be subsequently formed on the MSAL, and the desired characteristics(s) (e.g., adhesion properties, pore sealing capabilities, diffusion barrier capabilities, passivation capabilities) to be produced.

For example, thiols are a type of molecule that can be used to form a MSAL in an embodiment. Thiols are advantageous in that they are very well characterized (e.g., they are known to grow well on certain materials, they can include any of a number of different groups that can be functionalized to produce particular properties). Certain thiols (e.g. R—SH, where the organic group R=alkyl, aryl, heteroaryl, functionalized alkyl, functionalized aryl, functionalized heteroaryl, etc.) can be chosen for their relative low thermal break down temperature range (e.g. approximately 150° C.-250° C. range) which makes them compatible with low dielectric constant and/or porous low dielectric constant materials processing and integration where thermal budget is a concern. For example, a thiol-based MSAL can be functionalized with an organometallic terminal group that leaves only metal (having a sufficiently high breakdown temperature) exposed after vaporization of the carbon species of the group. Not all thiols have low breakdown temperatures; for example, some thiols (e.g. R—SH, where R=fluorinated alkyl, fluorinated aryl, etc.) have a thermal breakdown temperature greater than about 300 degrees Celsius.

Silicon-based molecules (e.g., silanes) are an example of another type of molecule that can be used to form a MSAL under an embodiment. Silicon-based molecules advantageously have higher breakdown temperatures due to the formation of strong Si—O covalent bonds (e.g., in a range of approximately 250° C. to 350° C. or above) than thiols (typically 150° C.-250° C. range). Other covalent bonds which can be formed between a substrate (e.g. dielectric) and a MSAL include Si—N, Si—C, Si—S, O to C groups, etc., and combinations thereof.

The MSAL can be formed using organosilanes $R_n$—Si—$X_{4-n}$, where n=1, 2, 3, and where the organic group R=H, alkyls, alkenyls, alkynyls, aryls, fluoroalkyls, heteroaryls, fluoroheteroaryls, alcohols, thiols, amines, amides, imines, carboxylic acids, thiocarboxylic acids, thiocarbamates, esters, ethers, sulfides, nitriles, etc. The hydrolyzable group X=halides (Cl, F, Br, I, etc.), carboxylates (—O—CO—$R^1$), amines (—$NR^2R^3$), alkoxides (—O—$R^4$, e.g. methoxide, ethoxide, propyloxide, butoxide, phenyloxide, etc.), sulfides (—S—$R^5$), heteroaryls, fluororoaryls, etc., and $R^1$, $R^2$, $R^3$, $R^4$, $R^5$ can be independently selected organic groups (e.g. alkyl, aryl, etc.) as described above for R. The organic substituent R can be selected from linear and/or branched groups having from 1 to about 30 or more carbon atoms.

The organic group $R_n$ is comprised of a terminal group (i.e. tail group) and a linking (i.e. linker) group. The linker connects the head group (e.g. Si atom) to the terminal group. The linker can be of the form $(CH_2)_n$, whereby, n=0, 1, 2, 3, 4 . . . or higher, etc. and can be chosen to tailor the effective length and/or size of the MSAL. The terminal group is attached to the "tail end" of the linker The terminal group can be chosen for particular chemical properties and/or affinity to the subsequent material to be deposited over the MSAL. The terminal group can also be used to adjust the effective size and/or length of the MSAL. In some embodiments, the linker and the terminal group are part of and/or are the same substituent. The hydrolyzable group (e.g. leaving group) X can be used to adjust the reactivity of the organosilane to the substrate of interest to effect deposition. The hydrolyzable group, in particular, reacts with the surface hydroxyl groups (OH) of the substrate to form the MSAL layer and is liberated in the formation process. Certain dielectric films (e.g. substrates) have varying amounts of surface hydroxyl groups. The terminal and/or linking groups can be chosen to account for the lower number of hydroxyl attachment sites by choosing polymerizable substituents and/or larger and/or branched substituents (e.g. phenyls, adamantanes, dendrimers, star polymers, etc.).

Figure 6A:
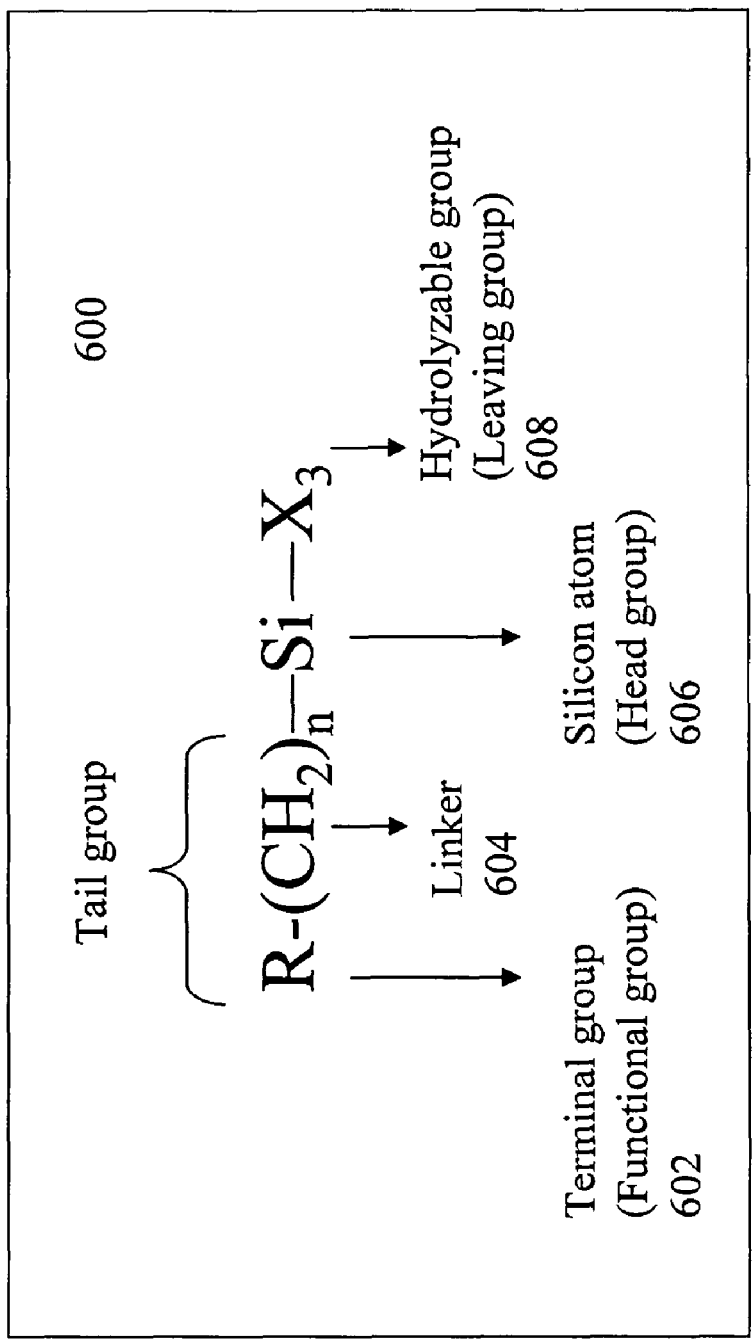
FIG. 6A shows an organosilane that includes three hydrolyzable groups, under an embodiment.
Figure 6B:
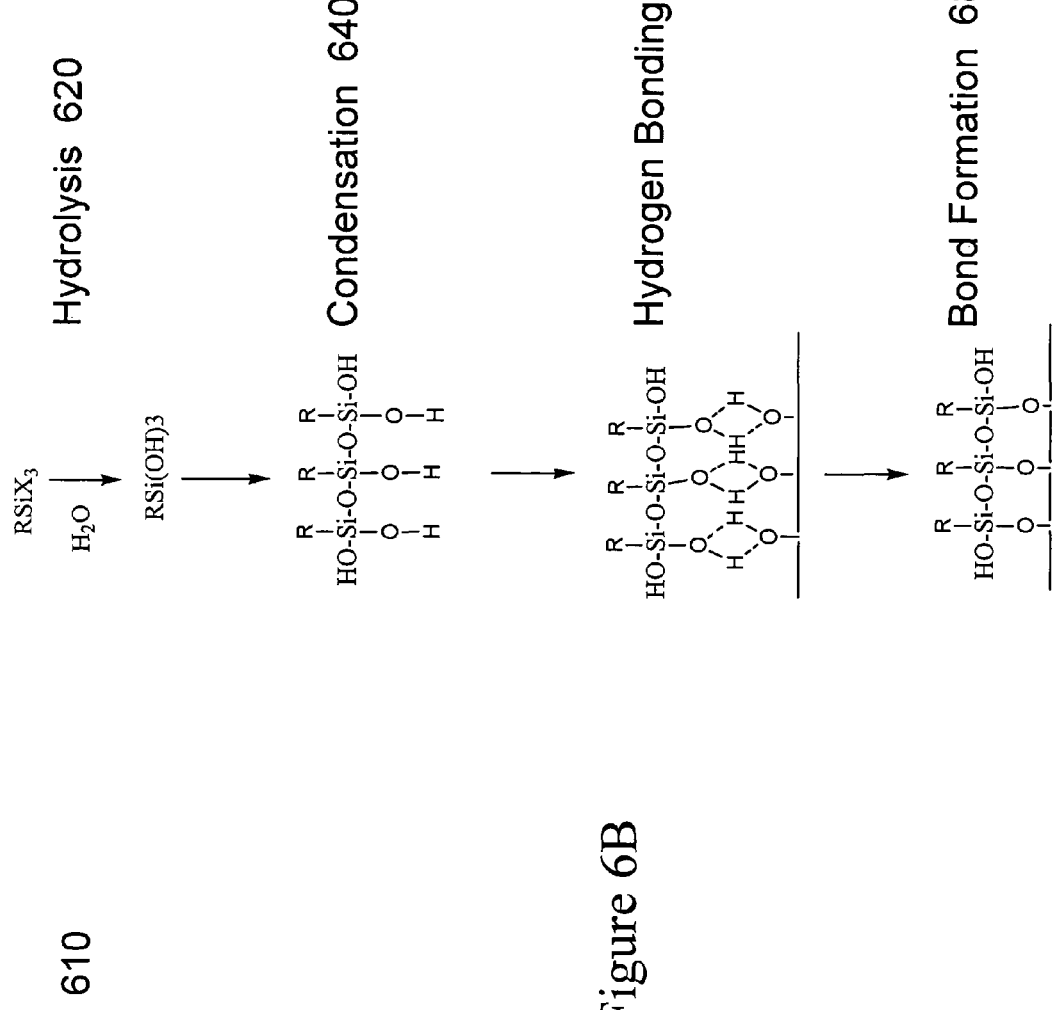
FIG. 6B shows a MSAL formation process using an organosilane with three hydrolyzable groups, under an embodiment.

For cases when n=1, i.e. R—Si—$X_3$, the silanes tend to oligomerize, polymerize and/or crosslink, etc. during and/or after deposition on the substrate. This can result in a more thermally, chemically, and/or physically stable MSAL layer, in particular after a drying and/or curing process. This can also be advantageous when the MSAL layer is used to seal the exposed pores of porous dielectric materials. FIG. 6A shows an organosilane 600 that includes three hydrolyzable groups, under an embodiment. The terminal group 602 (e.g. organofunctional or functional group), the linker 604, the silicon head group 606, and the hydrolysable groups 608 of the organosilane 600 are shown. FIG. 6B shows a MSAL formation process 610 using an organosilane with three hydrolyzable groups, under an embodiment. The MSAL formation process 610 includes hydrolysis 620, condensation 640 (e.g. oligomerization, polymerization, and/or crosslinking, etc.), hydrogen bonding 660, and bond formation 680 (via e.g. drying, and/or curing, etc.), but is not so limited.

Water used for hydrolysis 620 of the organosilane can be from the substrate (e.g. on the surface), the ambient, and/or deliberately introduced. Alternatively, surface hydroxyl groups of the substrate (e.g. dielectric material) can also enable the hydrolysis reaction 620. The free hydroxyl groups of the silane can condense 640 to form oligomers, polymers, etc. which in turn can attach to the surface of the substrate via hydrogen bonding 660. Finally, dehydration via drying and/or curing, etc. can be used to induce bond formation 680 between the now deposited MSAL layer and the substrate. In particular, the Silicon head group ("—Si—") can covalently bond to the surface of the substrate via such a bond formation process. Some particular examples of polymerizable organosilanes include but are not limited to $C_{12}H_{25}SiCl_3$ and $C_{18}H_{37}Si(OCH_3)_3$. Silanes with n=2, i.e., $R^1R^2$—Si—$X_2$, can also be used to form the MSAL.

Figure 7:
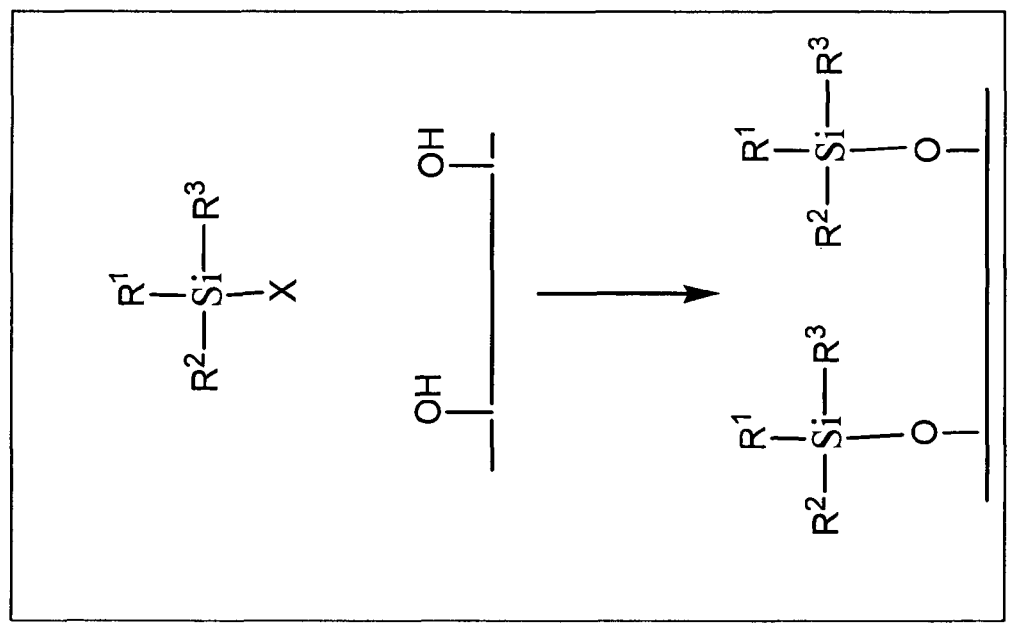
FIG. 7 is an example of MSAL formation using an organosilane with one hydrolyzable group, under an embodiment.

For cases when n=3, i.e., $R^1R^2R^3$—Si—X, the silanes do not tend to oligomerize, polymerize and/or crosslink, etc. during and/or after deposition on the substrate which may lead to lower undesired byproducts formation. An example includes $R^1R^2R^3$—Si—X, where X=OR', $NR^1R^2$, Cl, etc. In an embodiment, the organosilanes with one hydrolyzable group are preferred for anhydrous (e.g. when external source(s) of water is not used) environments. The surface hydroxyl groups of the substrate can drive the MSAL formation process. FIG. 7 is an example of MSAL formation 700 using an organosilane with one hydrolyzable group, under an embodiment. Silanes including the $R^1R^2R^3$—Si—X type can also be hydrolyzed to form free OH, and/or di-merize to di-siloxanes which in turn can react with the free hydroxyl species of the substrate material to form the MSAL.

Organosilanes which do not produce any corrosive byproducts (e.g. HCl, HF, HBr, etc.) are used as such corrosive byproducts may corrode or otherwise damage conductive and/or metallic surfaces (e.g. copper, cobalt containing layers, tantalum containing layers, etc.). Organosilanes can be chosen with benign leaving (hydrolyzable) groups like alkoxy or amines. Octadecyldimethyl(dimethylamino)silane $C_{18}H_{37}(CH_3)_2Si$—$N(CH_3)_2$ and dodecyldimethyl(methoxy)silane $C_{12}H_{25}(CH_3)_2Si$—$OCH_3$ are some preferred embodiments. Trimethoxysilanes and triethoxysilanes are other preferred embodiments.

All the aforementioned organosilanes can be tailored to form covalent bonds to hydroxyl (OH) containing substrates (e.g. dielectrics) by manipulating the hydrolizable groups of the organosilanes.

Dendrimers, hyper-branched polymers, polymer brushes, and block co-polymers can also be used to form a MSAL under an embodiment. Additionally, ionic or electrochemically-enhanced self-assembled multilayers or monolayers can embody a MSAL. Each of the foregoing can be used to form a MSAL that has good diffusion barrier properties (including pore sealing and diffusion barrier capabilities) and has good adhesion to many types of dielectric materials.

As indicated above, the characteristics of the MSAL (e.g., the type of molecule used to form the MSAL and the characteristics of the molecule, such as the head group, terminal group and/or length, etc.) can be established to produce desired properties of the molecularly self-assembled layer. The desired properties can include but are not limited to adhesion properties, pore sealing capabilities, diffusion barrier capabilities, and passivation capabilities. Further, the characteristics of the MSAL needed to produce desired properties can depend on the nature of the dielectric material on which the MSAL is to be formed and the nature of the material (referred to hereinafter as the overlying material) to be subsequently formed on the MSAL. Thus, given a particular dielectric material and overlying material, the characteristics of the MSAL can be established based on a specification of the desired properties of the MSAL. This can be done in a number of ways, some of which are described below.

Specification of a desired property of the MSAL can be made by identifying an allowable value or range of values for one or more metrics that represent the presence or absence of that property in the MSAL. The characteristics of the MSAL (e.g., type of molecule type, molecule head group, molecule tail group, molecule length) can then be established, for example, as a set of characteristics that produce allowable value(s) for the metric(s) for each property being specified for the MSAL (e.g., adhesion propert(ies), pore sealing capability, diffusion barrier capability, passivation capability).

The desired properties for a MSAL can have different degrees of importance. This may be reflected, for example, by the use of a particular property or properties to screen sets of characteristics in order to identify candidate sets of characteristics (and, perhaps, by successively screening sets of characteristics for a series of properties in order of decreasing importance). For example, in some embodiments, the desired properties of the MSAL are good pore sealing capability, good adhesion properties (both to the dielectric and to the overlying layer), good diffusion barrier capability and good passivation capability, listed in order of decreasing importance. In such embodiments, possible characteristics for a MSAL could be identified by identifying a first group of sets of characteristics (each set of characteristics can include, for example, a particular type of molecule, molecule head group, molecule tail group and molecule length) that can produce desired pore sealing capability. From the first group, a second group of sets of characteristics is identified that can produce desired adhesion properties. Continuing, a third group of sets of characteristics is identified from the second group that can produce desired diffusion barrier capability and, from the third group, a fourth group of sets of characteristics is identified that can produce desired passivation capability. The fourth group of sets of characteristics represents the possible characteristics for the MSAL for a particular application, from which a particular set of characteristics can be chosen for use in that application.

The post-processing 503 of the MSAL, described above with reference to FIG. 5, includes cleaning of the substrate (e.g., cleaning with TMAH, TBAH, TPAH, LiOH, KOH, and other high pH chemistries, deionized water rinse, IPA rinse, N2 dry) to remove any undesired material (e.g., unreacted molecules used in formation of the molecularly self-assembled layer). In some circumstances, the cleaning can be effected in such a fashion so as to remove a substantial portion (e.g., from about 50 Å to 400 Å, and more preferably from about 100 Å to 250 Å) of the copper at the bottom of the vias or structures of the substrate. This removal of portions of copper from structure bottoms can be used to create the framework for the formation of structural anchors which can be filled during subsequent barrier layer deposition, seed layer deposition, and bulk copper fill. These structural anchors serve to improve (e.g., lower) via resistance and/or via resistance distribution (e.g., tighter distribution), relieve stress concentrations at the via bottom corners, and can provide improved reliability (e.g. improved electromigration and/or stress migration resistance). The post-processing can also include other processes as appropriate to the MSAL.

The post-processing 503 can also include a reactive etch process (e.g., wet) using nitric or citric acid for example. This can be done, as described above, to remove unwanted material formed on exposed areas of electrically conductive material. The etching can also be performed to etch down into exposed electrically conductive material to enhance mechanical attachment of electrically conductive material subsequently formed thereon and improve electro-migration reliability. When the post-processing includes etching, cleaning can be performed after the etching. In another embodiment, the MSAL can be used as a sacrificial layer which can be removed after the exposed electrically conductive material (e.g. via bottoms) has been cleaned and/or etched.

The post-processing can also include one or more of a vaporization, annealing and/or curing (e.g., electron beam or ultraviolet radiation curing) process under an embodiment. For example, as described above with reference to FIG. 3, a layer of MSAL material can be formed and annealed to provide a good barrier to diffusion of material (e.g. reactants, precursors used in ALD, CVD, and the like) into a porous dielectric material. The MSAL is formed with material having a characteristic dimension similar to the size of the exposed pores (typically a maximum of 20-50 Å in diameter, but more typically, ranging from greater than or equal to approximately 10 Å to less than or equal to approximately 25 Å in diameter) in the dielectric material so as to seal and hence, inhibit material diffusion into the dielectric material. The MSAL can comprise organic material(s) possessing carbon chain(s) wherein the length(s) of said carbon chain(s) can be adjusted to effectively control the size of the organic material(s) so as to match the pore size and size distribution of the dielectric material and effect efficient sealing of the exposed pores or at least a specified percentage of the exposed pores at the surface of a dielectric material. In an embodiment, the MSAL can be formed using an organic material having a carbon chain with a length greater than approximately 20 Å or greater than approximately 50 Å for example. In a particular embodiment, the molecularly self-assembled layer can be formed using an organic material having a carbon chain including a number of atoms approximately in a range of 6 to 25 atoms but is not so limited. In another embodiment, the MSAL can be formed using an organic material having a carbon chain with a length ranging from approximately 10 Å to 30 Å.

The MSAL material is annealed after formation for a time and at a temperature sufficient to break down the MSAL material (e.g., to break down the carbon chain(s) of a MSAL made of an organic material) so that parts of the MSAL seal pores in the underlying dielectric material. The MSAL could be functionalized prior to annealing to include a terminal group that, once the MSAL is broken down, provides a surface having desired adhesion characteristics to facilitate subsequent formation of material on the MSAL (e.g., a metal oxide terminal group can form a nucleation surface for ruthenium subsequently formed on the molecularly self-assembled layer using ALD). The annealing of MSAL material of an embodiment enables large molecules (including, but not limited to, the use of clusters of atoms, clusters of functionalized atoms, nanoparticles, functionalized nanoparticles, and the like) to be used in forming the MSAL; this can enhance the sealing of pores in a porous dielectric material while providing a relatively thin MSAL which facilitates implementation in increasingly small structures. Additionally, the thickness of the MSAL prior to annealing can be tailored to ensure continuity of the MSAL after annealing. Further, materials that break down at relatively low temperatures (which would otherwise make those materials unusable for some applications) can be used in forming a MSAL.

As described above, the manufacture of integrated circuits, semiconductor devices, flat panel displays, optoelectronic devices, data storage devices, magnetoelectronic devices, magnetooptic devices, molecular electronic devices, solar cells, photonic devices, packaged devices, and the like require the use of thin film deposition techniques. Many of the thin film deposition techniques including but not limited to evaporation, laser ablation, e-beam evaporation, physical vapor deposition (PVD) or sputtering, ionized PVD, molecular beam epitaxy (MBE), and their derivatives used for such manufacturing allow the formation of substantially pure films with controlled compositions as the deposition species are essentially generated from source material(s) substantially representing the desired composition of the resulting deposited film. Moreover, these deposition techniques generally rely on the transport of the deposition species in vapor form from the source material(s) to the substrate to be coated, whereby the deposition process is essentially line-of-sight. As a result, these aforementioned techniques suffer from step coverage and conformality issues (e.g. the ability to deposit a film of uniform thickness regardless of the geometry of the substrate and/or features on the substrate to be coated with said film) as the deposition profile is dependent on the flux and angular distribution of the incoming deposition species. The step coverage and conformality issues are exacerbated when high aspect ratio (i.e. ratio of feature depth to width) submicron dimension structures (e.g. lines, trenches, vias, holes, and combinations thereof) need to be covered.

Other thin film deposition techniques such as chemical vapor deposition (CVD), plasma enhanced chemical vapor deposition (PECVD), sub-atmospheric chemical vapor deposition (SACVD), metal organic chemical vapor deposition (MOCVD), laser assisted or induced CVD, e-beam assisted or induced CVD, atomic layer deposition (ALD), plasma enhanced atomic layer deposition (PEALD), ion induced atomic layer deposition, and their derivatives may provide in principle advantages in improved step coverage and conformality as these processes are not generally line-of-sight but substantially rely on chemical reaction pathway(s) which can be tailored to be substantially less sensitive to the geometry of the substrate and/or features on the substrate to be coated. However, these deposition techniques suffer from the complexities associated with the gaseous precursor(s) and chemical reaction pathway(s) required to create the thin film which make the formation of substantially pure films of desired composition(s) difficult.

Many of the aforementioned techniques do not offer adequate control of deposition thickness as they can be generally classified as flux and/or time dependent processes as opposed to self-limiting (as in the case for ALD and its derivatives). As device feature geometries decrease, the ability to accurately control the thickness of the deposited thin films becomes increasingly important. These films may be less than or equal to about 100 Å, and more specifically less than or equal to about 50 Å, and in some cases less than or equal to about 20 Å.

Moreover, the aforementioned techniques generally require operation under specified environments ranging from sub-atmospheric (less than 760 torr pressure) through vacuum levels as low as $10^{-8}$ torr or below pressures. In addition, many of the aforementioned techniques require the use of plasmas or plasma environments. Operation under vacuum and/or the need for plasmas pose additional manufacturing cost, throughout, scaling, and/or other implementation challenges which increase in severity as the size of the substrate increases.

The molecular self-assembly of an embodiment provides a number of thin film deposition methods which enable for example compositional control, formation of pure films, formation of highly conformal films, accurate control of film thickness, and scaling to increasing substrate sizes. The thin film deposition methods enabled under the molecular self-assembly described above include molecularly self-assembled layers for pore sealing, improved copper interconnect integration, and copper seed layer formation as more specific examples. Each of these thin film deposition methods are described in detail below.

The MSAL of an embodiment provides a method for sealing exposed pores of low-k dielectric materials. The use of low dielectric constant (i.e. low-k) materials enable reduction in RC delay, line-to-line capacitance, and power consumption for advanced interconnect technologies such as for copper interconnects. One of the primary means of reducing the dielectric constant is through the introduction of pores or porosity in the dielectric film. This becomes increasingly important for achieving films with dielectric constants less than or equal to approximately 2.5, and more specifically for dielectric constants less than or equal to approximately 2.2. A major challenge in using porous low-k dielectrics in advanced interconnects is their integration with subsequent processing steps.

As an example, porous low-k dielectrics are susceptible to precursor penetration during barrier layer formation such as in atomic layer deposition (ALD), chemical vapor deposition (CVD), and other vapor phase deposition processes. This can lead to poisoning of the low-k dielectric, an increase in the effective dielectric constant of the low-k, the inability to form a continuous barrier layer over the low-k, the inability to form a thin and continuous barrier layer over the low-k, etc., all of which can subsequently lead to poor device performance. Porous low-k dielectrics also typically exhibit poor (e.g., weaker) adhesion characteristics to barrier layers and/or liners (e.g., Ta, $Ta_xC_y$, $Ta_xN_y$, $Ta_xC_yN_z$, W, $W_xC_y$, $W_xN_y$, $W_xC_yN_z$, Ru, etc.) as compared to standard dielectrics (e.g. $SiO2$, FSG, etc.) which can lead to poor device reliability (e.g. degradation in stress migration resistance and/or electromigration resistance).

Plasma techniques (e.g., post-etch treatments) can be used to modify the exposed surfaces of the porous low-k material so as to effectively close the pores. However such techniques often lead to structural damage and/or effective chemical damage (e.g., removal of Si—C, Si—CHx, etc. type bonds and conversion to Si—O, Si—OH type bonds) to the near surface layer (ranging from 50 Å to 200 Å in depth) so as to increase the effective dielectric constant to make implementation of the porous low-k dielectric unattractive. Other techniques require the deposition of a conformal physical layer to effectively seal the exposed pores. Such techniques require a subsequent etch-back step to remove the material from the bottom of vias, and the subsequent etch-back step adds to cost and complexity, may undesirably also "de-seal" the bottom of trenches, and still may suffer from precursor penetration when an ALD or CVD related process is used to deposit such a conformal sealing layer.

Another approach is to choose ALD or CVD precursors with larger molecular sizes approaching that of the exposed pores such that the precursor molecules do not readily diffuse into the exposed pores. However, this greatly limits the precursors which can be used and precludes precursors which may be more cost-effective and/or desired in the formation of the barrier layer and/or liner with the desired materials and/or electrical properties.

The molecular self-assembly described herein provides a method for sealing the exposed pores of porous low-k dielectrics and/or improving the adhesion properties of porous low-k dielectrics to barrier layers used in copper interconnect formation without any undesired physical and/or chemical damage to the porous low-k dielectric. The molecular self assembly also allows for selective sealing without undesired material formation on conductive surfaces.

Figure 8:
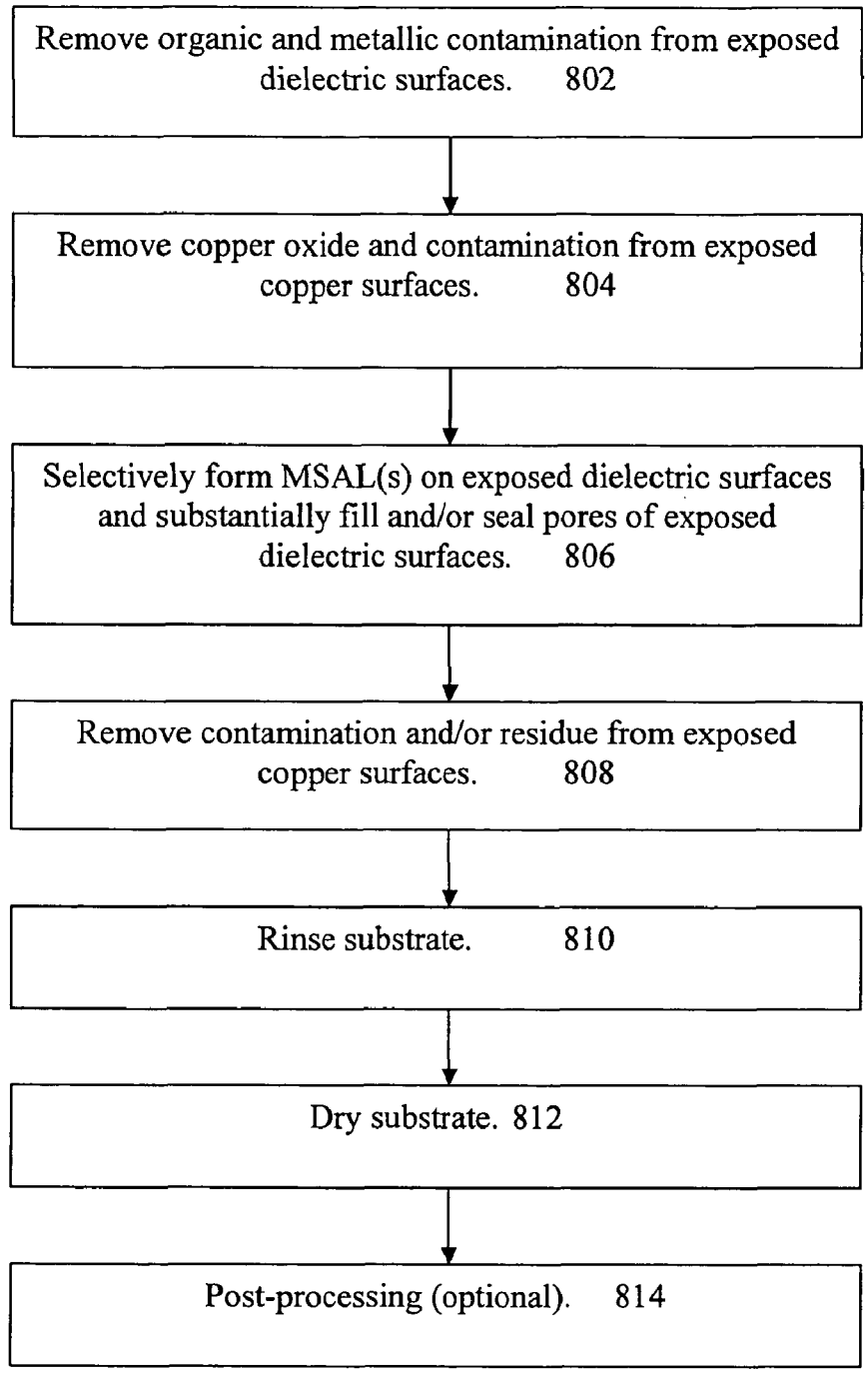
FIG. 8 is a flow diagram for sealing porous low-k dielectrics, under an embodiment.

FIG. 8 is a flow diagram for sealing 800 porous low-k dielectrics, under an embodiment. These porous low-k dielectrics can be used for example in the formation of copper interconnects. The pore sealing 800 of an embodiment includes removing 802 organic and metallic contamination from exposed dielectric surfaces by delivering cleaning solution(s) to a target material like exposed dielectric surfaces. Copper oxide and contamination are removed 804 from exposed copper surfaces using delivered cleaning and/or reducing solution(s). A molecularly self-assembled layer(s) is formed 806 on the exposed dielectric surfaces so as to substantially fill and/or seal the exposed pores of the exposed dielectric surfaces. The MSAL is formed by delivering wetting, functionalization, and/or coating agents to the exposed dielectric surfaces. Contamination and/or residue is removed 808 from exposed copper surfaces using cleaning solution(s) delivered 808 to the substrate; the contamination and/or residue results from formation 806 of the MSAL. The substrate is then rinsed 810 and dried 812. Any optional post-processing 814 treatment(s) (e.g., thermal, UV, IR, etc.) is then performed on the dried substrate.

The molecular self-assembly of an embodiment provides a method for improved copper interconnect integration. Copper damascene (single and/or dual) interconnect formation requires the cleaning of the bottoms of vias to enable good adhesion (e.g., barrier layer to underlying copper), electrical performance (e.g., low contact and/or via resistance), and reliability performance (e.g., stress migration and/or electromigration resistance).

A typical interconnect integration scheme used is as follows: degas (e.g. thermal vacuum anneal); plasma-based preclean (e.g. reactive, physical, and/or combinations thereof); barrier layer deposition (e.g. PVD TaN, Ta, and/or combinations thereof); copper seed layer deposition (e.g. PVD Cu, ALD Cu, CVD Cu, and/or combinations thereof); and bulk copper fill (e.g. electroplating, electroless Cu deposition, and/or combinations thereof). An issue with this typical process is that copper, copper oxide, carbonaceous post etch residue, and/or other contamination removed from the bottom portions of the via during the preclean process may be undesirably re-deposited on the sidewalls of the via during the preclean process. The re-deposited copper can diffuse into the dielectric and cause device performance and/or reliability issues (e.g. leakage and/or poor time dependent dielectric breakdown or TDDB performance). In addition, the undesirably re-deposited material(s) may lead to poor adhesion of the subsequent barrier layer to the dielectric leading to poor device performance and/or reliability issues (e.g. poor stress migration resistance).

Attempts to avoid the above-stated issues include performing the preclean step (either in-situ in a PVD chamber or in a separate plasma based preclean chamber) following the initial deposition of a PVD barrier layer in a resputtering process wherein the initially deposited barrier layer will serve as to protect the dielectric via sidewalls. The issue with this approach is that the effective extent of material removed from the bottom of vias is size-dependent and aspect ratio-dependent as both the initially deposited barrier layer (e.g. generally more material is deposited on the bottom of wide, low AR features as compared to small, high AR features for a given PVD barrier layer deposition process on a substrate containing both feature types) and the subsequent etching (e.g. generally the extent of punch through at the bottom of wide, low AR features occurs is less than that at the bottom of small, high aspect ratio features) are both geometry and/or aspect ratio dependent.

Figure 9:
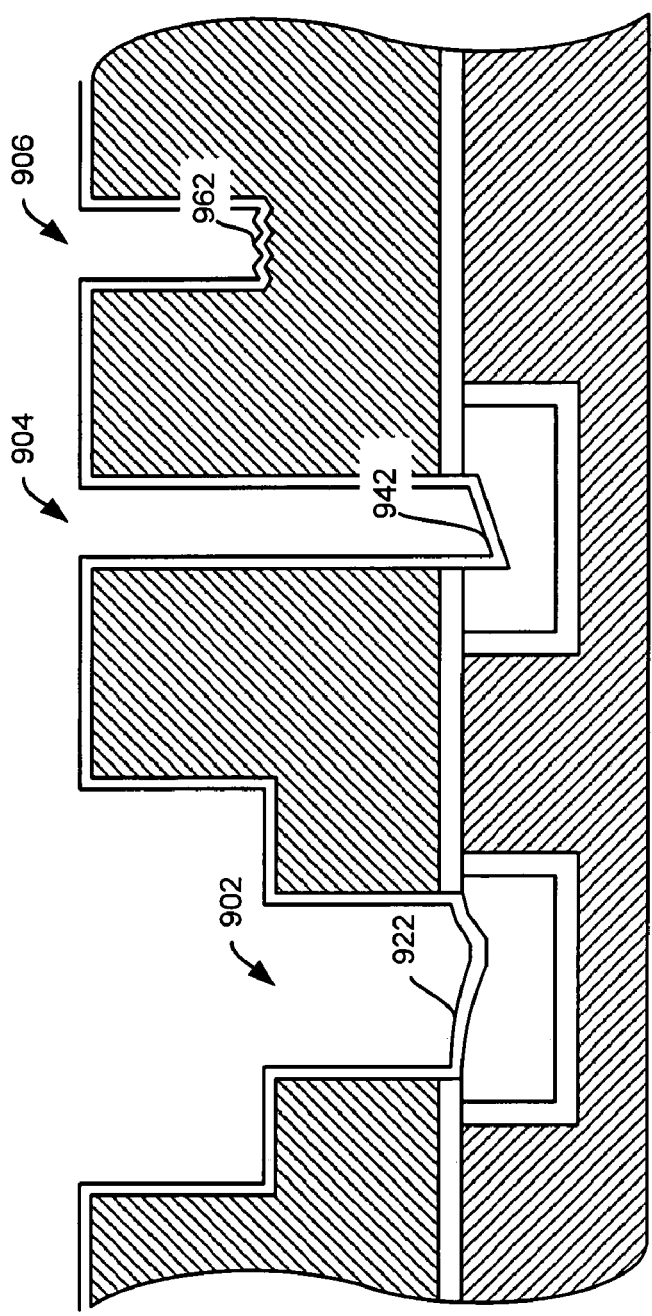
FIG. 9 shows examples that the effective extent of material removed from the bottom(s) of structures is size-dependent and aspect ratio-dependent.

FIG. 9 shows examples that the effective extent of material removed from the bottom(s) of vias (and/or trenches) is size-dependent and aspect ratio-dependent. If a particular interconnect layer contains for example, both wide, low aspect ratio vias 902 (e.g. 0.25 □m diameter, 2:1 AR vias) and small, high aspect ratio vias 904 (e.g. 0.1 □m diameter, 5:1 AR vias), the requirement to be able to punch through the initial layer of barrier material at the bottom of the wide, low AR vias 902 in order to effect desired via bottom cleaning can cause removal of excess material and/or damage 942 to the bottom portions of the small, high AR vias 904 leading to poor reliability. If optimal removal is targeted for the small, high AR vias 904, then the wide, low AR vias 902 may not receive sufficient cleaning leading to poor via resistance and/or poor device reliability such as poor stress migration resistance due to remaining contamination 922 at the bottom of the via 902. Moreover, the requirement to be able to punch through the initial layer of barrier material at the bottom of the wide, low AR vias 902 in order to effect desired via bottom cleaning may also cause the complete removal of barrier material and/or dielectric loss and damage 962 at the bottom of small, high aspect ratio trenches 906. This can lead to device reliability issues such as poor electromigration resistance.

Similar excess barrier removal and/or dielectric loss/damage can occur on the other horizontal surfaces such as the field which can lead to subsequent integration challenges due to dielectric roughening and/or poor device performance due to increased layer-to-layer capacitances. Furthermore, all of the above issues become further exacerbated when the features to be cleaned are formed in low-k films with dielectric constants less than or equal to approximately 2.5, and more specifically for dielectric constants less than or equal to approximately 2.2. Low-k films are generally of lower density and exhibit lower structural integrity as compared to standard dielectrics such as $SiO_2$ and/or FSG and hence are more easily removed, damaged, and/or roughened.

The molecular self-assembly of an embodiment provides a method for improved copper interconnect integration that effects proper cleaning of features (especially of via bottoms) independent of feature geometry and/or aspect ratio, without dielectric loss/damage, and without re-deposition of undesired material(s) removed and/or generated during the cleaning process. The molecular self-assembly achieves the above desired aspects through the use of a sacrificial masking layer on the patterned dielectric surfaces as described below and in the Related Applications referenced above.

Figure 10A:
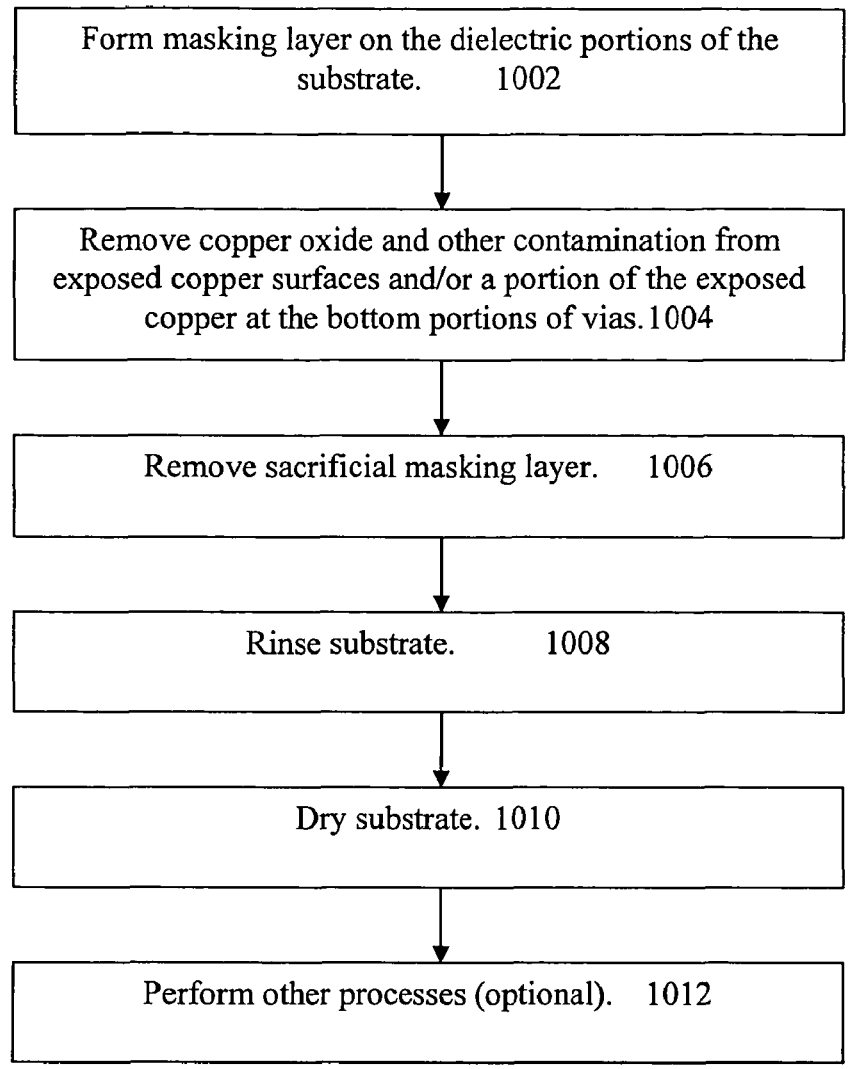
FIG. 10A is a flow diagram for interconnect integration using molecular self-assembly, under an embodiment.

FIG. 10A is a flow diagram for interconnect integration 1000 using molecular self-assembly, under an embodiment. The interconnect integration 1000 of this example is copper interconnect integration but the molecular self-assembly described herein is not limited to copper interconnects. The interconnect integration 1000 of an embodiment includes forming 1002 a masking layer on the dielectric portions of the substrate by delivering 1002 wetting, functionalization, and/or organic coating agents to the substrate. The copper oxide and other contamination is removed 1004 from exposed copper surfaces and/or a portion of the exposed copper at the bottom portions of the vias is removed using cleaning, reducing, and/or etching solution(s) delivered to the substrate. The sacrificial masking layer is removed 1006 using cleaning and/or etching solution(s) delivered to the substrate. Sacrificial masking layer removal 1006 removes contaminants which otherwise would have been re-deposited over the dielectric portion(s) of the substrate. Removal 1006 of the sacrificial masking layer removes re-deposited material(s) such as copper, copper oxide, carbonaceous post etch residue, and/or other contamination removed from the bottom portions of the vias during removal 1004 of the copper oxide and other contamination from exposed copper surfaces, and/or a portion of the exposed copper. The substrate is then rinsed 1008 and dried 1010.

Other processes 1012 like barrier layer deposition, copper seed layer deposition, and/or bulk copper fill processes can be performed following the interconnect integration 1000. Cleaning solution(s) can be optionally used to remove organic and/or metallic contamination from exposed dielectric surfaces prior to masking layer formation 1002.

Figure 10B:
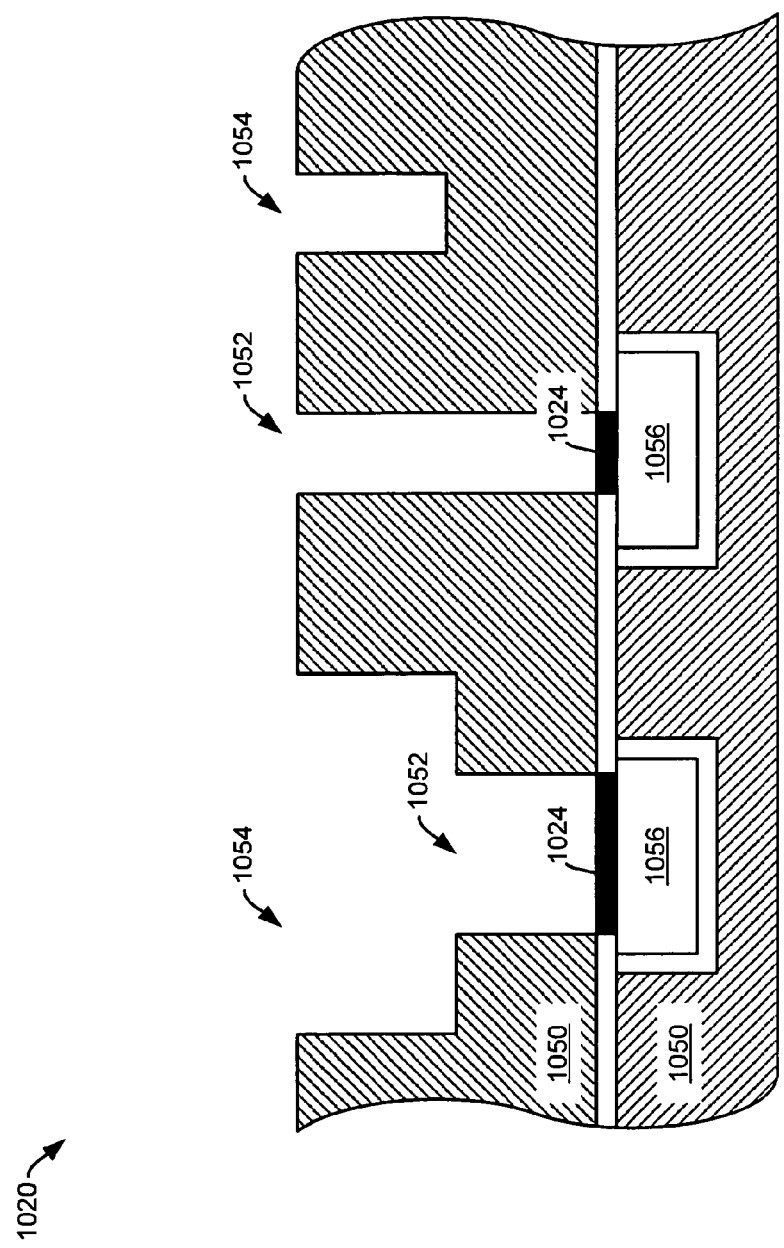
FIGS. 10B-10F show an example of interconnect integration using molecular self-assembly, under an embodiment.
Figure 10C:
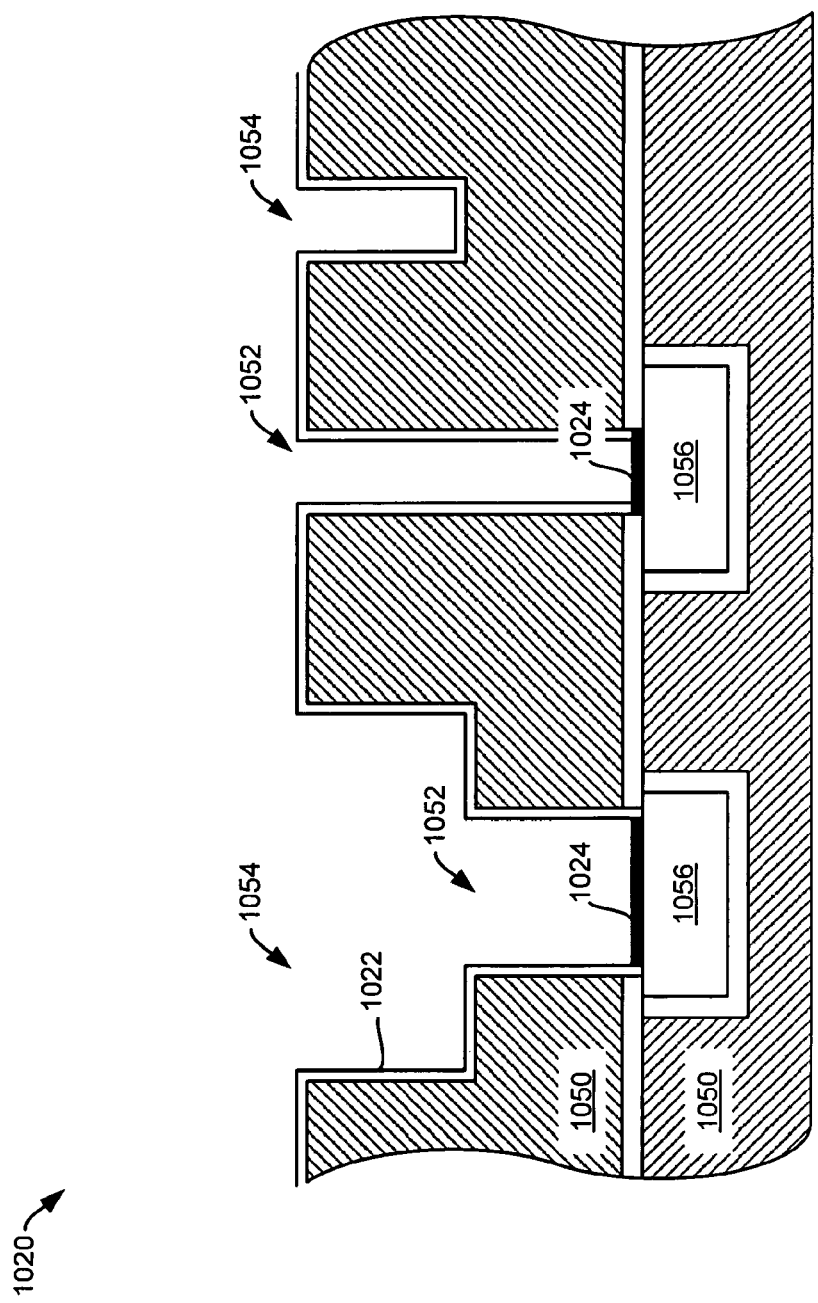

FIGS. 10B-10F show an example of interconnect integration 1000 using molecular self-assembly, under an embodiment. FIG. 10B shows a substrate 1020 that includes a dielectric material 1050 comprising vias 1052 and trenches 1054, under an embodiment. The copper surfaces and/or portions of copper surfaces 1056 at the bottom portion or region of the vias 1052 are covered with contaminants 1024 that include oxides and/or other materials. The interconnect integration 1000 of an embodiment includes forming a masking layer 1022 on the dielectric portions 1050 of the substrate 1020 by delivering wetting, functionalization, and/or organic coating agents to the substrate. FIG. 10C is the substrate 1020 with the formed masking layer 1022, under an embodiment.

Figure 10D:
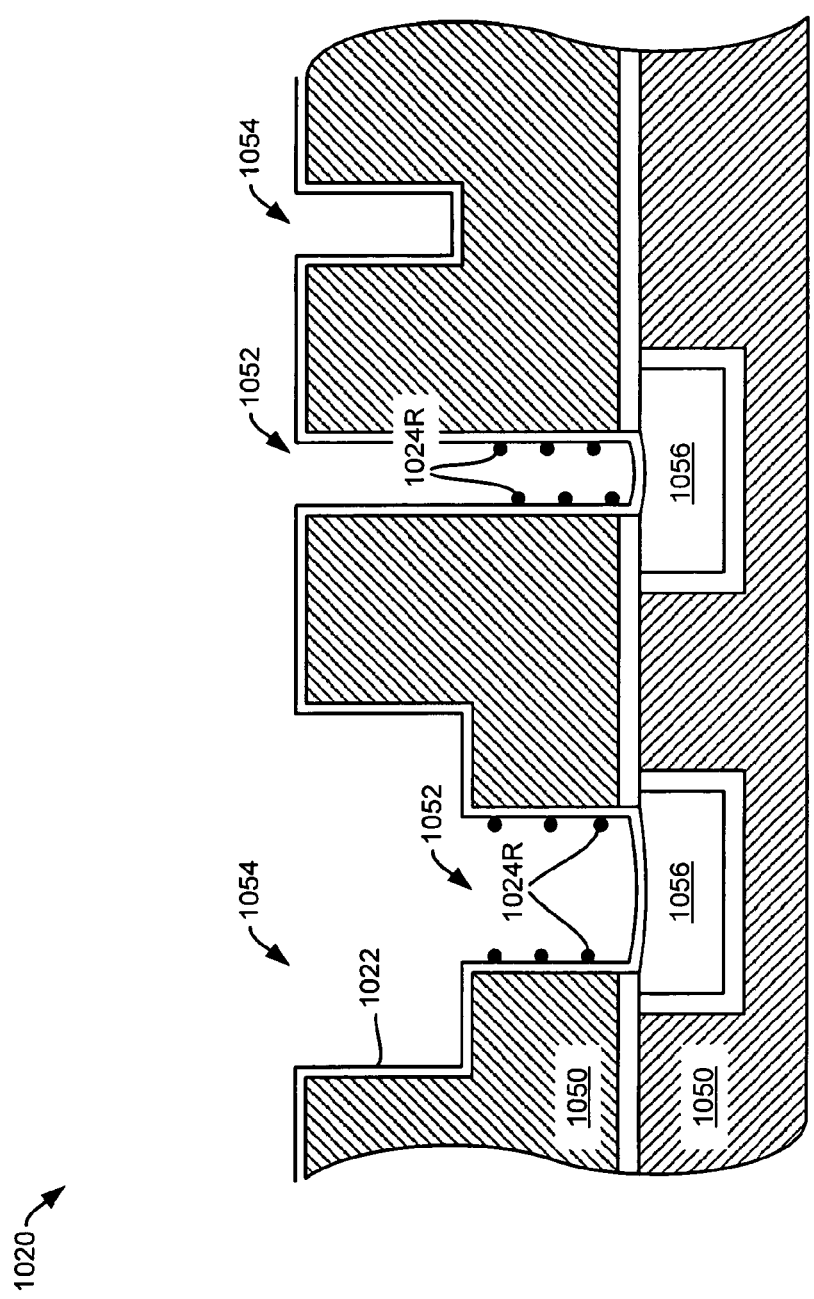
Figure 10E:
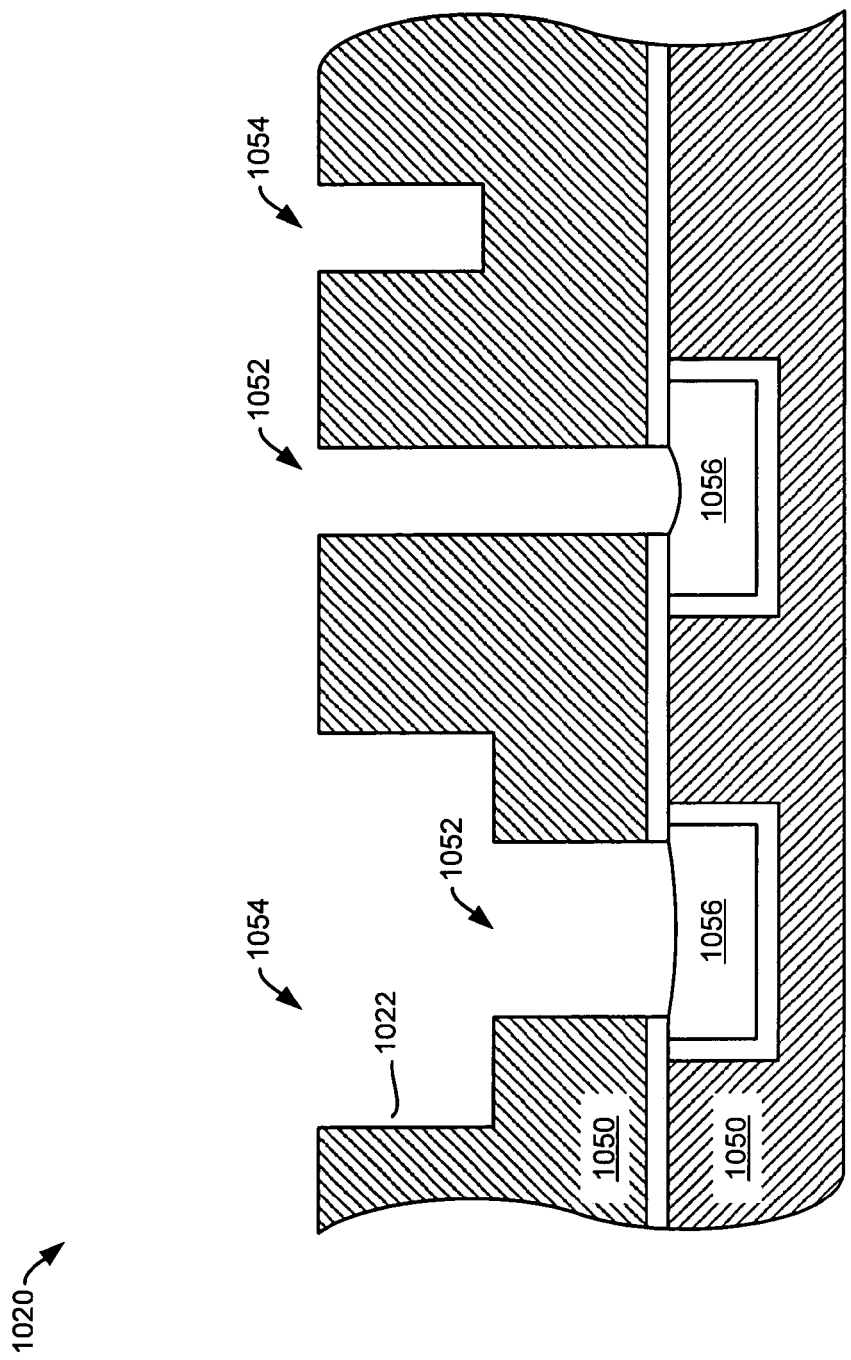
Figure 10F:
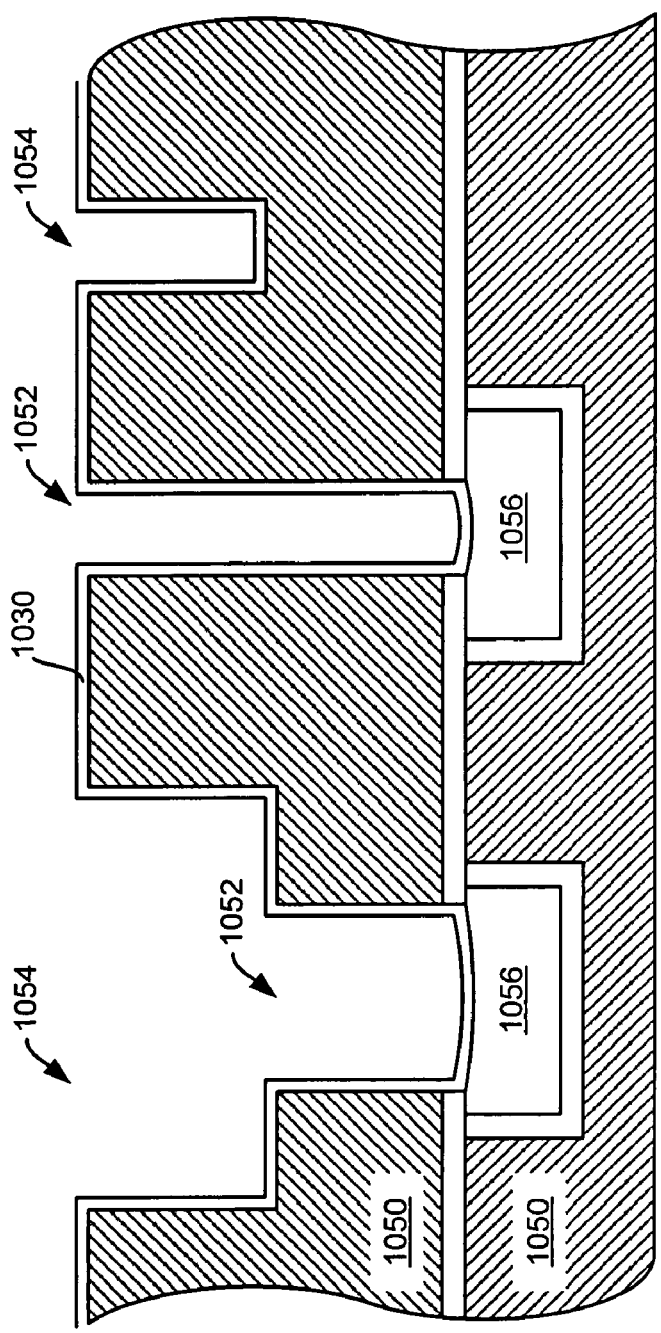

The contamination 1024 is removed 1024R from the exposed copper surfaces 1056 and/or a portion of the exposed copper at the bottom portions or regions of the vias 1052 is removed using cleaning, reducing, and/or etching solution(s) delivered to the substrate. FIG. 10D is the substrate 1020 following removal of the contamination 1024 from the bottoms of the vias 1052, under an embodiment. Some amount of the contamination 1024R removed from the via bottom regions is trapped on and/or in the masking layer 1022. The sacrificial masking layer 1022 is removed using cleaning and/or etching solution(s) delivered to the substrate. Removal of the sacrificial masking layer removes material(s) 1024R such as copper, copper oxide, carbonaceous post etch residue, and/or other contamination removed from the bottom portions of the vias during removal 1004 of the copper oxide and other contamination. FIG. 10E is the substrate 1020 following removal of the masking layer 1022 and the contamination 1024 and 1024R, under an embodiment. As described above, other layers 1030 (e.g., barrier layer, copper seed layer) can then be formed on the substrate and/or the exposed material at the bottom portions of the vias 1052. FIG. 10F is the substrate 1020 following optional processing to form other layers 1030 (e.g., barrier layer is shown), under an embodiment.

The liquid-based via bottom clean described above for copper oxide and contamination removal 1004 can be made to be geometry and/or aspect ratio independent. Wetting agents and/or surfactant can be used to promote uniform reaction. Since physical sputtering is not employed, dielectric loss and/or damage are avoided. The sacrificial masking layer provides a means by which material(s) such as copper, copper oxide, carbonaceous post etch residue, and/or other contamination removed from the bottom portions of the vias during contamination removal 1004 (which would otherwise have been re-deposited over the dielectric portion(s)) are removed through the removal of the masking layer.

Furthermore, the sacrificial masking layer can serve to protect the dielectric during via bottom cleaning. In some circumstances, the cleaning can be effected in such a fashion so as to remove a substantial portion (e.g. from approximately 50 Å to 400 Å, and more preferably from approximately 100 Å to 250 Å) of the copper at the bottom of the vias. This can be used to create the framework for the formation of structural anchors which can be filled during subsequent barrier layer deposition, seed layer deposition, and bulk copper fill. These structural anchors serve to improve (e.g. lower) via resistance and/or via resistance distribution (e.g. tighter distribution), relieve stress concentrations at the via bottom corners, and can provide reliability advantages (e.g. improved electromigration and/or stress migration resistance).

The molecular self-assembly of an alternative embodiment provides a method for improved copper interconnect integration that deposits an electroless metal alloy after cleaning the via bottoms. The electroless metal alloy, which can include materials like a cobalt containing alloy, CoW, CoWP, CoWB, CoB, CoBP, CoWBP, Ni containing alloys, etc., passivates and protects the now cleaned copper surfaces at the bottom of the vias. This provides an improved adhesion layer, hermetic layer, barrier layer, and/or reliability enhancement layer (e.g. for stress migration resistance and/or electromigration resistance) but is not so limited.

Figure 11A:
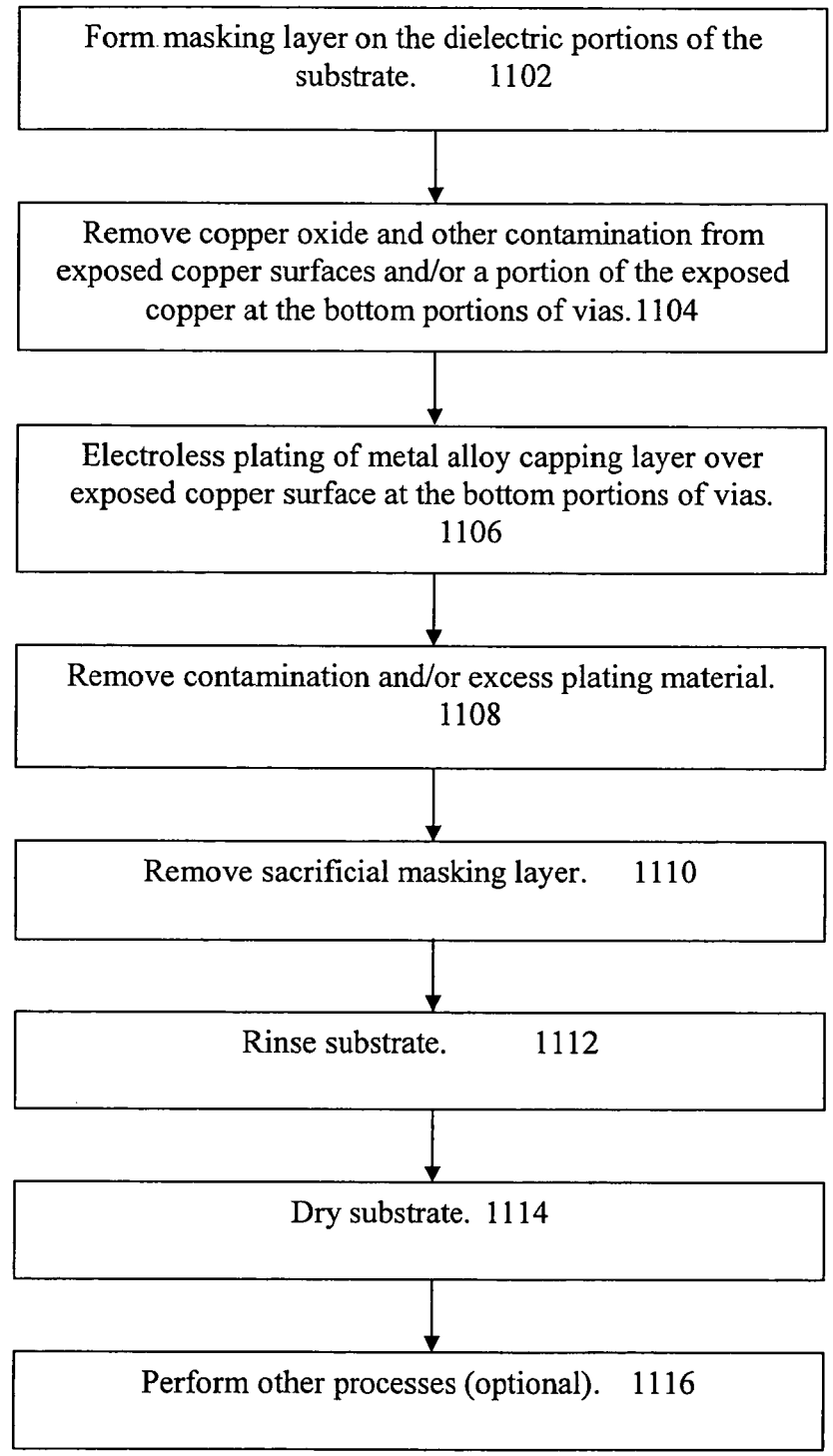
FIG. 11A is a flow diagram for interconnect integration using molecular self-assembly, under an alternative embodiment.

FIG. 11A is a flow diagram for interconnect integration 1100 using molecular self-assembly, under an alternative embodiment. The interconnect integration 1100 of an embodiment includes forming 1102 a masking layer on the dielectric portions of the substrate by delivering wetting, functionalization, and/or organic coating agents to the substrate. The copper oxide and other contamination is removed 1104 from exposed copper surfaces and/or a portion of the exposed copper at the bottom portions of the vias is removed using cleaning, reducing, and/or etching solution(s) delivered to the substrate. Electroless plating 1106 of a metal alloy capping layer over the exposed copper surface at the bottom portions of the vias is effected through delivery of a multi-component plating chemistry to the substrate. The multi-component plating chemistry of an embodiment includes but is not limited to Co containing agents, Ni containing agents, transition metal containing agents, reducing agents, pH adjusters, surfactants, wetting agents, DI water, DMAB, TMAH, etc.

Contamination and/or excess plating material is removed 1108 using post-cleaning solution(s) delivered to the substrate following the electroless plating 1106. The sacrificial masking layer is then removed 1110 using cleaning and/or etching solution(s) delivered to the substrate. Removal 1110 of the sacrificial masking layer removes i) re-deposited material(s) such as copper, copper oxide, carbonaceous post etch residue, and/or other contamination removed from the bottom portions of the vias during removal 1104 of the copper oxide and other contamination from exposed copper surfaces, and/or a portion of the exposed copper, ii) contamination resulting from the electroless plating 1106, and/or iii) contamination resulting from the post plating clean 1108. Masking layer removal 1110 removes contaminants which otherwise would have been re-deposited over the dielectric portion(s) of the substrate. Removal 1108 of contamination and/or excess plating material and removal 1110 of the sacrificial masking layer can be performed in a single removal process or operation but are not so limited.

The substrate is rinsed 1112 and dried 1114 following removal 1110 of the sacrificial masking layer. Other processes 1116 like barrier layer deposition, copper seed layer deposition, and/or bulk copper fill processes can be performed following the interconnect integration 1100. Cleaning solution(s) can be optionally used to remove organic and/or metallic contamination from exposed dielectric surfaces prior to masking layer formation 1102.

Figure 11B:
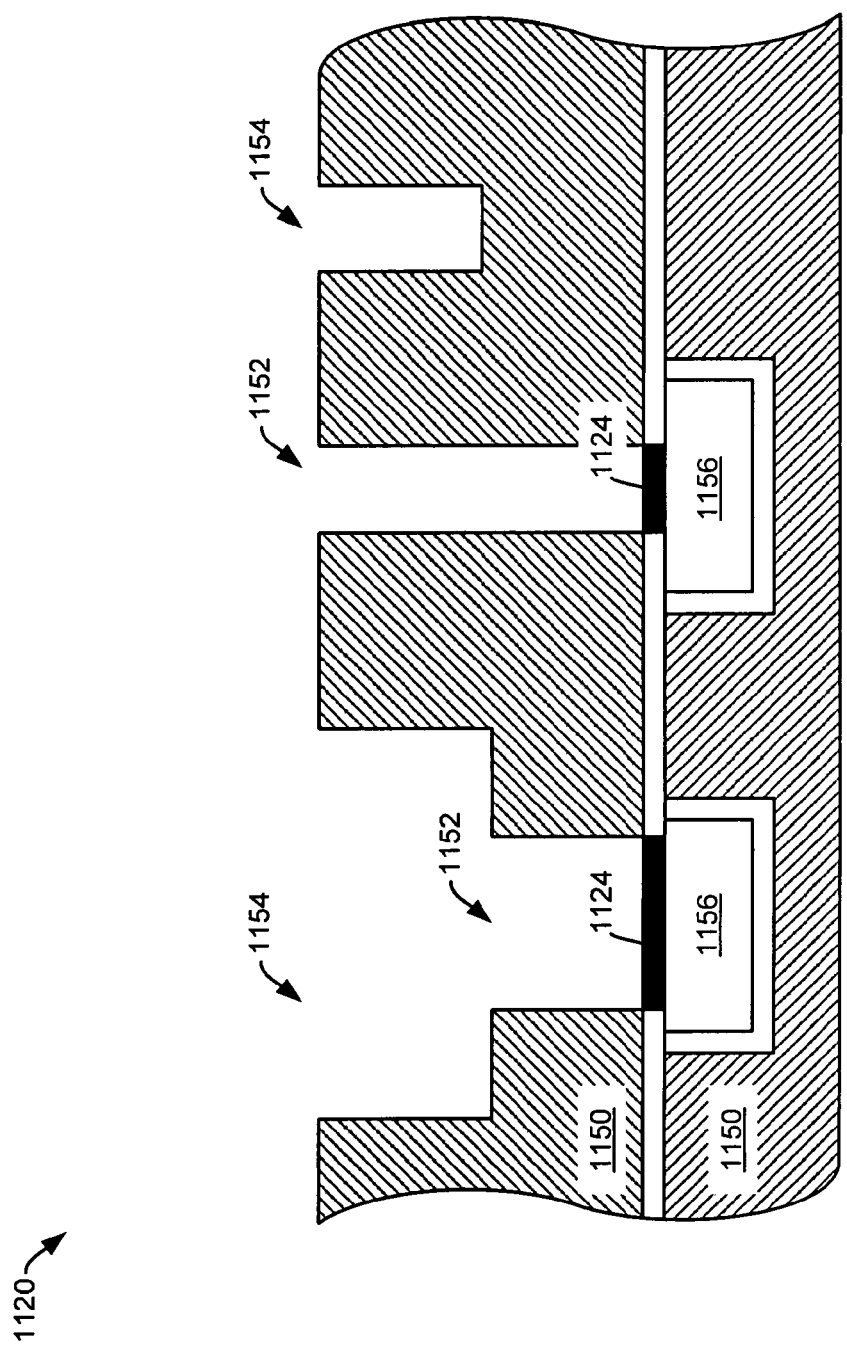
FIGS. 11B-11G show an example of interconnect integration using molecular self-assembly, under an alternative embodiment.
Figure 11C:
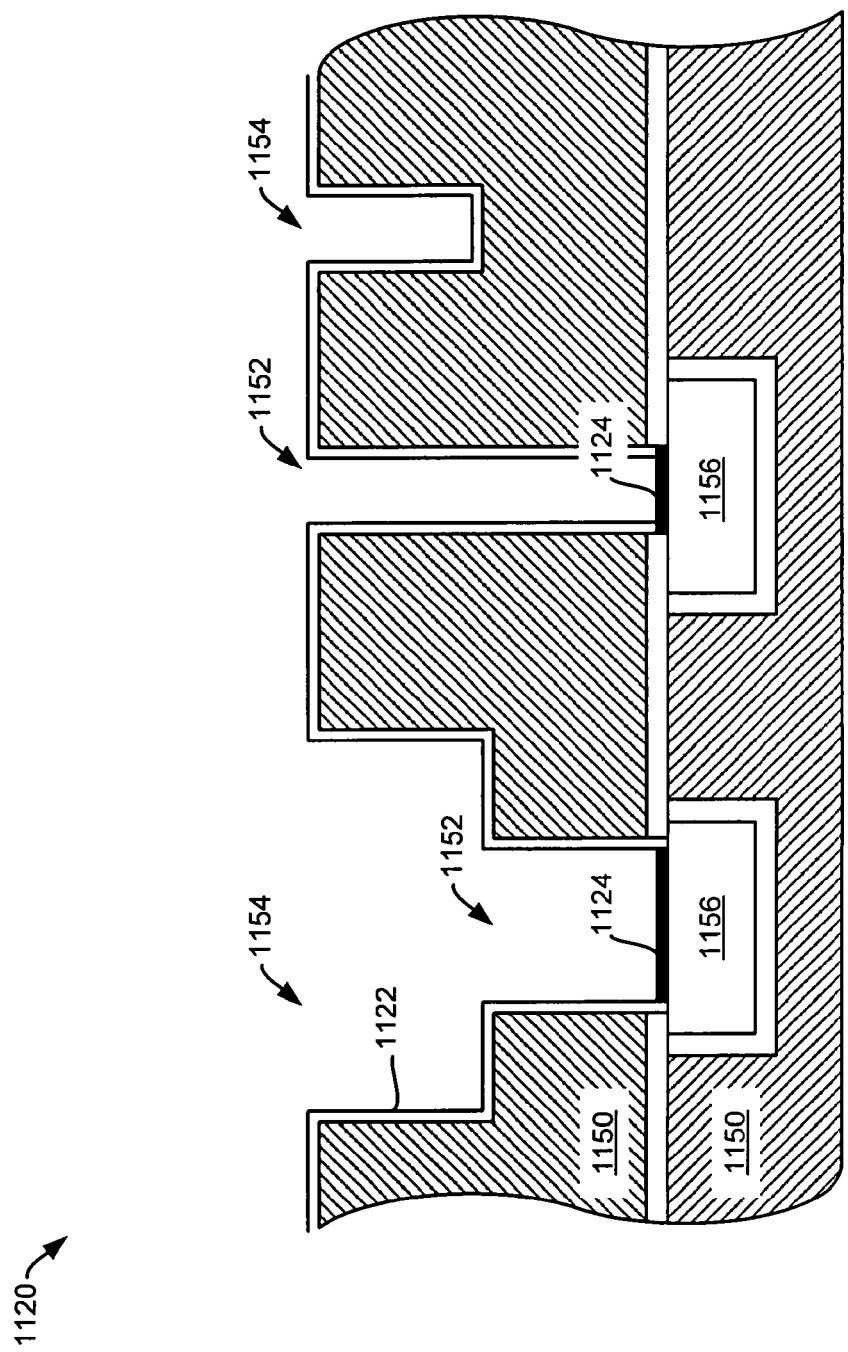

FIGS. 11B-11G show an example of interconnect integration 1100 using molecular self-assembly, under an embodiment. FIG. 11B shows a substrate 1120 that includes a dielectric material 1150 comprising vias 1152 and trenches 1154, under an embodiment. The copper surfaces and/or portions of copper surfaces 1156 at the bottom portion of the vias 1152 are covered with contaminants 1124 that include oxides and/or other materials. The interconnect integration 1100 of an embodiment includes forming a masking layer 1122 on the dielectric portions 1150 of the substrate 1120 by delivering wetting, functionalization, and/or organic coating agents to the substrate. FIG. 11C is the substrate 1120 with the formed masking layer 1122, under an embodiment.

Figure 11D:
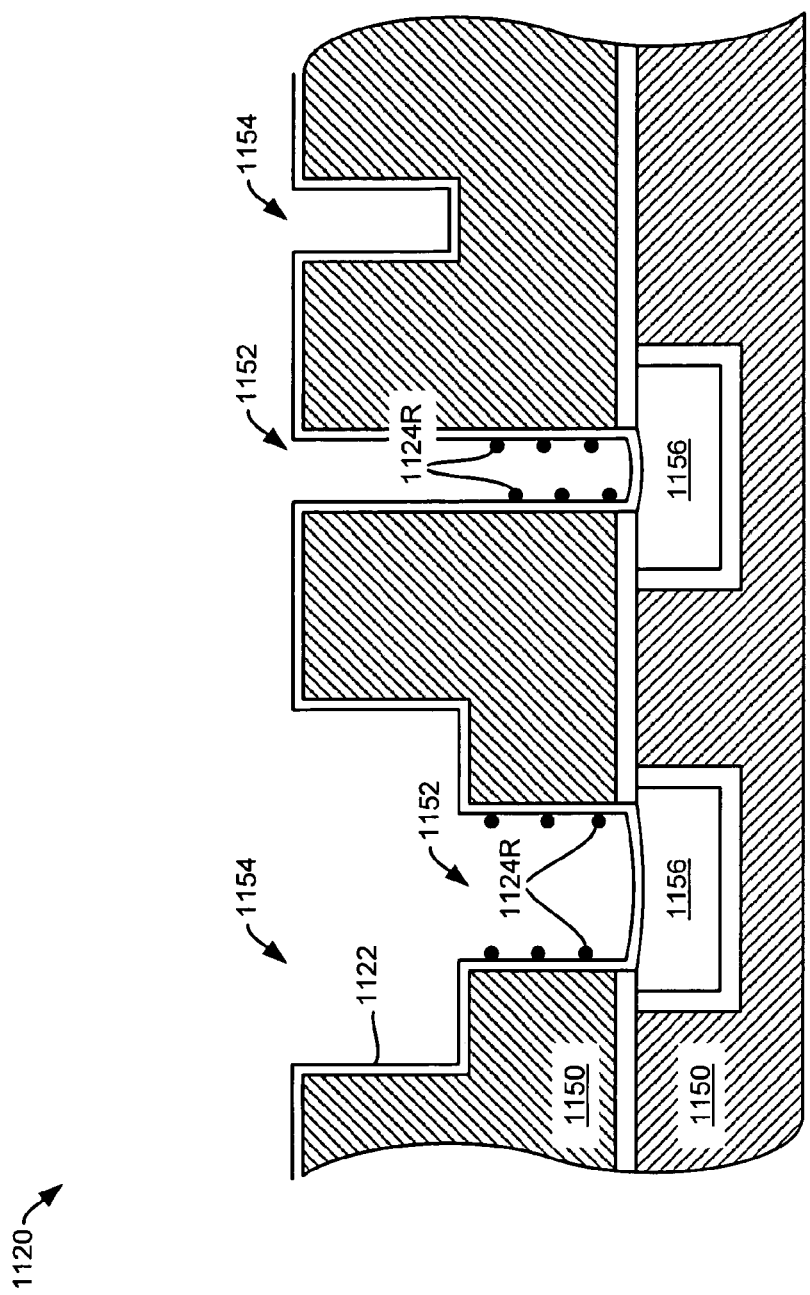

The contamination 1124 is removed 1124R from the exposed copper surfaces 1156 and/or a portion of the exposed copper at the bottom portions of the vias 1152 is removed using cleaning, reducing, and/or etching solution(s) delivered to the substrate. FIG. 11D is the substrate 1120 following removal of the contamination 1124 from the bottoms of the vias 1152, under an embodiment. Some amount of the contamination 1124R removed from the via bottoms is trapped on and/or in the masking layer 1122.

Figure 11E:
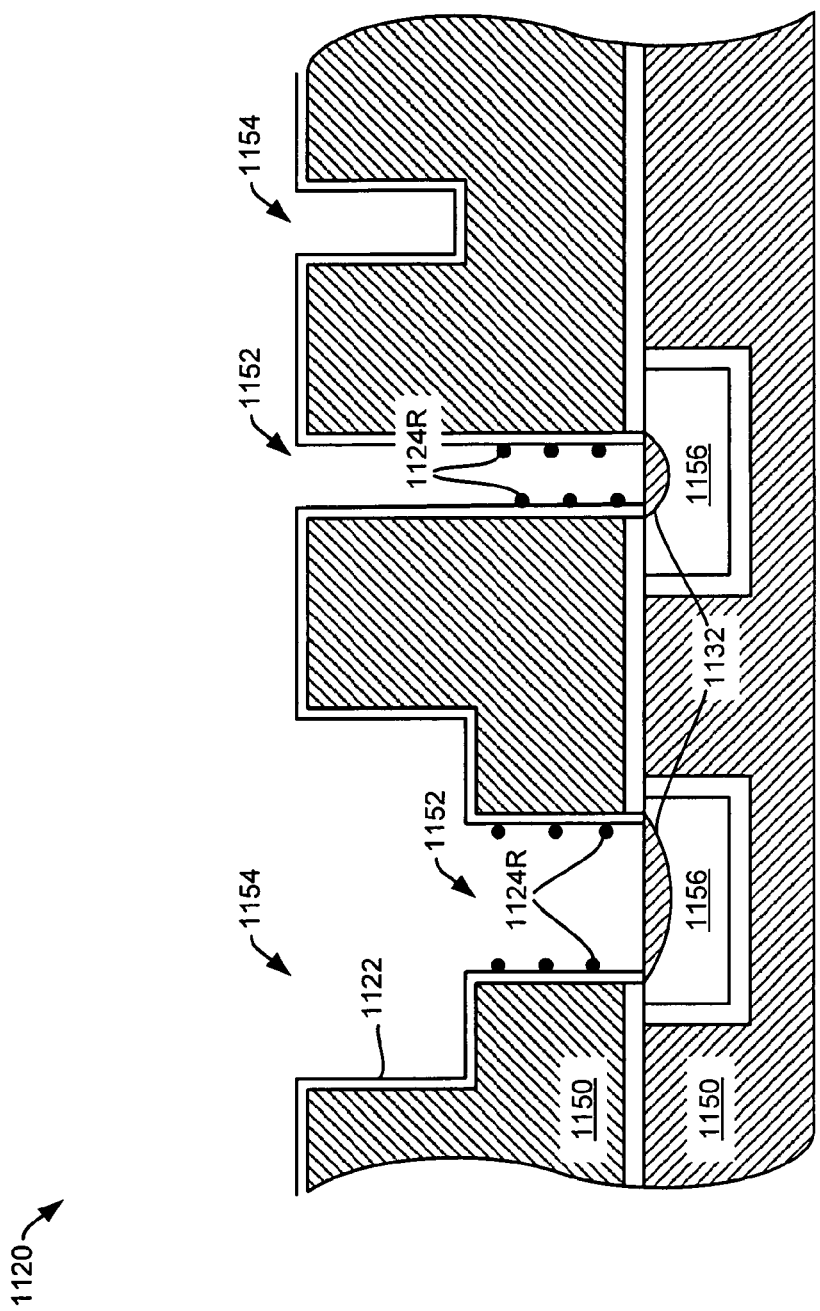
Figure 11F:
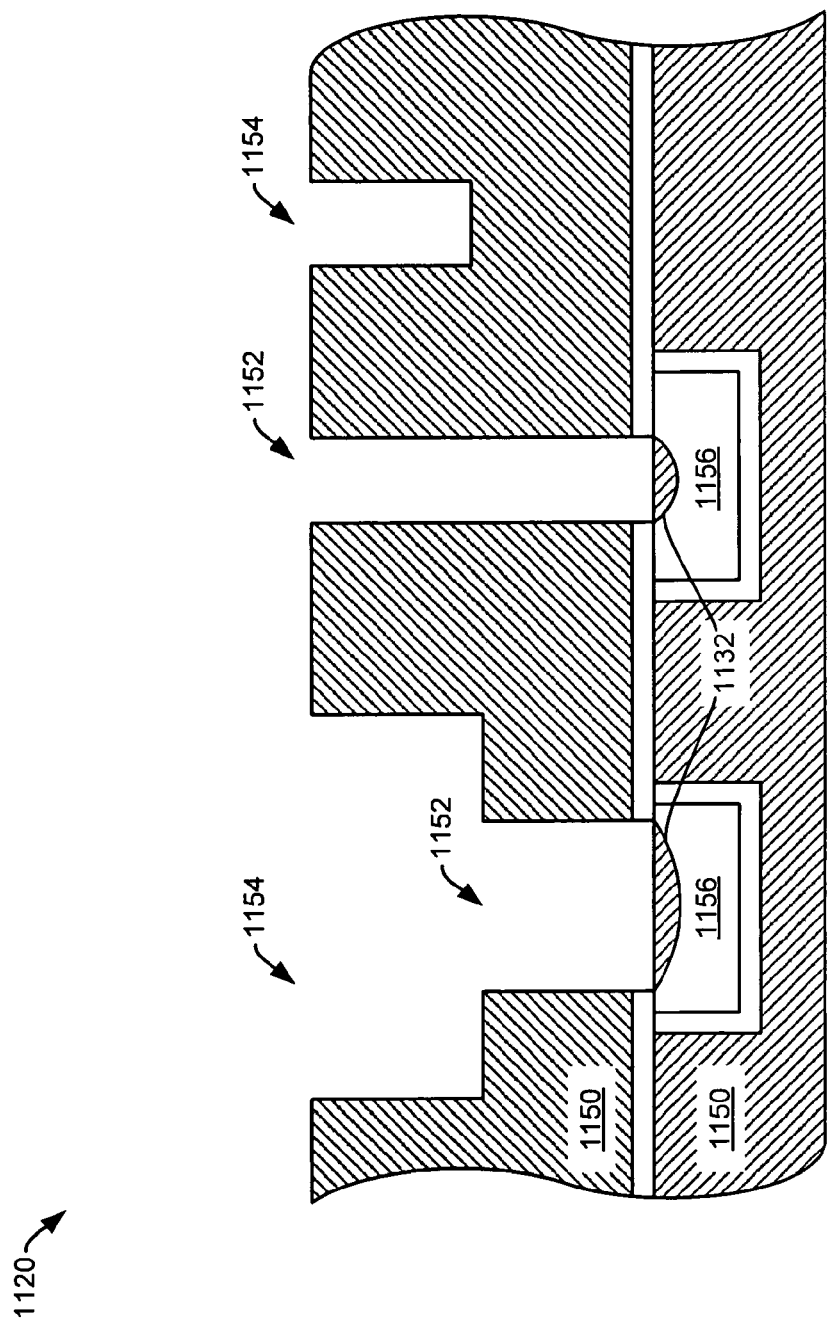
Figure 11G:
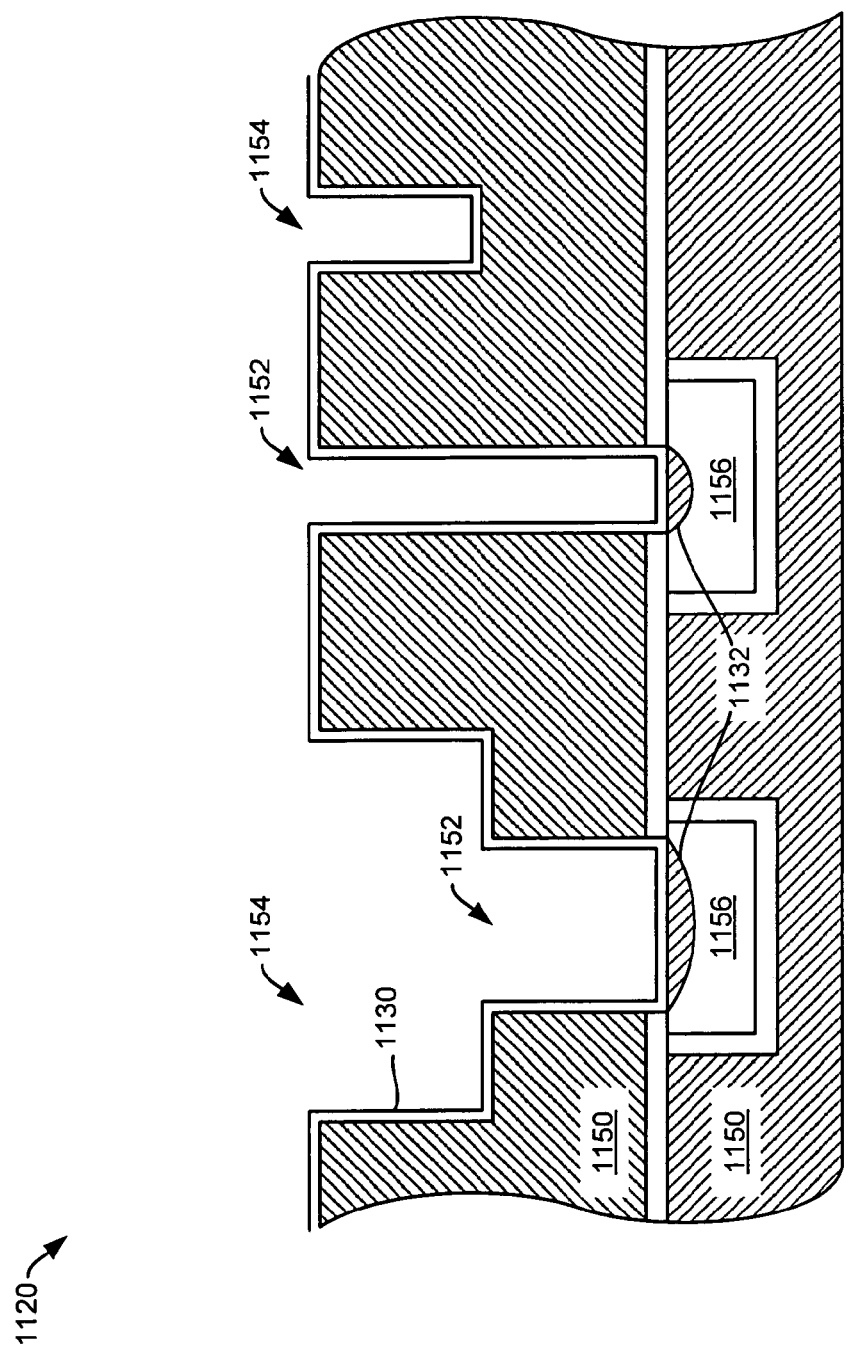

Electroless plating forms a metal alloy capping layer 1132 over the exposed copper surface at the bottom portions of the vias is effected through delivery of a multi-component plating chemistry to the substrate. FIG. 11E is the substrate 1120 following formation of the capping layer 1132, under an embodiment. Contamination and/or excess plating material is removed following the electroless plating and the sacrificial masking layer 1122 is removed using cleaning and/or etching solution(s) delivered to the substrate. Removal of the sacrificial masking layer 1122 removes material(s) 1124R such as copper, copper oxide, carbonaceous post etch residue, and/or other contamination removed from the bottom portions of the vias during removal 1104 of the copper oxide and other contamination. FIG. 11F is the substrate 1120 including the capping layer 1132 following removal of the masking layer 1122 and the contamination 1124 and 1124R, under an embodiment. As described above, other layers 1130 (e.g., barrier layer, copper seed layer) can then be formed on the substrate and/or the exposed material at the bottom portions of the vias 1152. FIG. 11G is the substrate 1120 following optional processing to form other layers 1130 (e.g. barrier layer is shown), under an embodiment.

The molecular self-assembly of an embodiment provides a method for forming a copper seed layer as described below. Copper interconnect technology relies on the use of a copper seed layer to act as the nucleation layer for subsequent copper bulk fill by electrochemical deposition or electroplating and serves to carry the plating current. The copper seed layer should be thin, conformal, continuous, and possess sufficient film purity to achieve good adhesion to the underlying barrier material (e.g., tantalum and its nitrides, ruthenium, tungsten and its nitrides, titanium nitride, tantalum carbon nitride, tungsten carbon nitride, etc.). Furthermore, the copper seed layer should not degrade the electrical performance (e.g. effective copper resistivity, EM resistance, stress migration resistance, etc.) of the interconnect structure. PVD techniques suffer from inadequate step coverage and/or poor film conformality which lead to void formation during electroplating and subsequent device reliability issues. CVD Cu techniques offer conformality, but suffer from impurity incorporation (e.g., F, Cl, C) which lead to poor adhesion and electrical performance (e.g., via resistance, EM resistance, stress migration resistance) as compared to PVD. In addition, nucleation issues make the formation of a thin continuous film of less than or about 200 Å difficult. ALD Cu suffers from similar impurity and nucleation issues as CVD Cu.

Figure 12:
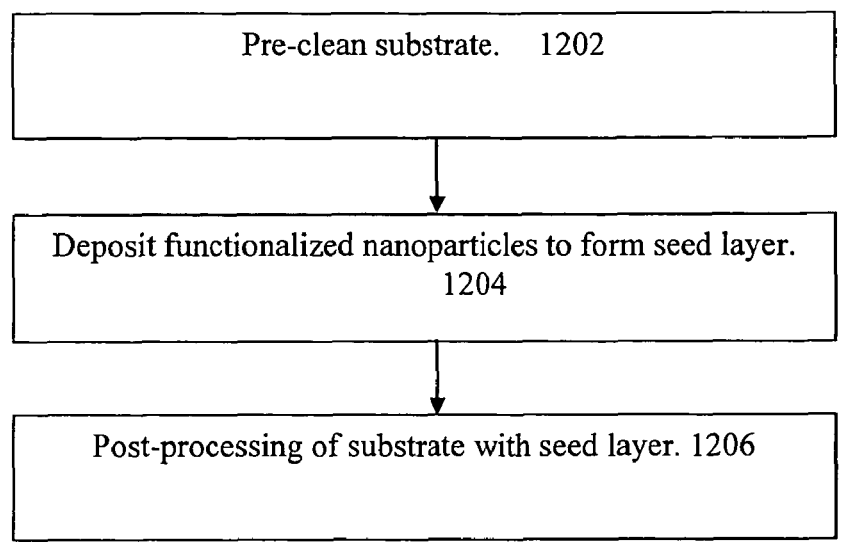
FIG. 12 is a flow diagram for seed layer formation using bifunctional molecular self-assembly, under an embodiment.

The molecular self-assembly of an embodiment provides a process for use in forming a copper seed layer. The copper seed layer can be formed using a bifunctional process, a monofunctional process, or an oxide process. FIG. 12 is a flow diagram for seed layer formation using bifunctional molecular self-assembly 1200, under an embodiment. The substrate is initially cleaned 1202 to remove any unwanted impurities such as organic and/or metallic contamination. Once the substrate is cleaned, the functionalized nanoparticles are deposited 1204 on the cleaned substrate. The functionalized nanoparticles are self-bonding to the substrate and represent the thickness target of the desired thin film. One or more post-processing treatment(s) 1206 are then performed on the substrate.

Figure 13:
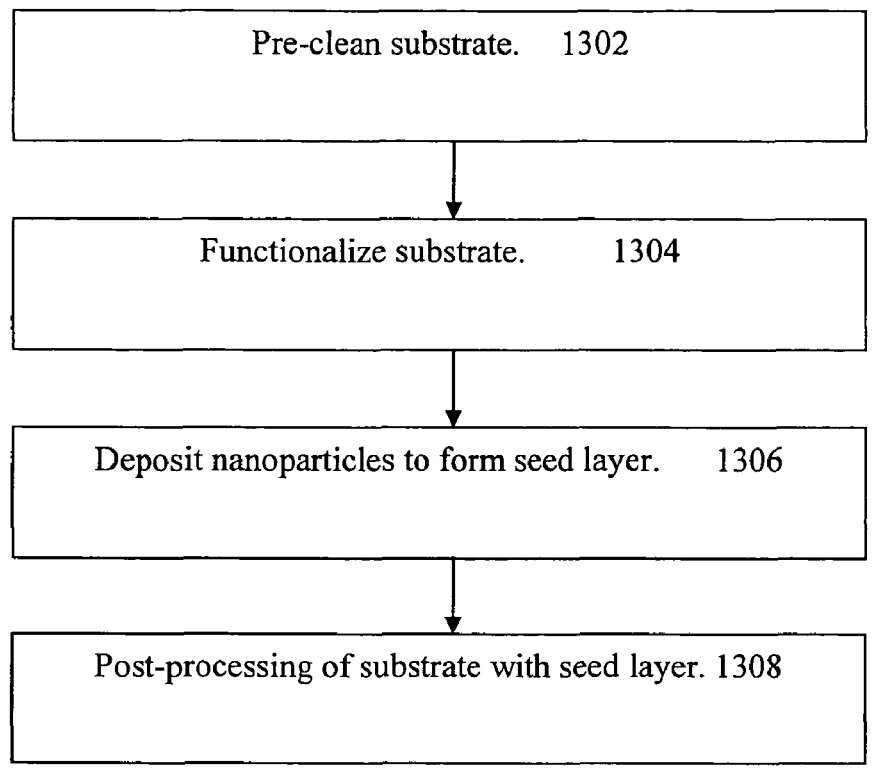
FIG. 13 is a flow diagram for seed layer formation using monofunctional molecular self-assembly, under an embodiment.

FIG. 13 is a flow diagram for seed layer formation using monofunctional molecular self-assembly 1300, under an embodiment. The substrate is initially cleaned 1302 to remove any unwanted impurities such as organic and/or metallic contamination. Once the substrate is cleaned, the substrate is functionalized 1304 as described above. The functionalization 1304 creates for example desired bonding sites for monofunctional copper and/or other nanoparticles. Copper nanoparticles representing the thickness target of the desired thin film are deposited 1306 on the substrate. One or more post-processing treatment(s) 1308 are then performed on the substrate.

Figure 14:
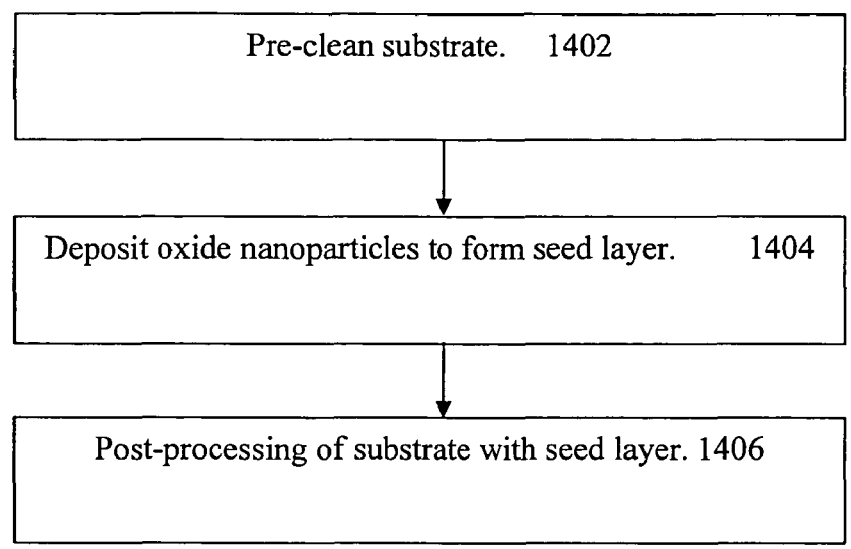
FIG. 14 is a flow diagram for seed layer formation using oxide particle molecular self-assembly, under an embodiment.
Figure 15:
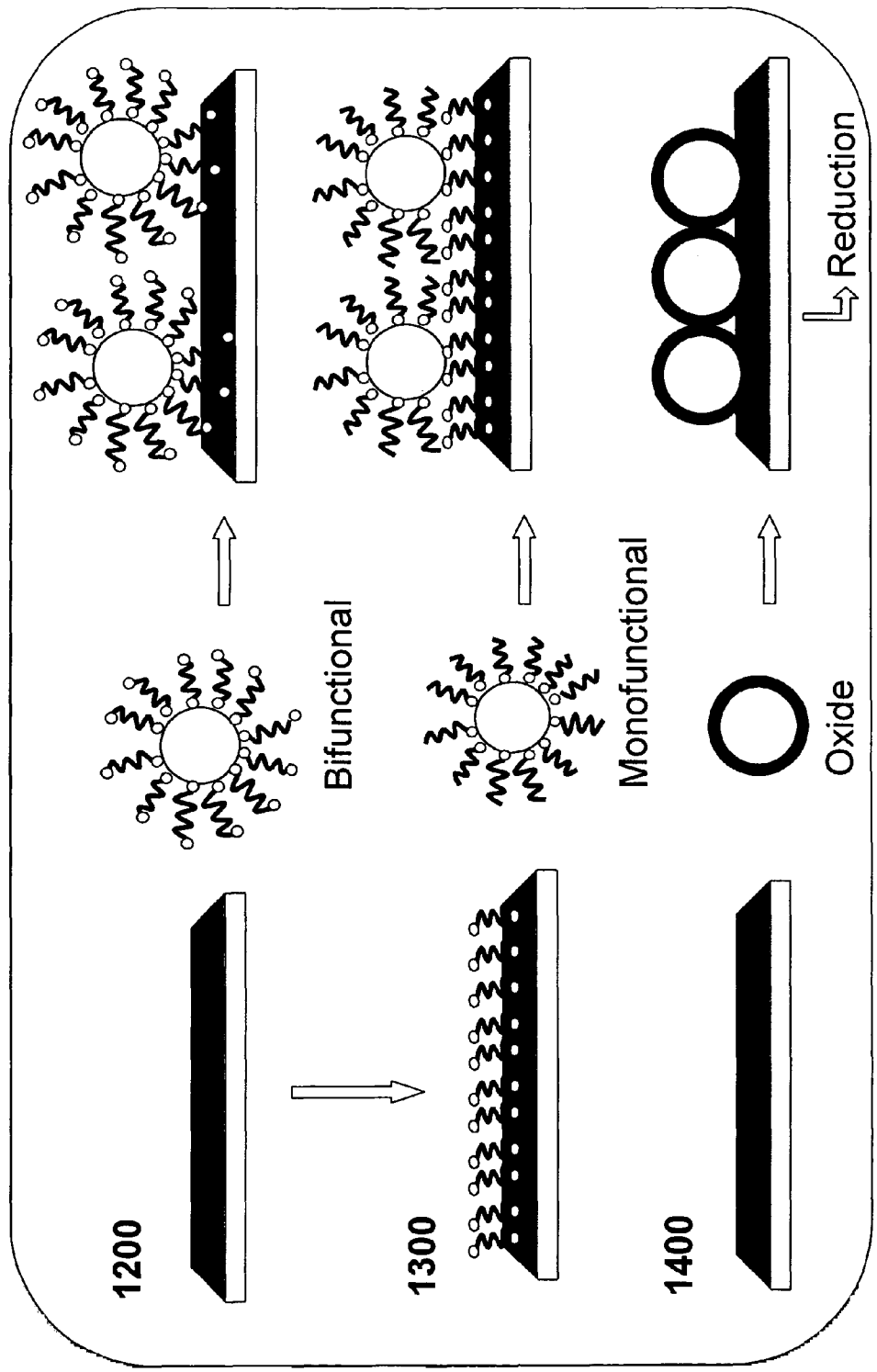
FIG. 15 shows example depictions of seed layer formation using bifunctional, monofunctional, and oxide particle molecular self-assembly, under an embodiment.

FIG. 14 is a flow diagram for seed layer formation using oxide particle molecular self-assembly 1400, under an embodiment. The substrate is initially cleaned 1402 to remove any unwanted impurities such as organic contamination. Once the substrate is cleaned, the oxide nanoparticles are deposited 1404 on the cleaned substrate. The oxide nanoparticles upon reduction are self-bonding to the substrate and represent the thickness target of the desired thin film. One or more post-processing treatment(s) 1406 are then performed on the substrate. FIG. 15 shows example depictions of seed layer formation using bifunctional 1200, monofunctional 1300, and oxide particle 1400 molecular self-assembly, under an embodiment.

Post processing (as it pertains to 1206, 1308, and/or 1406) in an embodiment serves as to coalesce the deposited copper containing nanoparticles and/or drive out any undesired species (e.g. OH species, NHx species, CHx species, carbonaceous species, etc.). In another embodiment, the post-processing can be further used to form a pure, solid, continuous copper film. The post processing (1206, 1308, and/or 1406) can include thermal treatment, UV treatment, IR treatment, electron treatment, ion treatment, x-ray treatment, and/or combinations thereof. Radiation can be chosen with the appropriate wavelength to match the size of the particles to maximize energy transfer and/or removal of undesired species. The treatment may be performed in a reducing (e.g. H containing, forming gas, etc.) and/or non-oxidizing, inert (e.g. Ar, He, N containing, etc.) ambient environment at, above, or below atmospheric pressure. For thermal and thermal related treatments, the size of the particles generally will allow coalescence of the nanoparticles at temperatures less than the melting point of the bulk material, nominally at less than or equal to approximately $\frac{2}{3}$ melting point of the bulk material, and more nominally at less than or equal to approximately $\frac{1}{2}$ the melting point of the bulk material. The smaller the particle size, generally the lower the temperature required to achieve particle coalescence.

The thickness of the deposited layer will be largely determined by the nominal size of the nanoparticle(s). By controlling the size and size distribution of the nanoparticles, the thickness of the resulting film can be controlled with sub-nanometer (e.g. angstrom) scale resolution. The process can also be repeated to increase film thickness in a layer by layer process with compositional control analogous to gas phase ALD type processes. Different nanoparticles can be used per layer and/or combinations of nanoparticle types can be used per layer to adjust film composition per stack and per composite stack. In such a fashion, this same approach can be used to deposit barrier layers (e.g. with tantalum containing nanoparticles, tantalum nitride containing nanoparticles, tungsten nitride containing nanoparticles, titanium nitride containing nanoparticles, etc.), adhesion layers (tantalum containing nanoparticles, ruthenium containing nanoparticles, cobalt containing nanoparticles, etc.), passivation layers, other seed layers (e.g. tungsten containing nanoparticles, ruthenium containing nanoparticles, platinum containing nanoparticles, palladium containing nanoparticles, nickel containing nanoparticles, titanium containing nanoparticles, aluminum containing nanoparticles, etc.), and combinations thereof.

As described above, the molecular self-assembly of an embodiment is performed using a MSAS, as described in the Related Applications referenced above. As such, and with reference to FIG. 1 and FIG. 3, each of the processes for forming a structure in a dielectric material, forming a MSAL on the dielectric material, forming a deposited barrier layer on the MSAL, and forming electrically conductive material on the MSAL and/or the deposited barrier layer can be implemented in a single or multiple processing modules. Additionally, each of the molecular self-assembly processes can be implemented in module(s) that are entirely different from, partly different from, or the same as module(s) used to implement, in whole or in part, one or both of the other of the molecular self-assembly processes. As will be understood from the description herein, the number and type of modules used, as well as whether process steps are performed in the same module can depend on the particular processes performed.

The molecular self-assembly described herein is implemented in a MSAS, as described above. Descriptions follow for several embodiments of an MSAS along with associated processes.

Figure 16:
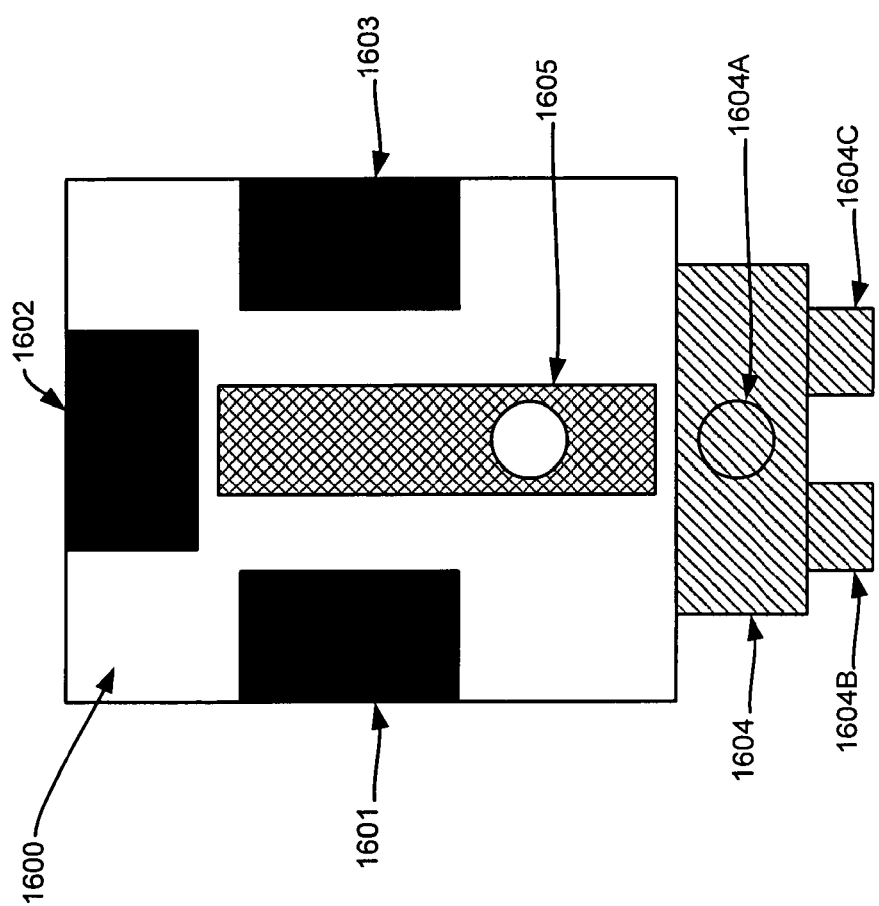
FIG. 16 is a substrate processing system using molecular self-assembly, under an embodiment.

FIG. 16 is a substrate processing system 1600 using molecular self-assembly, under an embodiment. The substrate processing system 1600 includes a pre-processing module 1601, a molecular self-assembly processing module 1602, and a post-processing module 1603. Each of the pre-processing 1601, molecular self-assembly processing 1602, and post-processing 1603 described above are implemented in a single module that is different from the modules used to implement the other of the pre-processing 1601, molecular self-assembly processing 1602, and post-processing 1603, but the embodiment is not so limited. For example, any of the modules 1601, 1602, and 1603 may include functions of the pre-processing, molecular self-assembly, and/or post-processing modules. The system 1600 is not required to include at least one of each of the preceding module types; for example, a particular process flow may include only the molecular self-assembly processing module 1602 and means for moving a substrate into and out of the system 1600. Also, functions of all of the pre-processing, molecular self-assembly, and post-processing modules may be embedded within a single module.

The modules 1601, 1602 and 1603 can each be implemented using apparatus (in particular, conventional commercial substrate processing apparatus) as appropriate to the types of substrate processing for which the modules 1601, 1602 and 1603 are to be used. The modules 1601, 1602, and 1603 may be implemented with modification(s) and/or addition(s) depending on the particular characteristics of the molecular self-assembly. For example, when the molecular self-assembly is used to process semiconductor wafers, the modules 1601, 1602 and 1603 are implemented using conventional commercial semiconductor wafer processing apparatus and methods.

Substrates enter and leave the system 1600 via a system interface 1604, also referred to as a factory interface 1604. A single substrate can be processed at one time in the system 1600 or multiple substrates can be processed at one time in a batch. The system interface 1604 includes a substrate handler 1604a (which can be implemented, for example, using a robot) that moves substrate(s) into and out of the system 1600. To facilitate moving substrates into and out of the system 1600, the system interface 1604 includes a substrate load station 1604b and a substrate unloading station 1604c (also referred to as a wafer cassette (FOUP) load station 1604b and a wafer cassette (FOUP) unload station 1604c, respectively).

After substrate(s) that have been processed are removed from the system 1600 and placed on the substrate unload station 1604c (for eventual movement to another location) by the substrate handler 1604a, new substrate(s) that have previously been placed on the substrate load station 1604b are taken from the substrate load station 1604b by the substrate handler 1604a and moved into the system 1600 for processing. The system interface 1604 (including the substrate handler 1604a, substrate load station 1604b and substrate unload station 1604c) can be implemented using conventional apparatus and methods known to those skilled in the art of processing substrates. For example, when the molecular self-assembly is used to process semiconductor wafers, the system interface 1604 can be implemented using conventional apparatus and methods known to those skilled in the art of processing semiconductor wafers to enable movement of a wafer and/or a cassette of wafers into and out of the semiconductor wafer processing system. The system 1600 of one or more alternative embodiments can include multiple system interfaces, each of which can be constructed and operate as described above.

Once in the system 1600, a substrate handling system 1605 can be used to move substrate(s) processed by the system 1600 between different modules 1601-1603 of the system 1600. Like the substrate handler 1604a of the system interface 1604, the substrate handling system 1605 can be implemented, for example, using one or more robots. If the modules 1601, 1602 and 1603 include both wet and dry processing modules, then the substrate handling system 1605 includes at least two types of apparatus: a dry substrate handler for moving substrate(s) into and out of dry processing modules and the system interface 1604 and out of a drying module, and a wet substrate handler for moving substrate(s) into and out of wet processing modules and into a drying module. The substrate handling system 1605 can be implemented using apparatus and methods known to those skilled in the art of processing substrates. For example, when the molecular self-assembly is used to process semiconductor wafers, the substrate handling system 1605 can be implemented using conventional apparatus and methods known to those skilled in the art of processing semiconductor wafers to enable movement of a wafer and/or a cassette of wafers between different modules of the semiconductor wafer processing system.

Other than when substrate(s) are being moved into or out of the system 1600 through the system interface 1604, the system 1600 is sealed from the external environment. Depending on the processing to be performed by the system 1600, the environment within the system 1600 that is outside of the pre-processing module 1601, molecular self-assembly processing module 1602, and post-processing module 1603 (for convenience, sometimes referred to hereinafter as the "system environment") can be maintained at atmospheric pressure, held at a vacuum pressure, and/or pressurized (i.e., held at a pressure above atmospheric pressure). Similarly, the system environment can be maintained at the ambient temperature of the environment outside of the system 1600, or at a temperature that is higher or lower than that ambient temperature.

Further, the gaseous composition of the system environment can be controlled as desired. For example, the system environment can be ambient air (typically, controlled to reduce contamination from the external environment). The system environment can also be controlled to include, in whole or in part, a specified gas or gases, e.g., in a system used to process semiconductor wafers, the system environment can be controlled to be nitrogen or an inert gas. The system environment can also be controlled to exclude a specified gas or gases, e.g., oxygen can be excluded from the system environment to reduce the occurrence of oxidation of substrate(s) (or material(s) formed thereon) processed in the system.

Figure 17:
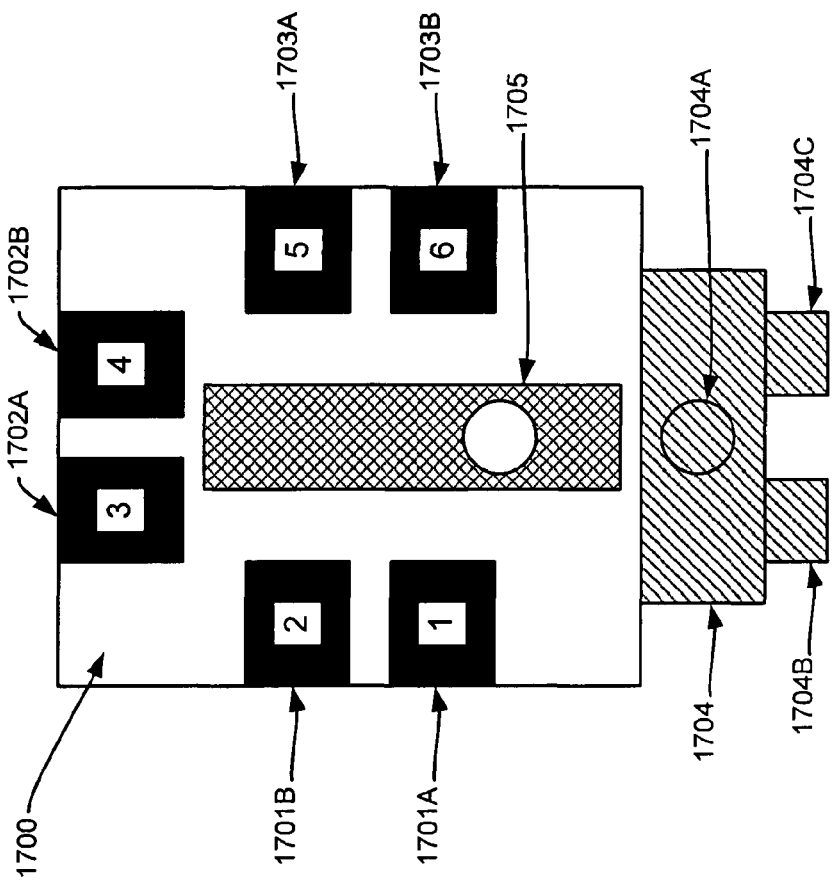
FIG. 17 is a substrate processing system using molecular self-assembly, under an alternative embodiment.

FIG. 17 is a substrate processing system 1700 using molecular self-assembly, under an alternative embodiment. The system 1700 includes a system interface 1704. The system interface 1704 of an embodiment includes but is not limited to a substrate handler 1704a, substrate load station 1704b and a substrate unload station 1704c for moving substrate(s) into and out of the system 1700. The system 1700 includes a substrate handling system 1705 for moving substrate(s) processed by the system 1700 between different modules of the system 1700. Each of the system interface 1704, substrate handler 1704a, substrate load station 1704b, substrate unload station 1704c and substrate handling system 1705 can be implemented and operate as described above for the corresponding components of the system 1600 (FIG. 16). Additionally, the system environment described above with respect to the system 1600 applies to the system environment of the system 1700.

The substrate processing system 1700 includes two pre-processing modules 1701a and 1701b, two molecular self-assembly processing modules 1702a and 1702b, and two post-processing modules 1703a and 1703b, but is not so limited. Alternative embodiments of system 1700 can include any number of each of the pre-processing modules 1701a and 1701b, molecular self-assembly processing modules 1702a and 1702b, and post-processing modules 1703a and 1703b.

As described above, in substrate processing according to the molecular self-assembly, pre-processing can include both wet processing and dry processing. In the system 1700, the pre-processing modules 1701a and 1701b can be dry and wet processing modules, respectively, for performing pre-processing of substrates (e.g., pre-processing module 1701a includes a plasma (dry) surface preparation module, and pre-processing module 1701b includes a wet clean/surface preparation module). Any of the wet pre-processing and dry pre-processing described above can be performed in the modules 1701a and 1701b. The pre-processing modules 1701a and 1701b of various alternative embodiments can include an pre-processing processes.

The molecular self-assembly processing modules 1702a and 1702b can include, for example, a module 1702a for forming self-assembled molecular material (e.g., self-assembly growth module) and a module 1702b for performing subsequent processing that functionalizes that material (e.g., functionalization module). Any of the types of molecular self-assembly and subsequent functionalization described above can be performed in the modules 1702a and 1702b. The molecular self-assembly processing modules 1702a and 1702b of various alternative embodiments can include any self-assembly processes.

The post-processing modules 1703a and 1703b can include, for example, a module 1703a for cleaning the substrate after forming material using molecular self-assembly (e.g., post-processing clean module) and a module 1703b for annealing and/or vaporizing that material (e.g., post-processing anneal/vaporization module). Any of the types of cleaning, annealing and vaporizing described above can be performed in the modules 1703a and 1703b. The post-processing modules 1703a and 1703b of various alternative embodiments can include any post-processing processes.

Figure 18:
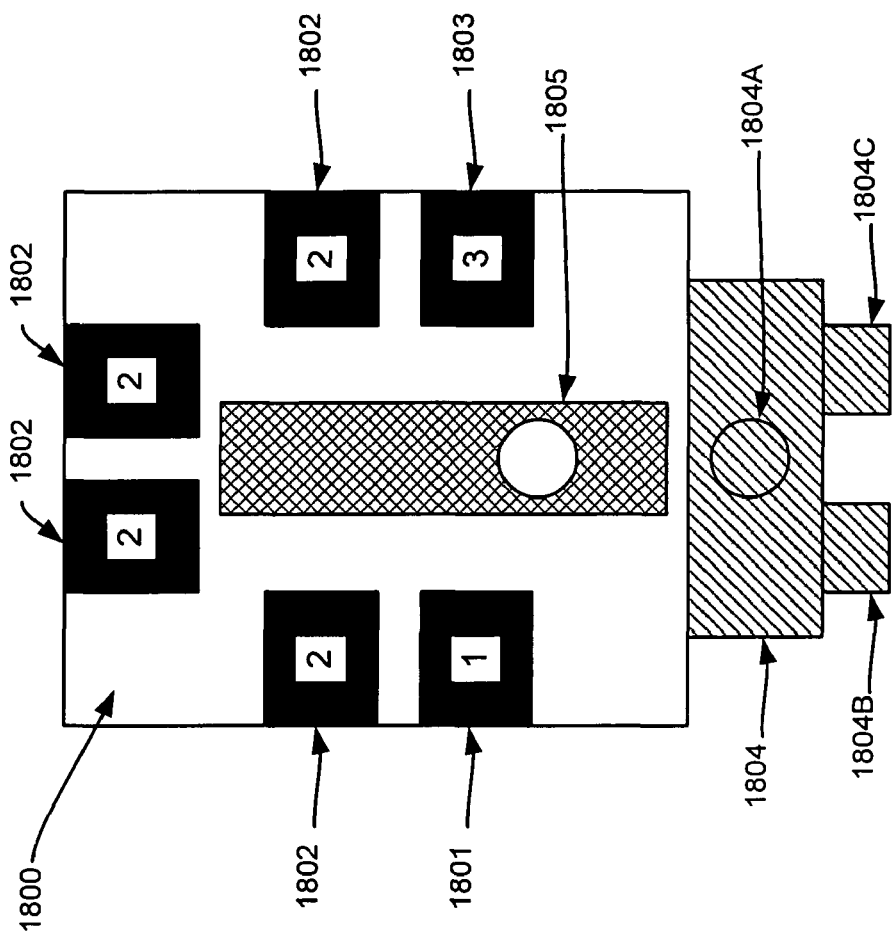
FIG. 18 is a substrate processing system using molecular self-assembly, under another alternative embodiment.

FIG. 18 is a substrate processing system 1800 using molecular self-assembly, under another alternative embodiment. The substrate processing system 1800 includes one pre-processing module 1801 (e.g., plasma (dry) surface preparation module), four molecular self-assembly processing modules 1802, and one post-processing module 1803. The system 1800 of alternative embodiments can include any number, type, and/or combination of modules.

The pre-processing module 1801 of an embodiment can include a plasma (dry) surface preparation module, but is not so limited. However, any of the wet pre-processing and dry pre-processing described herein can be performed in the pre-processing module 1801.

The molecular self-assembly processing modules 1802 can include, for example, a wet clean/surface preparation module, a module for forming self-assembled molecular material (e.g., self-assembly growth module), a module for performing subsequent processing that functionalizes that material (e.g., functionalization module), and a module for cleaning the substrate after forming material using molecular self-assembly (e.g., post-processing clean module).

The post-processing module 1803 can include, for example, a module 1803 for annealing and/or vaporizing that material (e.g., post-processing anneal/vaporization module). Any of the types of cleaning, annealing and vaporizing described herein can be performed in the module 1803.

The system 1800 also includes a system interface 1804, which, in turn, includes a substrate handler 1804a, substrate load station 1804b and a substrate unload station 1804c for moving substrate(s) into and out of the system 1800. The system 1800 includes a substrate handling system 1805 for moving substrate(s) processed by the system 1800 between different modules of the system 1800. Each of the system interface 1804, substrate handler 1804a, substrate load station 1804b, substrate unload station 1804c and substrate handling system 1805 can be implemented and operate as described above for the corresponding components of the system 1600 (FIG. 16). Additionally, the description above of the system environment for the system 1600 also applies to the system environment of the system 1800.

Like the substrate processing system 1600 described above, the substrate processing system 1800 includes three processing modules 1801, 1802 and 1803. However, to illustrate that different types of processing steps can be performed in the same module, the module 1802 of system 1800 is shown four times, one for each type of processing that takes place in that module. For example, the module 1802 can be used to perform the types of processing that, in system 1700, take place in the four separate modules 1701b, 1702a, 1702b and 1703a, i.e., wet pre-processing, molecular self-assembly, functionalization of molecularly self-assembled material and post-processing cleaning, respectively. The system 1800 can take advantage of the capability of commercial substrate processing apparatus and methods to rapidly change from one process chemistry to another in a module to facilitate the use of a single processing module for the performance of different types of process steps. In particular, in a substrate processing method including molecular self-assembly, multiple processing steps and multiple types of processing can be performed in the same processing chamber. In general, any number and combination of processes can be performed in a single processing chamber under the embodiments described herein. A spin processor coupling a chemistry dispense mechanism with substrate rotation is an example of such a processing chamber. The chemistry can be provided via a single dispense, a multi-port dispense, a spray dispense, and combinations thereof. Substrate rotation assists in uniform application of the process chemistries and can be used to dry the substrate.

In describing the substrate processing systems 1600, 1700 and 1800, it has been assumed that a single wafer or a single batch of wafers is processed at one time. However, each of the substrate processing systems 1600, 1700 and 1800 can be modified to include a multiplicity of each of the types of modules used to process a single wafer or single batch of wafers, i.e., multiple versions of a substrate processing system in accordance with the invention can operate in parallel as a single system. This can be desirable to improve the throughput of substrates processed by a substrate processing system. This can also be desirable to add redundancy in the substrate processing system so that system availability can be maintained even when one or more of the modules of the system are rendered non-operational for a period of time (e.g., for preventative maintenance or repair).

The molecular self-assembly systems described above are presented as examples, and systems including other numbers of processing modules can be used. Furthermore, types of processing modules other than those described above can be used. Manual loading and unloading of substrate(s) may be used in some processing systems instead of a substrate handler for moving substrate(s) into and out of the system.

The molecular self-assembly systems and methods described above can be used to form a masking layer on a dielectric region to facilitate forming of a capping layer on electrically conductive regions separated by the dielectric region, as described in the Related Applications. The capping layer inhibits electromigration in the electrically conductive regions (and, in some cases, enhances inhibition of diffusion of material from the electrically conductive regions). As an example, the MSAS of an embodiment forms a masking layer on one or more dielectric regions of a substrate, where the substrate includes (i.e., as part of, or having formed on and/or in) electrically conductive regions separated by the dielectric region(s) (such a substrate is sometimes referred to herein as an "electronic device"). The electrically conductive regions can be electrical interconnections between electrical elements (e.g., transistors, capacitors, resistors) of the electronic device.

The masking layer can be formed selectively on the dielectric region so that no or negligible masking layer material is formed on the electrically conductive regions. Alternatively, the masking layer can be formed non-selectively on both the dielectric regions and the electrically conductive regions, and masking layer material formed on the electrically conductive regions subsequently removed.

As used herein, a "capping layer" (also sometimes referred to as a "self-aligned barrier layer") is a layer of material formed on electrically conductive regions of an electronic device (e.g., after planarization of the top of the electrically conductive regions) to inhibit electromigration in the electrically conductive regions. In particular, the capping layer inhibits electromigration in the electrically conductive regions better than a dielectric barrier layer that would otherwise be formed on the electrically conductive regions. Additionally, in some cases, a capping layer may inhibit diffusion of material from the electrically conductive regions and, in particular, may inhibit such diffusion to an extent that enables elimination, or reduction of the thickness, of a dielectric barrier layer that would otherwise be formed on the capping layer.

The capping layer can be formed selectively on the electrically conductive regions so that no or negligible capping layer material is formed on the masking layer. In particular, the material(s) and/or one or more process used to form the masking layer and/or the capping layer can be tailored to inhibit formation of capping layer material on the masking layer, thus fostering the selective formation of the capping layer on the electrically conductive regions. Alternatively, the capping layer can be formed non-selectively on both the electrically conductive regions and the masking layer, and capping layer material formed on the masking layer subsequently removed (this can be done, for example, by removing some or all of the masking layer and, with it, capping layer material formed thereon).

The MSAS of an embodiment includes forming the masking layer or capping layer with any degree of selectivity. As indicated above, "selective" formation of a material on a region or surface means that the material forms on that region or surface with better coverage of the region or surface than that with which the material forms on other region(s) or surface(s). In any embodiment of the MSAS, masking layer material formed on electrically conductive regions or capping layer material formed on the masking layer can be removed if deemed necessary or desirable. However, as discussed further below, removal of masking layer material formed on electrically conductive regions or capping layer material formed on the masking layer may not be necessary in some cases, e.g., when negligible amounts of masking layer material are formed on electrically conductive regions or negligible amounts of capping layer material are formed on the masking layer, such as may be the case when the masking layer is formed selectively on the dielectric regions or the capping layer is formed selectively on electrically conductive regions, respectively.

The MSAS of an embodiment inhibits capping layer material from being formed on the masking layer over the dielectric region (in addition to the inhibition of formation of capping layer material on or in the dielectric region, due to the presence of the masking layer on the dielectric region). Consequently, unlike previous approaches to forming a capping layer in which a layer of electrically conductive material (e.g., a cobalt alloy, nickel alloy or tungsten) is selectively deposited on electrically conductive regions, the MSAS prevents the occurrence of unacceptable current leakage between electrically conductive regions when electrically conductive material is used to form the capping layer. Since the MSAS inhibits formation of capping layer material over, on or in the dielectric region, the MSAS enables a great deal of flexibility in the selection of material(s) and/or one or more process for forming the capping layer, without regard for the selectivity of the capping layer material for the electrically conductive regions vis-à-vis the dielectric region (and, in some embodiments, without regard for the selectivity of the capping layer material for any material).

The MSAS thus enables, for example, the use of material(s) and/or process(es) and/or process regime(s) in the formation of the capping layer that would otherwise be undesirable due to a lack of sufficient selectivity. This serves to widen the material choices and/or process(es) and/or process regime(s) available for effecting other desired attributes. For example, the material and/or processes used to form the capping layer can be chosen to enhance adhesion of the capping layer to the electrically conductive regions (thus improving inhibition by the capping layer of electromigration in the electrically conductive regions). The materials and/or processes used to form the capping layer can also be chosen to produce a capping layer that does not unacceptably or undesirably increase resistance in the electrically conductive regions; for example, the capping layer can be formed without replacing any of the material of the electrically conductive regions with capping layer material having a higher resistivity. The materials and/or processes used to form the capping layer can also be chosen so that very little poisoning (undesired diffusion of constituents into and/or adverse modifications) of the electrically conductive regions occurs. Poisoning can lead to undesirable changes in electrical characteristics such as an increase in resistance of the electrically conductive regions. In yet another embodiment, the materials and/or processes used to form the capping layer can be chosen to protect the underlying electrically conductive regions from moisture containing environments, oxygen containing environments, oxidizing environments, and the like.

Additionally or alternatively, the materials and/or processes used to form the capping layer can be chosen to produce a capping layer that is sufficiently effective in inhibiting diffusion of material used to form the electrically conductive regions (e.g., copper) so that a dielectric barrier layer can be eliminated from the electronic device or, at least, reduced in thickness (with attendant decrease in capacitance and associated benefits). Further, since the masking layer inhibits formation of capping layer material in the dielectric region, the MSAS facilitates the use of porous dielectric materials that are increasingly deemed desirable for use in electronic devices. Additionally, the MSAS enables production of a thermally stable capping layer on copper so that the capping layer remains continuous and defect-free (i.e., having sufficiently few defects according to one or more criteria) under typical operating conditions of many electronic devices.

Figure 19:
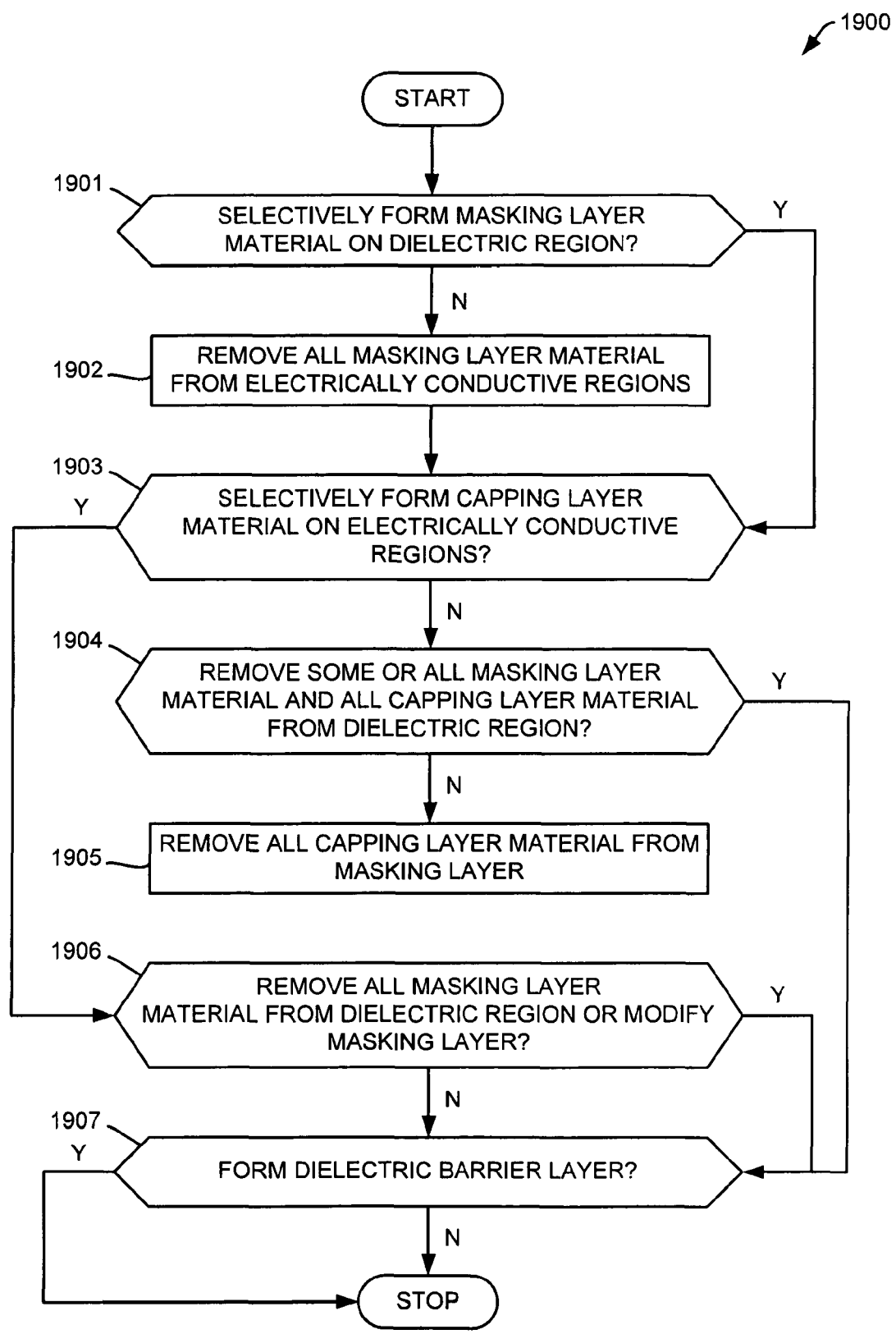
FIG. 19 is a flow diagram for using a molecular self-assembly system (MSAS) to form or produce a capping layer on electrically conductive regions separated by a dielectric region, under an embodiment.

FIG. 19 is a flow diagram for using the MSAS to form or produce 1900 a capping layer on electrically conductive regions separated by a dielectric region, under an embodiment. A masking layer is formed 1901 and 1902 on the electronic device so that the masking layer is formed on the dielectric region, but not the electrically conductive regions. After formation of the masking layer, a capping layer is formed 1903, 1904, 1905, and 1906 on the electronic device. Optionally, a dielectric barrier layer can be formed 1907 on the electronic device, depending on the properties of the capping layer, as discussed further below.

The capping layer of an embodiment is formed on the electrically conductive regions but not on or in the dielectric region or the masking layer. The presence of the masking layer inhibits formation of capping layer material on or in the dielectric region that may otherwise have occurred without the masking layer. Consequently, the capping layer produced 1900 forms capping layer material only on the electrically conductive regions (no or negligible capping layer material is formed over, on or in a dielectric region separating electrically conductive regions). This selective capping layer production 1900 therefore reduces or eliminates unacceptable current leakage between electrically conductive regions of the substrate.

FIGS. 20A through 20E show cross-sectional views of an electronic device 2000 undergoing formation of a capping layer 2040 on electrically conductive regions 2010 separated by a dielectric region 2020, under the molecular self-assembly of an embodiment. The electrically conductive regions 2010 can be interconnections between electrical elements of the electronic device, such as, for example, transistors, capacitors and resistors. The dielectric region 2020 is illustrated with a hard mask layer 2020a formed as a top part of the dielectric region 2020, as is commonly the case in current electronic devices; however, the dielectric region 2020 need not necessarily include the hard mask layer 2020a. As described herein, the method 1900 can produce a capping layer in accordance with various alternative embodiments not shown. In particular, due to imperfect selectivity or non-selectivity of the formation of the masking layer 2050, masking layer material can be formed on the electrically conductive regions 2010 that is subsequently removed prior to forming the capping layer 2040. However, the formation of the masking layer 2050 may also be accomplished with greater selectivity i) so that no masking layer material is formed on the electrically conductive regions 2010 (in that case, the intermediate structure shown in FIG. 20A would not occur) or ii) so that a negligible amount of masking layer material is formed on the electrically conductive regions 2010 that need not necessarily be removed from the electrically conductive regions 2010 (in that case, the intermediate structure shown in FIG. 20B would not occur and the subsequently formed structures shown in further figures would include the negligible amount of masking layer material formed on the electrically conductive regions 2010).

Generally, a masking layer 2050 is formed non-selectively on both the dielectric region 2020 and the electrically conductive regions 2010. The masking layer material is removed from the electrically conductive regions 2010, and capping layer material is formed selectively on the electrically conductive regions 2010. The masking layer material is removed from the dielectric region 2020, and a dielectric barrier layer 2030 is formed over the capping layer 2040 and dielectric region 2020.

Prior to forming a masking layer in accordance with the embodiments described herein, the exposed surfaces of the electrically conductive regions and the exposed surface of the dielectric region are prepared for processing as described elsewhere herein. This surface preparation includes at least one or more cleaning steps (e.g., a deionized water rinse and/or any of a variety of other well-known surface cleaning step(s)) to remove contaminants left from previous processing. In particular, a low-pH solution chemistry can be used to remove copper oxides and a high pH solution chemistry can be used to remove post CMP residue(s).

The surface preparation can include other processing steps as well. For example, the exposed surfaces of the electrically conductive regions and/or the exposed surface of the dielectric region can be functionalized to facilitate selective formation of the masking layer. In particular, the surface of the dielectric region can be functionalized to promote formation of the masking layer and the exposed surfaces of the electrically conductive regions can be functionalized to inhibit formation of the masking layer. Similarly, the exposed surfaces of the electrically conductive regions and/or the exposed surface of the dielectric region can also be functionalized to facilitate selective formation of the capping layer. In particular, the surface of the dielectric region can be functionalized to inhibit formation of the capping layer (though the use of a masking layer in accordance with the molecular self-assembly described herein may render this unnecessary or, at least, of greatly reduced importance) and the exposed surfaces of the electrically conductive regions can be functionalized to promote adhesion of the capping layer.

In general, the particular manner in which the surfaces of the electrically conductive regions and/or the surface of the dielectric region are functionalized depends on the nature of the materials used to form the electrically conductive regions, the dielectric region and the masking layer, and the desired properties to be produced (e.g., passivation, promotion of material formation). For example, a dielectric region formed of a silicon dioxide-based dielectric material can be functionalized to produce a large number of hydroxyl groups at the surface of the dielectric region to which a self-assembled monolayer has an affinity for attachment, thus promoting formation of the masking layer on the dielectric region. Additionally, a molecule used to form a molecularly self-assembled layer can be established to include a head group that covalently bonds with an exposed hydroxyl group of the material used to form a dielectric region.

With reference to FIG. 19, a masking layer is formed 1901 and 1902 on an electronic device so that the masking layer is formed on a dielectric region of the electronic device, but not on the electrically conductive regions of the electronic device that are separated by the dielectric region. The masking layer can be formed 1901 selectively on the dielectric region or the masking layer can be formed non-selectively on both the dielectric region and the electrically conductive regions. Selective formation of a masking layer on a dielectric region encompasses negligible formation of masking layer material on the electrically conductive regions, i.e., masking layer material coverage that does not impair performance of a method according to the molecular self-assembly or the functionality of an electronic device produced using molecular self-assembly.

Non-selective formation of a masking layer on both the dielectric region and the electrically conductive regions encompasses formation of the masking layer with no preference for the dielectric region or electrically conductive regions, with some degree of preference for the electrically conductive regions, or with preference for the dielectric region that is inadequate to result in the formation of no or negligible masking layer material on the electrically conductive regions. When the masking layer is formed non-selectively on the dielectric region and the electrically conductive regions, all masking layer material formed on the electrically conductive regions is subsequently removed 1902. Removal of all masking layer material formed on the electrically conductive regions encompasses leaving negligible masking layer material formed on the electrically conductive regions. Referring again to the electronic device 2000, non-selective formation of a masking layer 2050 on both the dielectric region 2020 and the electrically conductive regions 2010 is followed by removal of all masking layer material formed on the electrically conductive regions 2010, leaving the masking layer 2050 formed only on the dielectric region 2020.

In general, the masking layer can be formed using any number, type, and/or combination of materials and processes that form a masking layer. The masking layer can be formed using either wet processing (e.g., immersion of a substrate in a chemical bath, spraying or spinning of chemical fluid on to a substrate) or dry processing (e.g., vapor deposition). If wet processing is used, a rinsing process may be used afterwards to clean the electronic device, which is then followed by a drying process. Additionally, if wet processing is used, vibration of specified amplitude and/or frequency (e.g., high frequency vibration, such as ultrasonic or megasonic vibration) can be imparted to the electronic device during the processing to facilitate (e.g., speed up) the processing. The masking layer can be deposited or grown on the dielectric region. The masking layer can also be formed by stamping.

The masking layer of an embodiment is formed comprising an electrically insulative (effectively non-conductive) material, since the masking layer is formed in regions that, in the finished electronic device, are electrically non-conductive. However, in embodiments in which the masking layer is completely removed from the electronic device (e.g., FIG. 20D), the masking layer can be formed of an electrically conductive or semiconductor material.

After formation of the masking layer, the masking layer can be functionalized or otherwise modified (e.g., chemically, thermally and/or photo-chemically modified) in a desired manner to produce desired properties (e.g., to produce a desired propensity for formation on the masking layer of material to subsequently be formed on the electronic device, such as a capping layer or a dielectric barrier layer, or to enable some or all of the masking layer to be removed after formation of the capping layer so that capping layer material formed on the masking layer can be removed).

The masking layer can be, for example, a molecularly self-assembled layer, which can be formed as a monolayer (e.g. SAM) or a multilayer, and can be formed of organic and/or inorganic material. A molecularly self-assembled layer can be produced by forming (e.g., depositing or growing) additional material on the surface of the dielectric region, or by chemically activating or modifying the material of the dielectric region to produce a new distinct layer of material. The ability to tailor the molecule type, head group, terminal group and/or chain length of a molecularly self-assembled layer as described above provides flexibility in establishing the characteristics of a masking layer, which can be used to produce desired masking layer properties, as described herein. The masking layer can also be, for example, a layer formed from any class of materials known to form with controlled film thickness, such as, for instance, multi-layer polyelectrolytes. The masking layer can also be, for example, a layer formed on the surface of the dielectric region through the catalytic growth of inorganic or organic materials. The masking layer can also be, for example, a layer formed from dendrimers, hyper-branched polymers, and/or block co-polymers as described above. The masking layer can also be, for example, an ionic or electrochemically-enhanced self-assembled multilayer or monolayer.

The characteristics of a masking layer formed using the molecular self-assembly can be established to produce desired properties of the masking layer as described above. For example, the type of molecule(s) used to form a molecularly self-assembled layer can be chosen, and the characteristics of the molecule, such as the head group, terminal group and/or length, can be established to produce desired properties of the molecularly self-assembled layer. The particular manner in which the characteristics of a masking layer are tailored include for example one or more of the properties of the dielectric region, the necessity or desirability of avoiding formation of masking layer material on the electrically conductive regions, the characteristics of the materials and/or processes used to form the capping layer, and/or the characteristics of the materials and/or processes used to subsequently form material on the masking layer, but are not so limited.

As further examples, the materials and/or processes used to form the masking layer can be selected to facilitate achievement of one or more of the following properties: high selectivity for the dielectric region; high selectivity for a SiCOH dielectric material; high selectivity for a silicon-based hard mask layer; adheres to a dielectric barrier layer (commonly formed of a composition including silicon together with carbon and/or nitrogen, i.e., $SiC_x$, $SiN_x$, $SiC_xN_y$) or other material to be subsequently formed on the masking layer; provides a good barrier to diffusion of the capping layer material (e.g., a cobalt alloy, such as a cobalt-tungsten-phosphorous alloy), both during production of the capping layer and during operation of the finished electronic device (if the masking layer is left as part of the finished electronic device); facilitates removal of some or all of the masking layer (and, with it, any capping layer material that may have been formed thereon), e.g., that produce a terminal group of a molecularly self-assembled layer that can be cleaved from the rest of the molecularly self-assembled layer or that produce an organic backbone of a molecularly self-assembled layer that can be broken down and removed; produces a continuous and defect-free layer and that, if to be left as part of the electronic device, remains so even when subjected to the thermal and chemical environment associated with further processing to produce the electronic device and/or operation of the finished electronic device; enables rapid (e.g., less than about 60 seconds) production of a masking layer.

As one example, silane-based materials can be used to form a masking layer in one or more embodiments of the molecular self-assembly. For example, it is known that a silane with one or more hydrolysable substituents of the general formula $R_nSiX_{4-n}$ (where R can be, for example, alkyl, substituted alkyl, aryl or substituted aryl, and X can be, for example, halo, alkoxy, aryloxy or amino) can form a SAM that can exhibit strong covalent or non-covalent attachment to particular surfaces. Typically, SAM surface attachment is enhanced on a surface having a relatively high density of acidic functionalities such as hydroxyl or hydroxysilyl groups. Silicon-based material surfaces such as $SiO_2$, SiOH and SiOC surfaces possess relatively high densities of hydroxyl groups. Thus, a silane-based SAM can be expected to form with greater adhesion to a surface of a silicon-based material (of which a dielectric region is commonly formed) than to a surface of a metallic material (of which electrically conductive regions are commonly formed).

Furthermore, a silane-based SAM can also be tailored to reversibly adhere to a surface depending on the nature and substitution of a silane precursor material. For example, silicon-based SAM precursors with a single hydrolysable substituent (e.g., of the general formula $R^1R^2R^3SiX$) are known to produce a SAM that can be formed on, and reversibly detached from, a functionalized surface (e.g., a surface having a relatively high density of acidic functionalities) under specific reaction conditions. Silanization of surfaces is discussed in detail in, for example, *Silanes, Surfaces and Interfaces* (*Chemically Modified Surfaces*, Vol. 1), edited by Donald E. Leyden, Gordon & Breach Science Publishers, 1986.

With reference to FIG. 19, subsequent to forming 1901 and 1902 the masking layer the molecular self-assembly of an embodiment forms 1903, 1904, 1905, and 1906 a capping layer on the electronic device. The capping layer is formed on the electrically conductive regions, but not on or in the masking layer and/or the dielectric region. The capping layer can be formed 1903 selectively on the electrically conductive regions or the capping layer can be formed non-selectively on both the masking layer and the electrically conductive regions. Selective formation of a capping layer on electrically conductive regions encompasses negligible formation of capping layer material on or in the masking layer and/or dielectric region. Non-selective formation of a capping layer on both the masking layer and the electrically conductive regions encompasses formation of the capping layer with no preference for the electrically conductive regions or masking layer, with some degree of preference for the masking layer, or with preference for the electrically conductive regions that is inadequate to result in the formation of no or negligible capping layer material on or in the masking layer and/or dielectric region.

When the capping layer is formed non-selectively on the masking layer and the electrically conductive regions, all capping layer material formed on the masking layer is subsequently removed 1904 and 1905. Referring again to FIG. 20C, the electronic device 2000 includes selective formation of a capping layer 2040 on the electrically conductive regions 2010; non-selective formation of a capping layer on the masking layer and the electrically conductive regions, followed by removal of all capping layer material formed on the masking layer is further described in the Related Applications.

The capping layer is generally formed using any of a number, type, and/or combination of materials and processes as appropriate to the electronic device (e.g., that inhibits electromigration in electrically conductive regions on which the capping layer is formed, that inhibits diffusion of material from electrically conductive regions on which the capping layer is formed). The capping layer can be formed of an electrically conductive, semiconductor or electrically insulative (effectively non-conductive) material. For example, materials (e.g., cobalt alloys, such as an alloy of cobalt, tungsten and phosphorous or an alloy of cobalt and boron; nickel alloys, such as an alloy of nickel, molybdenum and phosphorous; tungsten; tantalum; tantalum nitride, etc.) and processes (e.g., electroless deposition; chemical vapor deposition; physical vapor deposition (sputtering); atomic layer deposition; etc.) that have previously been used to selectively deposit a capping layer on electrically conductive regions of a semiconductor device can be used. The capping layer can be functionalized but is not so limited.

The presence of the masking layer prevents formation of capping layer material on or in (through diffusion) the dielectric region, thus enforcing good selectivity of the capping layer material for the electrically conductive regions compared with the dielectric region regardless of the selectivity otherwise associated with the material(s) and process(es) used to form the capping layer. Thus, the molecular self-assembly described herein provides increased flexibility in the materials and processes that can be used to form the capping layer. For example, the molecular self-assembly enables use of materials and processes for depositing an electrically conductive material to form a capping layer that have previously been inadequate to form a capping layer without producing unacceptable current leakage between electrically conductive regions, but that are effective in inhibiting electromigration because of good adhesion to electrically conductive regions.

Additionally, since the presence of the masking layer enables production of a capping layer by forming additional material on an electrically conductive region, there is no need to create a capping layer by chemically modifying a top part of the electrically conductive region. Thus, the undesirable increase in resistance in the electrically conductive region that is associated with creation of a capping layer in that manner is avoided using the molecular self-assembly described herein.

As described above with reference to FIGS. 19 and 20, when the capping layer is formed non-selectively on both the masking layer and the electrically conductive regions, all capping layer material formed on the masking layer is subsequently removed 1904 and 1905 so that no (or negligible) capping layer material is present over the dielectric region. This reduces or eliminates the possibility of current leakage between the electrically conductive regions when an electrically conductive material is used to form the capping layer. Removal of the capping layer includes removing 1905 just the capping layer material from the masking layer, or removing 1904 a portion (e.g., a top part on which the capping layer material is formed) or all of the masking layer together with the capping layer material formed thereon.

Figure 21A:
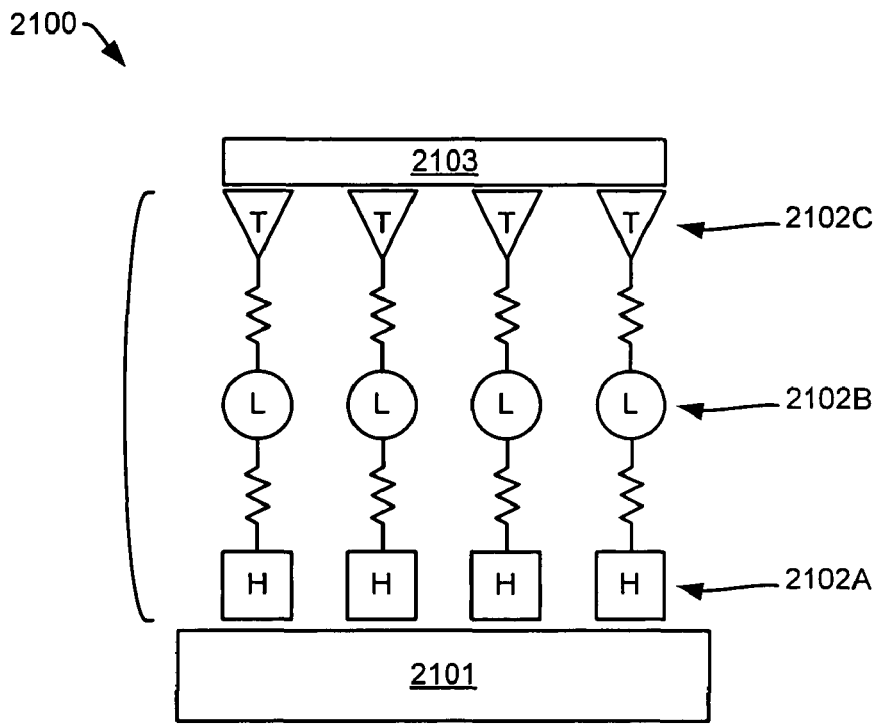
FIG. 21A shows a cross-section of a structure including a dielectric region on which a masking layer and a capping layer are formed, using the molecular self-assembly of an embodiment.

FIG. 21A shows a cross-section of a structure 2100 including a dielectric region 2101 on which a masking layer 2102 and a capping layer 2103 are formed, using the molecular self-assembly of an embodiment. The masking layer 2102 is a self-assembled monolayer (SAM) but is not so limited. The SAM includes one or more of the following, but is not so limited: a head group 2102*a* formed on the dielectric region 2101; a linking group 2102*b* connected to the head group 2102*a*; a terminal group 2102*c* connected to the linking group 2102*b*, on which one or more other materials can be formed.

Figure 21B:
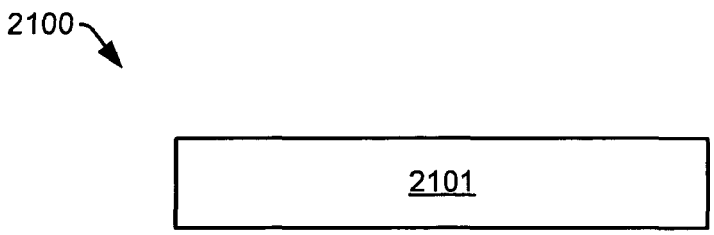
FIGS. 21B through 21E show additional cross-sections of the structure during further processing to remove the capping layer, under an embodiment.

FIGS. 21B through 21E show additional cross-sections of the structure 2100 during further processing to remove the capping layer 2103, under an embodiment. Each of FIGS. 21B through 21E illustrates a different approach to effect removal of a capping layer from a dielectric region. In FIG. 21B, the entire masking layer 2102 is removed from the dielectric region 2101; as a consequence of removing the masking layer 2102, the capping layer 2103 is also removed from over the dielectric region 2101.

Figure 21C:
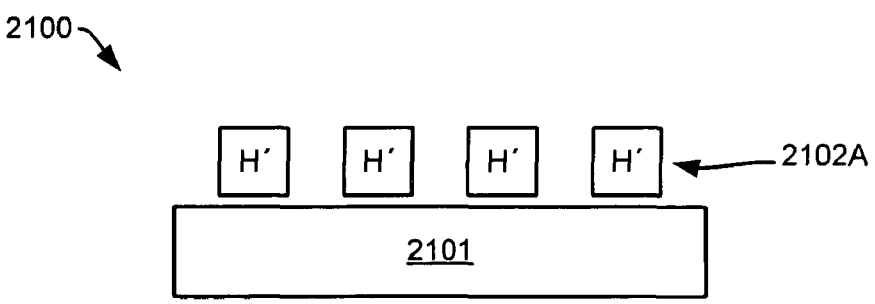

In FIG. 21C, the head group 2102*a* of the masking layer 2102 is cleaved, removing part of the head group 2102*a*, all of the linking group 2102*b* and all of the terminal group 2102*c* of the masking layer 2102, together with the capping layer 2103 formed on the masking layer 2102. The part of the head group 2102a remaining on the dielectric region 2101 is designated as "H'" (H prime) to indicate difference from the unmodified head group 2102a of FIG. 21A.

Figure 21D:
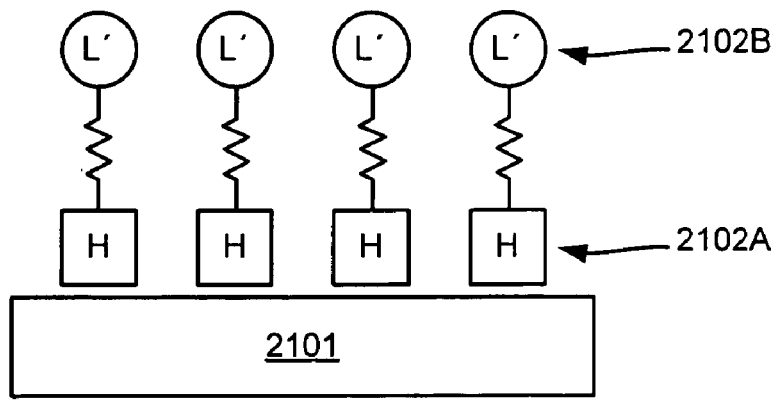

In FIG. 21D the linking group 2102b of the masking layer 2102 is cleaved, removing part of the linking group 2102b and all of the terminal group 2102c of the masking layer 2102, together with the capping layer 2103 formed on the masking layer 2102. The part of the linking group 2102b remaining on the dielectric region 2101 is designated as "L'" (L prime) to indicate difference from the unmodified linking group 2102b of FIG. 21A.

Figure 21E:
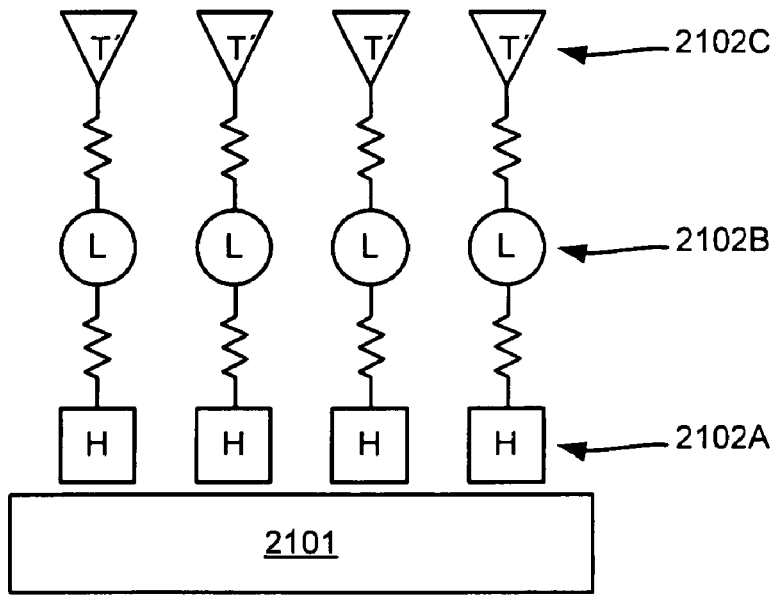

In FIG. 21E, the terminal group 2102c of the masking layer 2102 is cleaved, removing part of the terminal group 2102c of the masking layer 2102, together with the capping layer 2103 formed on the masking layer 2102. The part of the terminal group 2102c remaining on the dielectric region 2101 is designated as "T'" (T prime) to indicate difference from the unmodified terminal group 2102c of FIG. 21A.

Other processes (not shown) can be used to effect removal of a capping layer from over a dielectric region, and the molecular self-assembly of alternative embodiments include these alternative processes. For example, in the structure 2100, the bond between the head group 2102a and the linking group 2102b can be broken, resulting in the removal of the linking group 2102b and the terminal group 2102c of the masking layer 2102, together with the capping layer 2103 formed on the masking layer 2102. Alternatively, the bond between the linking group 2102b and the terminal group 2102c can be broken, resulting in the removal of the terminal group 2102c of the masking layer 2102, together with the capping layer 2103 formed on the masking layer 2102.

In yet another alternative process, the capping layer 2103 may be removed from the masking layer 2102 without affecting the structure of the masking layer 2102, i.e., so that the terminal group 2102c, the linking group 2102b and the head group 2102a are not cleaved and the bonds there between are not broken. Additionally, two or more of the above-described processes can be combined; this may for example increase the likelihood that the capping layer 2102 is adequately removed from over the dielectric region 2101. Furthermore, in any of the processes described above in which at least part of the masking layer 2102 remains on the dielectric region 2101 after removal of the capping layer 2103, the exposed part of the masking layer 2102 can be functionalized to produce desired characteristic(s) (this is true for any type of masking layer in accordance with the molecular self-assembly, not only the masking layer 2102).

Referring again to FIG. 19, when capping layer material is removed 1904 and 1905 from the masking layer, the removal 1904 and 1905 under the molecular self-assembly of an embodiment includes subsequent removal 1906 of all of the masking layer or modification of the masking layer (i.e., removing some and/or functionalizing). Removing 1906 all of, or modifying, the masking layer may be used to produce a surface (i.e., an exposed surface of the masking layer or the dielectric region) having particular characteristics (e.g., good propensity for adhesion to a dielectric barrier layer subsequently to be formed on the masking layer). When first removing the capping layer, then removing or modifying the masking layer, the process of an embodiment removes some or all of the masking layer (and/or to functionalize the masking layer) after removing the capping layer (rather than together with removal of the capping layer) for one or more of a variety of reasons. Any of a variety of processes can be used to remove masking layer material from the dielectric region. Similarly, any of a variety of processes can be used to functionalize a masking layer. The particular process or processes used in an embodiment to remove masking layer material from the dielectric region and/or to functionalize the masking layer can depend, in particular, on the characteristics of the masking layer material, and may also depend on the material used to form the dielectric region.

Figure 20A:
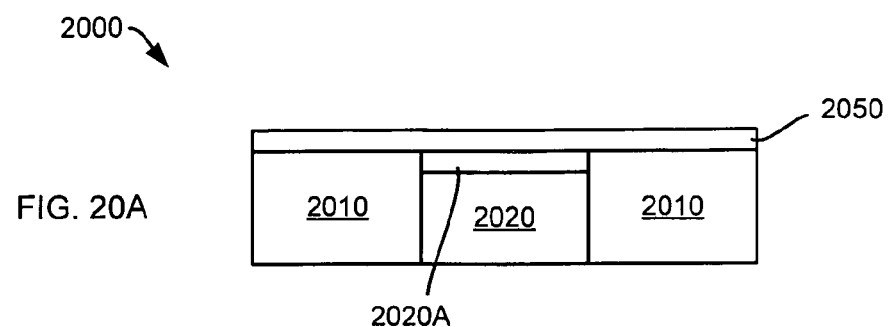
FIGS. 20A through 20E show cross-sectional views of an electronic device undergoing formation of a capping layer on electrically conductive regions separated by a dielectric region, under the molecular self-assembly of an embodiment.
Figure 20B:
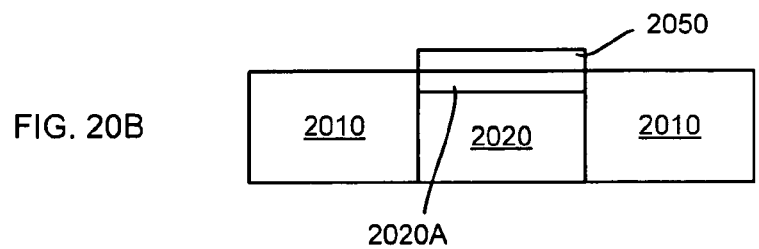
Figure 20C:
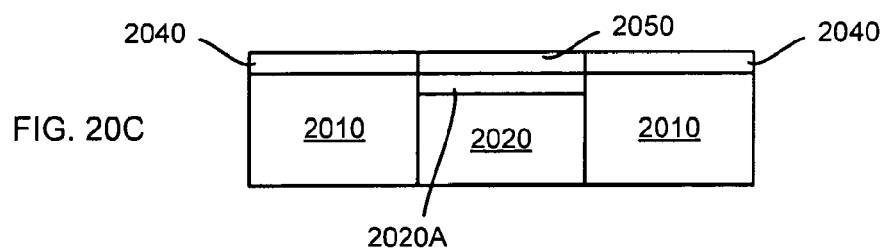
Figure 20D:
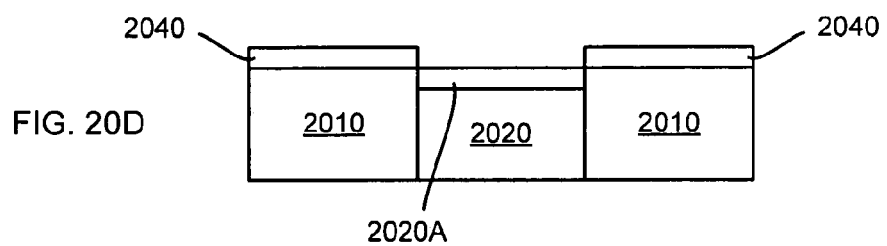
Figure 20E:
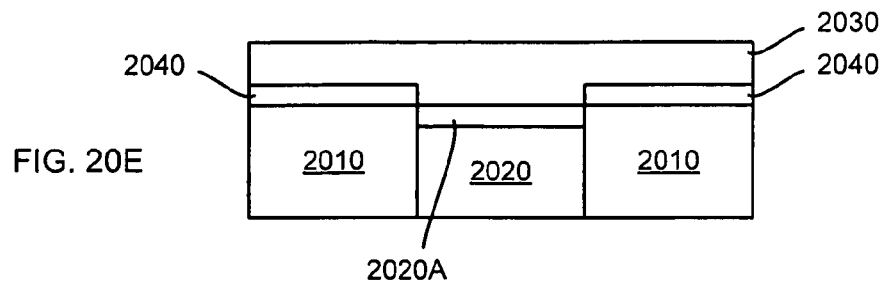

A dielectric barrier layer can also be formed 1907 on the electronic device or not, depending on the properties of the capping layer. FIG. 20E shows formation of a dielectric barrier layer 2030 on the electronic device 2000. If a dielectric barrier layer is formed on the electronic device, such formation can be accomplished using any type, number, and/or combination of materials and/or processes.

When the capping layer is formed of a material that provides good inhibition of diffusion of the electrically conductive material into adjacent material of the electronic device while still providing other required properties of the capping layer, it is possible to eliminate the dielectric barrier layer from the electronic device or, at least, reduce the thickness of the dielectric barrier layer. The molecular self-assembly of an embodiment forms a capping layer so that diffusion of material from the electrically conductive regions into adjacent regions is inhibited with sufficient effectiveness that the dielectric barrier layer can be formed with a smaller thickness than would be the case if the capping layer was not present.

The molecular self-assembly of other embodiments forms a capping layer so that diffusion of material from the electrically conductive regions into adjacent regions is inhibited with sufficient effectiveness that a dielectric barrier layer need not be formed. Eliminating the dielectric barrier layer or reducing the thickness of the dielectric barrier layer reduces capacitance, which can decrease the power consumption and/or increase speed of operation of the electronic device. By using a masking layer on the dielectric region to minimize or eliminate selectivity as an important consideration in choosing materials and/or processes for forming the capping layer, the molecular self-assembly enables formation of a capping layer that provides adequate inhibition of electromigration and a good barrier to diffusion of electrically conductive material. This enables elimination or reduction in thickness of a conventional dielectric barrier layer. The capping layer can also be optimized to resist against any deleterious effects associated with subsequent exposure to moisture containing environments, oxygen containing environments, oxidizing environments, and the like.

The molecular self-assembly described above can be used in the processing of a substrate comprising any type of material. For example, the molecularly self-assembled material can be formed on material previously formed on a substrate and can be formed on material (substrate or other material) that has been functionalized to have desired properties, such as desired adhesion characteristics. In particular, the molecular self-assembly can be used in processing semiconductor substrates as in the manufacture of components for use in the electronics industry. The molecular self-assembly can also be used in processing substrates like glass, silicon, and/or plastic for use in the production of flat panel displays, for example. The molecular self-assembly can be used in the processing of any type of semiconductor substrate, including but not limited to silicon substrates, silicon-on-insulator substrates, silicon carbide substrates, strained silicon substrates, silicon germanium substrates, and gallium arsenide substrates.

The molecular self-assembly can include a substrate of any size. For example, the molecular self-assembly can be used in the processing of small semiconductor substrates having areas of less than one square inch up to twelve (12) inch (300 millimeter (mm)) or larger semiconductor substrates used in the production of many electronic components. In general, there is no limit to the size of substrates that can be processed. For example, the molecular self-assembly can be used to process each succeeding larger generation of semiconductor substrates used to produce electronic components. The molecular self-assembly can also be used to process the relatively large substrates that are used in the production of flat panel displays. Such substrates include rectangular substrates on the order of approximately one square meter, but larger substrates can be used. The molecular self-assembly can also be scaled for use in roll-to-roll processing applications for flexible substrates having a fixed width, but (theoretically) unlimited length (a manner of substrate processing that can be particularly useful in the production of flat panel displays); for example, such substrate rolls can be hundreds of feet long.

The molecular self-assembly can be used in processing substrates of any shape, e.g., circular, rectangular (including square), etc. For example, and as described above, the molecular self-assembly can be used in the processing of semiconductor substrates used in the production of electronic components (e.g., circular substrates), as well as in the processing of substrates used in the production of flat panel displays (e.g., rectangular substrates).

The molecular self-assembly can be used in the processing of a single substrate or multiple substrates (e.g., batch processing). For example, in wet semiconductor processing, a single substrate can be processed or a batch of, for example, 13, 25 or 50 substrates can be processed at a single time. In dry semiconductor processing and flat panel display production, typically, a single substrate is processed at one time.

The molecular self-assembly described herein can include wet processing and/or dry processing. In wet processing, a substrate is processed using a fluid. For example, the substrate can be immersed, in whole or in part, in a fluid having specified characteristics (e.g., a specified chemical composition). Also, for example, a fluid can be sprayed on to the substrate in a specified manner Wet processing for use with the molecular self-assembly of an embodiment can make use of any of a variety of chemical constituents, as appropriate for the desired processing.

In dry processing (e.g., physical vapor deposition, chemical vapor deposition, plasma-enhanced chemical vapor deposition, and atomic layer deposition), a plasma or gas is used to produce a desired interaction with a substrate that processes a substrate surface in a specified way. Dry processing for use with the molecular self-assembly can make use of inert or reactive gases, as appropriate for the desired processing.

Any of a variety of chemical constituents or other reactants (collectively referred to herein as constituents or chemical constituents) can be used by a molecular self-assembly system of an embodiment to effect molecular self-assembly and related processes. The constituents can be in the liquid phase, gaseous phase, and/or some combination of the liquid and gaseous phases (including, for example, the super-critical fluid phase). The constituents used and their concentrations, as well as the mixture of constituents, will depend on the particular process step(s) to be performed. The chemical delivery system can enable precise control of the molar concentrations, temperature, flow rate and pressure of chemical constituents as appropriate to the process. The chemical delivery system can also provide appropriate filtration and control of contamination.

The molecular self assembly of an embodiment includes a method comprising receiving a substrate. The substrate includes at least one dielectric material. A molecularly self-assembled layer is formed on an exposed surface of the dielectric material, the molecularly self-assembled layer comprising at least one material having at least one of a molecular characteristic and a molecular type that includes one or more of a molecular type of a head group of molecules of the material, a molecular characteristic of a head group of molecules of the material, a molecular type of a terminal group of molecules of the material, a molecular characteristic of a terminal group of molecules of the material, a molecular type of a linking group of molecules of the material, and a molecular characteristic of a linking group of molecules of the material, wherein the at least one of the molecular characteristic and molecular type are selected according to at least one pre-specified property of the molecularly self-assembled layer.

The method of an embodiment comprises preparing the exposed surface of the dielectric material, wherein preparing includes one or more of functionalization, cleaning, etching, rinsing, drying, vaporization, annealing, curing, thermal treatment, UV treatment, IR treatment, electron treatment, ion treatment, and x-ray treatment.

The method of an embodiment comprises post-processing the molecularly self-assembled layer, wherein the post-processing includes one or more of functionalization, cleaning, etching, rinsing, drying, vaporization, annealing, curing, thermal treatment, UV treatment, IR treatment, electron treatment, ion treatment, and x-ray treatment.

The at least one pre-specified property of the molecularly self-assembled layer of an embodiment includes one or more of pore sealing properties, adhesion properties, diffusion barrier properties, passivation properties, and selectivity.

The at least one pre-specified property of an embodiment is specified according to at least one of an application of the molecularly self-assembled layer, a type of the dielectric material, and a type of the material to be subsequently formed on the molecularly self-assembled layer.

The at least one pre-specified property of an embodiment includes a plurality of properties, further comprising assigning degrees of importance to each of the plurality of properties.

The method of an embodiment comprises one or more of cross-linking, polymerizing, and oligomerizing molecules of the molecularly self-assembled layer.

Forming the molecularly self-assembled layer of an embodiment comprises joining complementary materials in nano-molecular action using coordinated action of independent molecules under distributed control.

The dielectric material of an embodiment is a porous dielectric material, wherein the at least one of a molecular characteristic and a molecular type causes the molecularly self-assembled layer to seal a majority of pores of the exposed surface of the dielectric material The molecular type of an embodiment is an organic molecule and the molecular characteristic includes at least one of a size and a length of one or more of a terminal group and a linking group.

The at least one of the molecular characteristic and the molecular type of an embodiment comprise a carbon chain including at least one of a linking group and a terminal group, wherein a length of at least one of the linking group and the terminal group is long enough relative to a size of the pores of the exposed surface so as to seal the pores.

Sealing of the majority of pores of an embodiment prevents diffusion of at least one of reactants, reagents, precursors, and carrier gases from subsequent depositions into the porous dielectric material.

The method of an embodiment comprises etching at least one structure in the dielectric material.

The at least one structure of an embodiment includes one or more of at least one via and at least one trench.

The method of an embodiment comprises forming at least one deposited barrier layer on the molecularly self-assembled layer, wherein the deposited barrier layer prevents diffusion of other materials into the dielectric material.

The method of an embodiment comprises forming at least one conductive layer on the at least one deposited barrier layer, wherein the at least one conductive layer comprises at least one electrically conductive material.

The at least one conductive layer of an embodiment includes a seed layer.

The method of an embodiment comprises filling the at least one structure with the at least one electrically conductive material.

The at least one electrically conductive material of an embodiment includes one or more of copper, ruthenium, tungsten, and aluminum.

The molecularly self-assembled layer of an embodiment forms a masking layer on the dielectric material.

The method of an embodiment comprises cleaning the substrate, wherein the cleaning includes removing contamination from an electrically conductive material at a bottom portion of the at least one structure, wherein a portion of the contamination is captured in the masking layer.

The masking layer of an embodiment protects the dielectric material during the cleaning.

The cleaning of an embodiment generates an anchor area at the bottom portion of the at least one structure by removing a portion of the electrically conductive material at the bottom portion of the at least one structure.

The method of an embodiment comprises forming a structural anchor in the anchor area by filling the anchor area with material of at least one of barrier layer deposition, seed layer deposition, and bulk copper fill during at least one of the barrier layer deposition, the seed layer deposition, and the bulk copper fill.

The electrically conductive material of an embodiment is a metal, wherein the contamination includes at least one of organic contamination, metallic contamination, and metal oxide contamination.

The method of an embodiment comprises removing the masking layer from at least a portion of the dielectric material, wherein removing the masking layer includes removing the contamination.

The method of an embodiment comprises forming a capping layer over an exposed surface of the electrically conductive material at the bottom portion of the at least one structure.

Forming of the metal alloy capping layer of an embodiment includes delivering and effecting a plating chemistry for electroless plating of the capping layer, wherein the capping layer is a metal alloy capping layer.

The method of an embodiment comprises removing excess material of the capping layer.

The method of an embodiment comprises removing the masking layer from at least a portion of the dielectric material, wherein removing the masking layer includes removing at least one of the contamination, material of the capping layer, and the excess material of the capping layer.

The method of an embodiment comprises preparing the exposed surface, wherein the preparing further includes preparing an exposed surface of an electrically conductive material at a bottom portion of at least one structure of the dielectric material.

The method of an embodiment comprises functionalizing at least one terminal group of the molecularly self-assembled layer by modifying at least one characteristic of the terminal group so as to generate a pre-specified interaction with at least one other material formed on the molecularly self-assembled layer.

The method of an embodiment comprises selecting the at least one of the molecular characteristic and the molecular type to provide a pre-specified force of adhesion between the molecularly self-assembled layer and the dielectric material.

The adhesion of an embodiment is produced by covalent bonding between molecules of at least one material, wherein the at least one material includes material of the molecularly self-assembled layer and the dielectric material.

The adhesion of an embodiment includes covalent bonding between silicon and one or more of oxygen, carbon, and nitrogen.

The at least one of the molecular characteristic and the molecular type of an embodiment includes a pre-specified head group for molecules of the material.

The method of an embodiment comprises selecting the at least one of the molecular characteristic and the molecular type to provide a pre-specified force of adhesion between the molecularly self-assembled layer and at least one material formed on the molecularly self-assembled layer.

The at least one of the molecular characteristic and the molecular type of an embodiment includes a pre-specified terminal group for molecules of the material.

The dielectric material of an embodiment comprises a semiconductor substrate.

The molecularly self-assembled layer of an embodiment is a monolayer.

The molecularly self-assembled layer of an embodiment is a multilayer.

The molecularly self-assembled layer of an embodiment comprises an organic material.

The molecularly self-assembled layer of an embodiment comprises an inorganic material.

The molecularly self-assembled layer of an embodiment comprises thiol molecules.

The molecularly self-assembled layer of an embodiment comprises silicon-based molecules.

The molecularly self assembled layer of an embodiment comprises at least one of a cluster of atoms, a cluster of functionalized atoms, nanoparticles, and functionalized nanoparticles.

The molecularly self-assembled layer of an embodiment comprises molecules including organosilanes.

The molecularly self-assembled layer of an embodiment comprises one or more of dendrimers, hyper-branched polymers, polymer brushes, and block co-polymers.

The dielectric constant of the dielectric material of an embodiment is less than or equal to approximately 2.5.

The size of the pores of the dielectric material of an embodiment is approximately in a range of ten (10) angstroms to fifty (50) angstroms.

The porosity of the dielectric material of an embodiment is equal to or less than approximately fifty percent (50%).

The methods, processes, and systems described above for molecular self-assembly can be used to produce or manufacture semiconductor devices.

Aspects of the molecular self-assembly systems and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the molecular self-assembly systems and methods include: microcontrollers with memory (such as electronically erasable programmable read only memory (EEPROM)), embedded microprocessors, firmware, software, etc. Furthermore, aspects of the molecular self-assembly systems and methods may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that the various components disclosed herein may be described and expressed (or represented) as data and/or instructions embodied in various computer-readable media. Computer-readable media in which such data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above-described components may be processed by a processing entity (e.g., one or more processors) within the computer system in conjunction with execution of one or more other computer programs.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the molecular self-assembly systems and methods is not intended to be exhaustive or to limit the molecular self-assembly systems and methods to the precise form disclosed. While specific embodiments of, and examples for, the molecular self-assembly systems and methods are described herein for illustrative purposes, various equivalent modifications are possible within the scope of the molecular self-assembly systems and methods, as those skilled in the relevant art will recognize. The teachings of the molecular self-assembly systems and methods provided herein can be applied to other processing systems and methods, not only for the systems and methods described above.

The elements and acts of the various embodiments described above can be combined to provide further embodiments. These and other changes can be made to the molecular self-assembly systems and methods in light of the above detailed description.

In general, in the following claims, the terms used should not be construed to limit the molecular self-assembly systems and methods to the specific embodiments disclosed in the specification and the claims, but should be construed to include all processing systems that operate under the claims. Accordingly, the molecular self-assembly systems and methods are not limited by the disclosure, but instead the scope of the molecular self-assembly systems and methods is to be determined entirely by the claims.

While certain aspects of the molecular self-assembly systems and methods are presented below in certain claim forms, the inventors contemplate the various aspects of the molecular self-assembly systems and methods in any number of claim forms. Accordingly, the inventors reserve the right to add additional claims after filing the application to pursue such additional claim forms for other aspects of the molecular self-assembly systems and methods.

What is claimed is:

1. A method for sealing a porous dielectric comprising: receiving a substrate including the porous dielectric; exposing the substrate to a C13H25SiCl3 compound comprising a polymerizable organosilane and a functional group for facilitating attachment with the porous dielectric; and
forming a layer as a result of the exposing.

2. The method of claim 1, wherein the functional group comprises a halide.

3. The method of claim 1, wherein the functional group comprises an amine to hydrolyze and to attach to the porous dielectric.

4. The method of claim 3, wherein the C13H25SiCl3 compound comprising the polymerizable organosilane and the amine comprises (dimethylamino)silane.

5. The method of claim 3, wherein the C13H25SiCl3 compound comprising the polymerizable organosilane and the amine comprises octadecyldimethyl(dimethylamino)silane.

6. The method of claim 1 wherein the C13H25SiCl3 compound further includes at least one linking group having the formula (CH2)n, where n is equal or greater than 0, and wherein n is selected to match a pore size of the porous dielectric.

7. The method of claim the method of claim 6, wherein the pore size is between 11 and 50 Angstroms.

8. The method of claim 1, further comprising post-processing the substrate to polymerize the C13H25SiCl3 compound.

9. The method of claim 8, wherein the post-processing is chosen from the group consisting of: physical modifications, chemical modifications, electrical modifications, thermal modifications, magnetic modifications, photolytic modifications, cleaning, surface modification, surface preparation, deposition, dispensing, reaction, functionalization, etching, planarization, chemical mechanical planarization, electrochemical mechanical planarization, lithography, patterning, implantation, thermal treatment, infrared (IR) treatment, ultraviolet (UV) treatment, electron beam curing, x-ray treatment, vaporization, annealing, cross-linking, polymerizing, and oligomerizing.

10. The method of claim 1, further comprising:
removing contamination from the porous dielectric and a conductive region of the substrate prior to the exposing; and
removing contamination from the conductive region after the forming.

11. The method of claim 1, wherein the layer formed as the result of the exposing is a conformal thin film.

* * * * *